(12) United States Patent
Ju et al.

(10) Patent No.: US 11,616,062 B2
(45) Date of Patent: Mar. 28, 2023

(54) GATE ISOLATION FOR MULTIGATE DEVICE

(71) Applicant: Taiwan Semiconductor Manufacturing Co., Ltd., Hsin-Chu (TW)

(72) Inventors: Shi Ning Ju, Hsinchu (TW); Kuo-Cheng Chiang, Hsinchu County (TW); Kuan-Ting Pan, Hsinchu (TW); Zhi-Chang Lin, Hsinchu County (TW); Chih-Hao Wang, Hsinchu County (TW); Shih-Cheng Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/170,740

(22) Filed: Feb. 8, 2021

(65) Prior Publication Data

US 2021/0343713 A1    Nov. 4, 2021

Related U.S. Application Data

(60) Provisional application No. 63/018,188, filed on Apr. 30, 2020.

(51) Int. Cl.
*H01L 29/423* (2006.01)
*H01L 21/763* (2006.01)
(Continued)

(52) U.S. Cl.
CPC ...... *H01L 27/092* (2013.01); *H01L 21/02603* (2013.01); *H01L 21/28123* (2013.01);
(Continued)

(58) Field of Classification Search
CPC ....... H01L 21/76224; H01L 21/823481; H01L 21/823431; H01L 29/66545
See application file for complete search history.

(56) References Cited

U.S. PATENT DOCUMENTS 6,287,904 B1    9/2001 Lee et al.
10,840,146 B1 *  11/2020 Paul ................... H01L 29/0673
(Continued)

FOREIGN PATENT DOCUMENTS

KR    20190140647 A    12/2019
TW      201933608 A     8/2019
(Continued)

OTHER PUBLICATIONS

Pan, Kuan-Ting et al. "Gate Isolation for Multigate Device", U.S. Appl. No. 17/466,569; Assignee: Taiwan Semiconductor Manufacturing Company, Ltd. 65 pages of specification, 33 pages of drawings.
(Continued)

*Primary Examiner* — Brian Turner
(74) *Attorney, Agent, or Firm* — Haynes and Boone, LLP

(57) ABSTRACT

Self-aligned gate cutting techniques are disclosed herein that provide dielectric gate isolation fins for isolating gates of multigate devices from one another. An exemplary device includes a first multigate device having first source/drain features and a first metal gate that surrounds a first channel layer and a second multigate device having second source/drain features and a second metal gate that surrounds a second channel layer. A dielectric gate isolation fin separates the first metal gate from the second metal gate. The dielectric gate isolation fin includes a first dielectric layer having a first dielectric constant and a second dielectric layer having a second dielectric constant disposed over the first dielectric layer. The second dielectric constant is greater than the first dielectric constant. The first metal gate and the second metal
(Continued)

gate physically contact the first channel layer and the second channel layer, respectively, and the dielectric gate isolation fin.

20 Claims, 29 Drawing Sheets

(51) Int. Cl.
    *H01L 21/8234*    (2006.01)
    *H01L 27/088*     (2006.01)
    *H01L 21/764*     (2006.01)
    *H01L 27/092*     (2006.01)
    *H01L 29/06*      (2006.01)
    *H01L 29/786*     (2006.01)
    *H01L 29/66*      (2006.01)
    *H01L 21/28*      (2006.01)
    *H01L 21/8238*    (2006.01)
    *H01L 21/02*      (2006.01)

(52) U.S. Cl.
    CPC ........... *H01L 21/823807* (2013.01); *H01L 21/823814* (2013.01); *H01L 21/823828* (2013.01); *H01L 21/823878* (2013.01); *H01L 29/0673* (2013.01); *H01L 29/42392* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 2019/0378903 A1* | 12/2019 | Jeon | H01L 21/823431 |
| 2020/0227323 A1* | 7/2020 | Zang | H01L 21/76224 |
| 2020/0286900 A1* | 9/2020 | Mann | H01L 21/823821 |
| 2020/0287015 A1* | 9/2020 | Subramanian | H01L 21/823481 |

FOREIGN PATENT DOCUMENTS

| | | |
|---|---|---|
| TW | 201939666 A | 10/2019 |
| WO | WO2000060659 A | 10/2000 |
| WO | WO2016099570 A1 | 12/2014 |
| WO | WO2015094305 A | 6/2015 |

OTHER PUBLICATIONS

Chen, Guan-Lin et al., "Self-Aligned Metal Gate for Multigate Device", U.S. Appl. No. 17/174,109, Assignee: Taiwan Semiconductor Manufacturing Co., Ltd. 66 Pages of specification, 30 pages of drawings.

Chiang, Kuo-Cheng et al."Gate Isolation for Multigate Device" U.S. Appl. No. 17/199,777, Assignee: Taiwan Semiconductor Manufacturing Co., Ltd., 61 Pages of Specification, 47 Pages of Drawings.

* cited by examiner

GATE ISOLATION FOR MULTIGATE DEVICE

This application is a non-provisional application of and claims benefit of U.S. Provisional Patent Application Ser. No. 63/018,188, filed Apr. 30, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, non-self-aligned gate cutting techniques typically implemented to isolate gates of different GAA devices from one another, such as a first gate of a first GAA transistor from a second gate of a second GAA transistor, are hindering the dense packing of IC features needed for advanced IC technology nodes. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
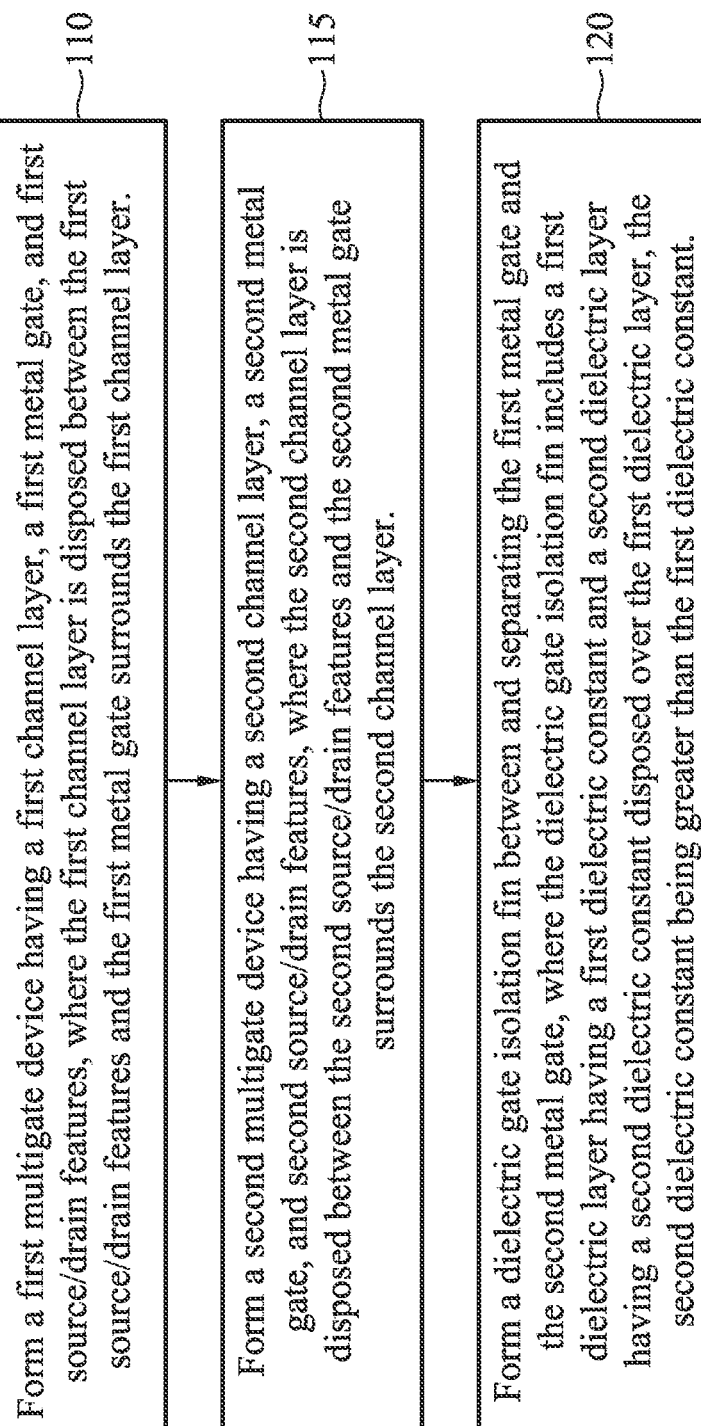
FIG. 1 is a flow chart of a method for fabricating a multigate device according to various aspects of the present disclosure.

The present disclosure relates generally to integrated circuit devices, and more particularly, to gate isolation techniques for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An exemplary non-self-aligned gate cutting technique can involve forming a mask layer over a gate stack, where the mask layer covers a first portion of the gate stack and a second portion of the gate stack and exposes a third portion of the gate stack via an opening formed in the mask layer. The third portion of the gate stack is disposed between the first portion of the gate stack and the second portion of the gate stack. An etching process is then performed that removes the exposed third portion of the gate stack (including, for example, at least one gate electrode layer and at least one gate dielectric layer), thereby forming a gate opening between and separating the first portion of the gate stack from the second portion of the gate stack. A gate isolation feature, such as a dielectric layer (for example, a silicon nitride layer), is then formed in the gate opening to provide electrical isolation between the first portion of the gate stack, which may be disposed over a first channel layer of a first GAA device (i.e., first active device area), and the second portion of the gate stack, which may be disposed over a second channel layer of a second GAA device (i.e., second active device area).

A spacing between active device areas, such as the first channel layer and the second channel layer, is intentionally designed larger than necessary to compensate for process variations that arise during the non-self-aligned gate cutting technique. For example, etch loading effects and/or other loading effects may reduce critical dimension uniformity (CDU) across a wafer, such that in some locations, a width of the opening in the mask layer and/or a width of the gate opening may be larger than a target width, which can lead to unintentional exposure and/or damage of the first channel layer, the second channel layer, the first portion of the gate stack, and/or the second portion of the gate stack. In another example, overlay shift arising from lithography processes may result in the opening in the mask layer shifted left or right of its intended position, which can also lead to unintentional exposure and/or damage of the first channel layer, the second channel layer, the first portion of the gate stack, and/or the second portion of the gate stack. The increased spacing required between the active device areas to adequately compensate for such process variations prevents compact packing of active device areas, thereby reducing pattern density and preventing compact cell heights desired for scaled memory devices in advanced IC technology nodes.

The present disclosure thus proposes a self-aligned gate cutting (isolation) technique for GAA devices that allows for smaller spacing between active device areas (and thus smaller cell heights) compared to spacing required between active device areas when implementing non-self-aligned gate cutting techniques. The proposed self-aligned gate cutting technique utilizes an oxide liner during processing that improves inner spacer formation and/or suspended channel layer formation. In some embodiments, utilizing the oxide liner leads to better control over profiles of inner spacers during GAA fabrication. In some embodiments, utilizing the oxide liner leads to a two-step process for forming a suspended channel layer during GAA fabrication, which has been observed to improve suspended channel layer uniformity and/or enlarge a gate opening in which a metal gate is formed surrounding the suspended channel layer. In some embodiments, the proposed self-aligned gate cutting technique provides a dielectric gate isolation fin that separates a first GAA device (in particular, a first metal gate of the first GAA device) from a second GAA device (in particular, a second metal gate of the second GAA device). In some embodiments, the dielectric gate isolation fin includes a high-k dielectric layer disposed over an oxide layer and a low-k dielectric layer. The high-k dielectric layer is disposed along an upper portion of sidewalls of the first metal gate and an upper portion of sidewalls of the second metal gate. The low-k dielectric layer is disposed along a lower portion of the sidewalls of the first metal gate and a lower portion of the sidewalls of the second metal gate. In some embodiments, the dielectric gate isolation fin is disposed on an isolation feature, such as a shallow trench isolation (STI) feature. In some embodiments, a width of the dielectric gate isolation fin is less than a width of the isolation feature. The proposed self-aligned gate cutting technique further provides, under gate spacers of the first GAA device and under gate spacers of the second GAA device, a first oxide liner along sidewalls of a portion of a first channel layer of the first GAA device and sidewalls of first inner spacers of the first GAA device and a second oxide liner along sidewalls of a portion of a second channel layer of the second GAA device and second inner spacers of the second GAA device. Third inner spacers are disposed between the first oxide liner and the low-k dielectric layer of the dielectric gate isolation fin, and fourth inner spacers are disposed between the second oxide liner and the low-k dielectric layer of the dielectric gate isolation fin. In some embodiments, the gate spacers of the first GAA device and the gate spacers of the second GAA device wrap a portion of the high-k dielectric layer of the dielectric gate isolation fin. In some embodiments, a gate contact to the first metal gate and the second metal gate wraps a portion of the high-k dielectric layer of the dielectric gate isolation fin. Details of the proposed self-aligned gate cutting techniques for GAA devices and resulting GAA devices are described herein in the following pages and/or drawings.

FIG. 1 is a flow chart of a method 100 for fabricating a multigate device according to various aspects of the present disclosure. In some embodiments, method 100 fabricates a p-type multigate transistor and/or an n-type multigate transistor. At block 110, method 100 includes forming a first multigate device having a first channel layer, a first metal gate, and first source/drain features, wherein the first channel layer is disposed between the first source/drain features and the first metal gate surrounds the first channel layer. At block 115, method 100 includes forming a second multigate device having a second channel layer, a second metal gate, and second source/drain features, wherein the second channel layer is disposed between the second source/drain features and the second metal gate surrounds the second channel layer. At block 120, method 100 includes forming a dielectric gate isolation fin between and separating the first metal gate and the second metal gate. The dielectric gate isolation fin includes a first dielectric layer having a first dielectric constant and a second dielectric layer having a second dielectric constant disposed over the first dielectric layer. The second dielectric constant is greater than the first dielectric constant. In some embodiments, the first metal gate is disposed between and physically contacts the first channel layer and the dielectric gate isolation fin, and the second metal gate is disposed between and physically contacts the second channel layer and the dielectric gate isolation fin. In some embodiments, the first dielectric layer includes a silicon-comprising dielectric material and the second dielectric layer includes a metal-and-oxygen comprising material. In some embodiments, the first dielectric constant is less than about seven and the second dielectric constant is greater than about seven. In some embodiments, method 100 includes forming various inner spacers of the first multigate device and the second multigate device, such as first inner spacers that separate the first channel layer and the second channel layer from the dielectric gate isolation fin and second inner spacers that separate the first channel layer and the second channel layer from a substrate and/or other channel layer of the first multigate device and/or the second multigate device, respectively. In some embodiments, method 100 includes forming dielectric liners that separate the first inner spacers from the first channel layer and the second channel layer. In some embodiments, the dielectric liners may further separate the second inner spacers from the first inner spacers. Additional processing is contemplated by the present disclosure. Additional steps can be provided before, during, and after method 100, and some of the steps described can be moved, replaced, or eliminated for additional embodiments of method 100. The discussion that follows illustrates various embodiments of multigate-based integrated circuit devices that can be fabricated according to method 100.

FIGS. 2-26 and FIG. 27A are fragmentary perspective views of a multigate device 200, in portion or entirety, at various fabrication stages (such as those associated with method 100 in FIG. 1) according to various aspects of the present disclosure. FIG. 27B and FIG. 27C are fragmentary cross-sectional views of multigate device 200 in FIG. 27A, in portion or entirety, according to various aspects of the present disclosure. As described herein, multigate device 200 includes a first transistor region 202A processed to form at least one transistor and a second transistor region 202B processed to form at least one transistor. In some embodiments, p-type transistors are formed in both first transistor region 202A and second transistor region 202B, where a p-type transistor in first transistor region 202A is a portion of a first complementary transistor, such as a first complementary metal-oxide semiconductor (CMOS) transistor, and a p-type transistor region in second transistor region 202B is a portion of a second complementary transistor, such as a second CMOS transistor. In some embodiments, n-type transistors are formed in both first transistor region 202A and second transistor region 202B, where an n-type transistor in first transistor region 202A is a portion of a first complementary transistor, such as a first CMOS transistor, and an n-type transistor in second transistor region 202B is a portion of a second complementary transistor, such as a second CMOS transistor. In some embodiments, an n-type transistor is formed in first transistor region 202A (and can thus be referred to as an n-type transistor region) and a p-type transistor is formed in second transistor region 202B (and can thus be referred to as a p-type transistor region). In some embodiments, first transistor region 202A and second transistor region 202B are a portion of a device region, such as a core region (often referred to as a logic region), a memory region (such as a static random access memory (SRAM) region), an analog region, a peripheral region (often referred to as an I/O region), a dummy region, other suitable region, or combinations thereof. The device region can include various passive and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. Multigate device 200 can be included in a microprocessor, a memory, and/or other IC device. In some embodiments, multigate device 200 is a portion of an IC chip, a system on chip (SoC), or portion thereof. FIGS. 2-26 and FIGS. 27A-27C have been simplified for the sake of clarity to better understand the inventive concepts of the present disclosure. Additional features can be added in multigate device 200, and some of the features described below can be replaced, modified, or eliminated in other embodiments of multigate device 200.

Figure 2:
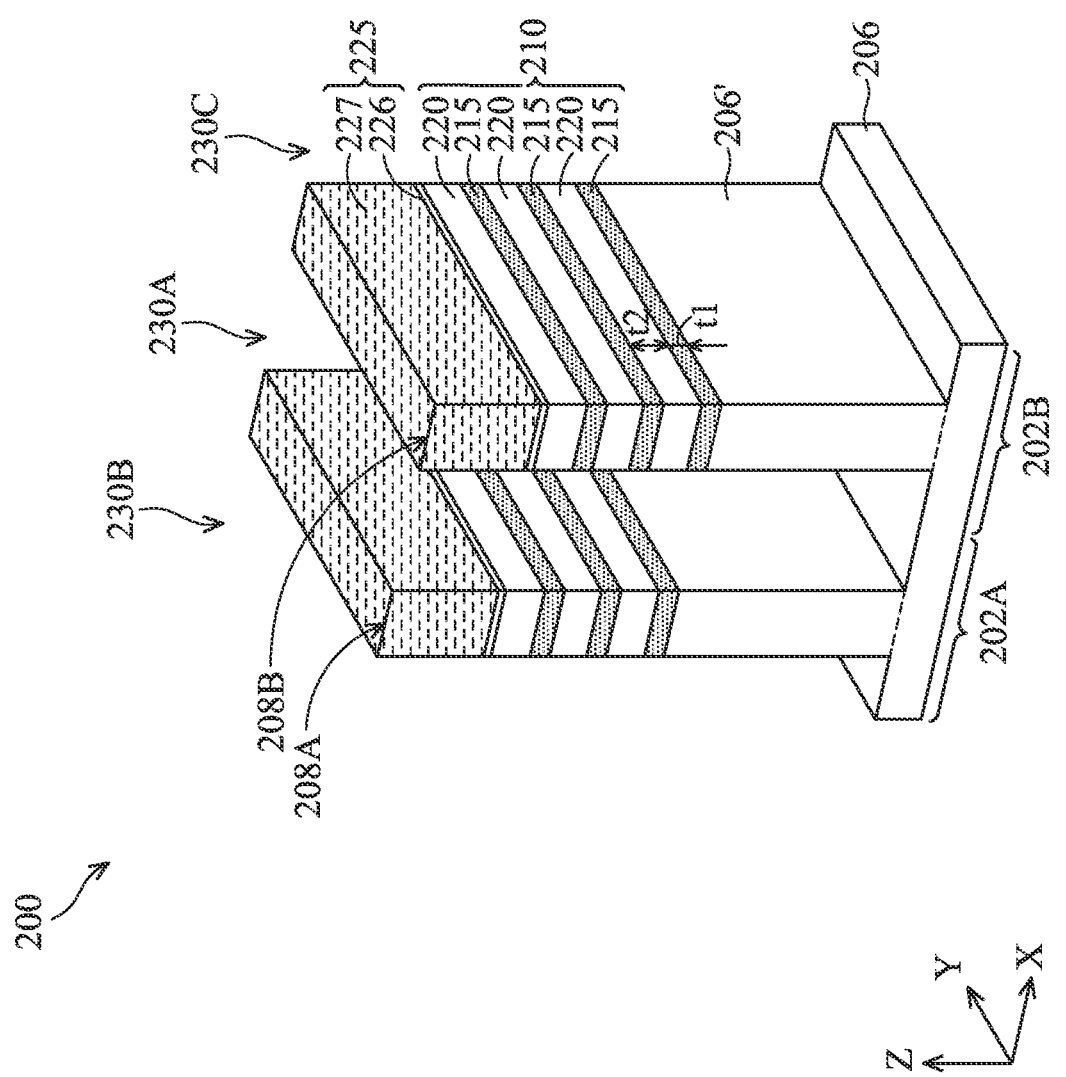
FIGS. 2-26 and FIG. 27A are fragmentary perspective views of a multigate device, in portion or entirety, at various fabrication stages (such as those associated with the method in FIG. 1) according to various aspects of the present disclosure.

Turning to FIG. 2, a fin fabrication process is performed to form fins extending from a substrate (wafer) 206. For example, a fin 208A and a fin 208B (also referred to as fin structures, fin elements, etc.) extend from substrate 206 after the fin fabrication process. Fin 208A and fin 208B each include a substrate portion (i.e., a fin portion 206' of substrate 206 (also referred to as a substrate extension, a substrate fin portion, an etched substrate portion, etc.)), a semiconductor layer stack portion (i.e., a semiconductor layer stack 210 that includes semiconductor layers 215 and semiconductor layers 220) disposed over the substrate portion, and a patterning layer portion (i.e., a patterning layer 225 that includes a pad layer 226 and a mask layer 227) disposed over the semiconductor layer stack portion. Fins 208A and fin 208B each extend substantially parallel to one another along a y-direction, having a length defined in the y-direction, a width defined in an x-direction, and a height defined in a z-direction.

In some embodiments, a lithography and/or etching process is performed to pattern a semiconductor layer stack to form fins 208A, 208B. The lithography process can include forming a resist layer over semiconductor layer stack 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 210 using the patterned resist layer as an etch mask. In some embodiments, the patterned resist layer is formed over a mask layer disposed over semiconductor layer stack 210, a first etching process removes portions of the mask layer to form patterning layer 225 (i.e., a patterned hard mask layer), and a second etching process removes portions of semiconductor layer stack 210 using patterning layer 225 as an etch mask. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. Alternatively, fins 208A, 208B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fins 208A, 208B with patterning layer 225, semiconductor layer stack 210, and fin portion 206', as depicted in FIG. 2. In some embodiments, directed self-assembly (DSA) techniques are implemented while patterning semiconductor layer stack 210. Further, in some embodiments, the exposure process can implement maskless lithography, electron-beam (e-beam) writing, and/or ion-beam writing for patterning the resist layer.

In the depicted embodiment, substrate 206 includes silicon. Alternatively or additionally, substrate 206 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 206 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 206 can include various doped regions. For example, substrate 206 (including fin portions 206') can include p-type doped regions (referred to as p-wells) in first transistor region 202A and second transistor region 202B, for example, where n-type transistors are formed in first transistor region 202A and second transistor region. In another example, substrate 206 (including fin portions 206') can include n-type doped regions (referred to as n-wells) in first transistor region 202A and second transistor region 202B, for example, where p-type transistors are formed in first transistor region 202A and second transistor region. In yet another example, substrate 206 (including fin portions 206') can include p-wells in first transistor region 202A and n-wells in second transistor region 202B, for example, where n-type transistors are formed in first transistor region 202A and p-type transistors are formed in second transistor region 202B. The n-wells are doped with n-type dopants, such as phosphorus, arsenic, other n-type dopant, or combinations thereof. The p-wells are doped with p-type dopants, such as boron, indium, other p-type dopant, or combinations thereof. In some embodiments, substrate 206 includes doped regions formed with a combination of p-type dopants and n-type dopants. The various doped regions can be formed directly on and/or in substrate 206, for example, providing a p-well structure, an n-well structure, a dual-well structure, a raised structure, or combinations thereof. An ion implantation process, a diffusion process, and/or other suitable doping process can be performed to form the various doped regions.

Each semiconductor layer stack 210 is disposed over a respective fin portion 206' of substrate 206 and includes semiconductor layers 215 and semiconductor layers 220 stacked vertically (e.g., along the z-direction) in an interleaving or alternating configuration from a top surface of substrate 206. In some embodiments, semiconductor layers 215 and semiconductor layers 220 are epitaxially grown in the depicted interleaving and alternating configuration. For example, a first one of semiconductor layers 215 is epitaxially grown on substrate 206, a first one of semiconductor layers 220 is epitaxially grown on the first one of semiconductor layers 220, a second one of semiconductor layers 215 is epitaxially grown on the first one of semiconductor layers 220, and so on until semiconductor layer stacks 210 have a desired number of semiconductor layers 215 and semiconductor layers 220. In such embodiments, semiconductor layers 215 and semiconductor layers 220 can be referred to as epitaxial layers. In some embodiments, epitaxial growth of semiconductor layers 215 and semiconductor layers 220 is achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 215 is different than a composition of semiconductor layers 220 to achieve etching selectivity and/or different oxidation rates during subsequent processing. In some embodiments, semiconductor layers 215 have a first etch rate to an etchant and semiconductor layers 220 have a second etch rate to the etchant, where the second etch rate is different than the first etch rate. In some embodiments, semiconductor layers 215 have a first oxidation rate and semiconductor layers 220 have a second oxidation rate, where the second oxidation rate is different than the first oxidation rate. In the depicted embodiment, semiconductor layers 215 and semiconductor layers 220 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 215 include silicon germanium and semiconductor layers 220 include silicon, a silicon etch rate of semiconductor layers 220 is less than a silicon germanium etch rate of semiconductor layers 215. In some embodiments, semiconductor layers 215 and semiconductor layers 220 include the same material but with different constituent atomic percentages to achieve the etching selectivity and/or different oxidation rates. For example, semiconductor layers 215 and semiconductor layers 220 can include silicon germanium, where semiconductor layers 215 have a first silicon atomic percent and/or a first germanium atomic percent and semiconductor layers 220 have a second, different silicon atomic percent and/or a second, different germanium atomic percent. The present disclosure contemplates that semiconductor layers 215 and semiconductor layers 220 including any combination of semiconductor materials that provides desired etching selectivity, desired oxidation rate differences, and/or desired performance characteristics (e.g., materials that maximize current flow), including any of the semiconductor materials disclosed herein.

As described further below, semiconductor layers 220 or portions thereof form channel regions of multigate device 200. In the depicted embodiment, each semiconductor layer stack 210 includes three semiconductor layers 215 and three semiconductor layers 220 configured to form three semiconductor layer pairs disposed over substrate 206, each semiconductor layer pair having a respective semiconductor layer 215 and a respective semiconductor layer 220. After undergoing subsequent processing, such configuration will result in multigate device 200 having three channels. However, the present disclosure contemplates embodiments where semiconductor layer stack 210 includes more or less semiconductor layers, for example, depending on a number of channels desired for multigate device 200 and/or design requirements of multigate device 200. For example, semiconductor layer stacks 210 can include two to ten semiconductor layers 215 and two to ten semiconductor layers 220. In furtherance of the depicted embodiment, semiconductor layers 215 have a thickness t1 and semiconductor layers 220 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 220), thickness t2 can be configured to achieve desired thickness of channels of multigate device 200, and thickness t1 and thickness t2 can be configured to achieve desired performance of multigate device 200. In some embodiments, semiconductor layers 220 include n-type and/or p-type dopants depending on their corresponding transistor region. For example, semiconductor layers 220 in first transistor region 202A can include p-type dopants and semiconductor layers 220 in second transistor region 202B can include n-type dopants.

Figure 3:
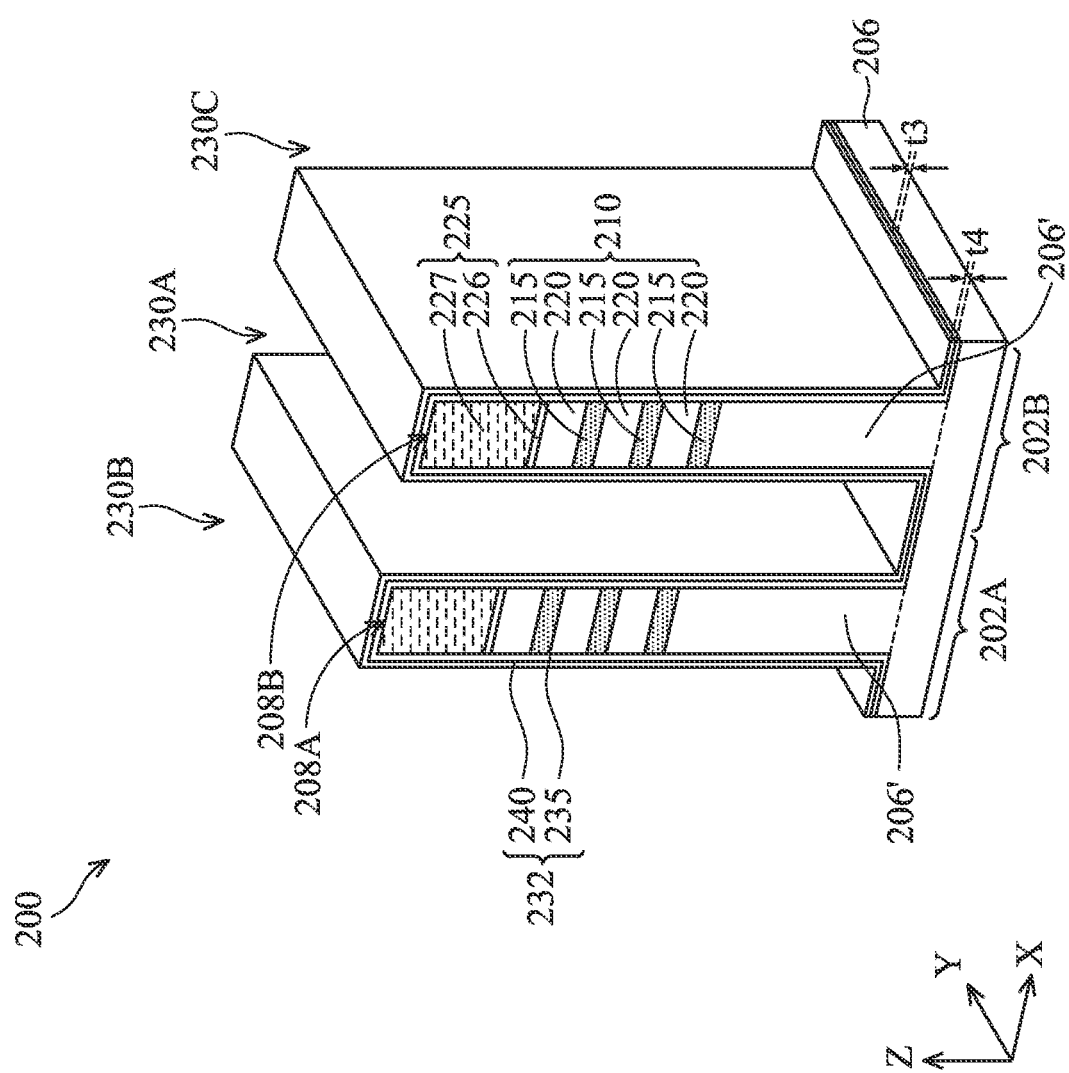

Fin 208A is disposed between a trench 230A and a trench 230B, and fin 208B is disposed between trench 230A and a trench 230B. Trench 230A is defined between fin 208A and fin 208B. For example, trench 230A has a sidewall defined by fin 208A, a sidewall defined by fin 208B, and a bottom defined by substrate 206 that extends between the sidewalls. Turning to FIG. 3, a liner layer 232 is formed over multigate device 200, such that liner layer 232 partially fills trenches 230A-230C. For example, a dielectric liner 235 is formed over fins 208A, 208B and substrate 206, and a silicon liner 240 is formed over dielectric liner 235, where dielectric liner 235 and silicon liner 240 partially fills trenches 230A-230C. Dielectric liner 235 and silicon liner 240 covers substrate 206 and fins 208A, 208B, such that dielectric liner 235 and silicon liner 240 cover sidewalls and bottoms of trenches 230A-230C. In some embodiments, an atomic layer deposition (ALD) process is performed to deposit dielectric liner 235 having a thickness t3 over multigate device 200, and an ALD process is performed to deposit silicon liner 240 having a thickness t4 over dielectric liner 235. In some embodiments, thickness t3 and thickness t4 are substantially uniform over various surfaces of multigate device 200. For example, thickness t3 and thickness t4 along sidewalls of trenches 230A-230C (i.e., over sidewalls of fins 208A, 208B) are, respectively, substantially the same as thickness t3 and thickness t4 along bottoms of trenches 230A-230C (i.e., over top surfaces of substrate 206) and thickness t3 and thickness t4 along top surfaces of fins 208A, 208B. In some embodiments, thickness t3 is about 0.5 nm to about 2.5 nm and thickness t4 is about 1 nm to about 4.5 nm. In some embodiments, dielectric liner 235 and/or silicon liner 240 is formed by chemical vapor deposition (CVD), physical vapor deposition (PVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), other suitable methods, or combinations thereof. In some embodiments, dielectric liner 235 includes an oxygen-comprising dielectric material, such as a dielectric material that includes oxygen in combination with silicon, carbon, and/or nitrogen, and thus can be referred to as an oxide liner. For example, in some embodiments, dielectric liner 235 includes silicon oxide, silicon oxynitride (SiON), and/or silicon oxycarbon nitride (SiOCN). For example, dielectric liner 235 includes silicon and oxygen, such as $SiO_2$. In some embodiments, dielectric liner 235 and/or silicon liner 240 includes n-type dopants and/or p-type dopants. In some embodiments, dielectric liner 235 and dummy gate dielectrics 232 include the same dielectric material. In some embodiments, dielectric liner 235 and dummy gate dielectrics 232 include different dielectric materials.

Figure 4:
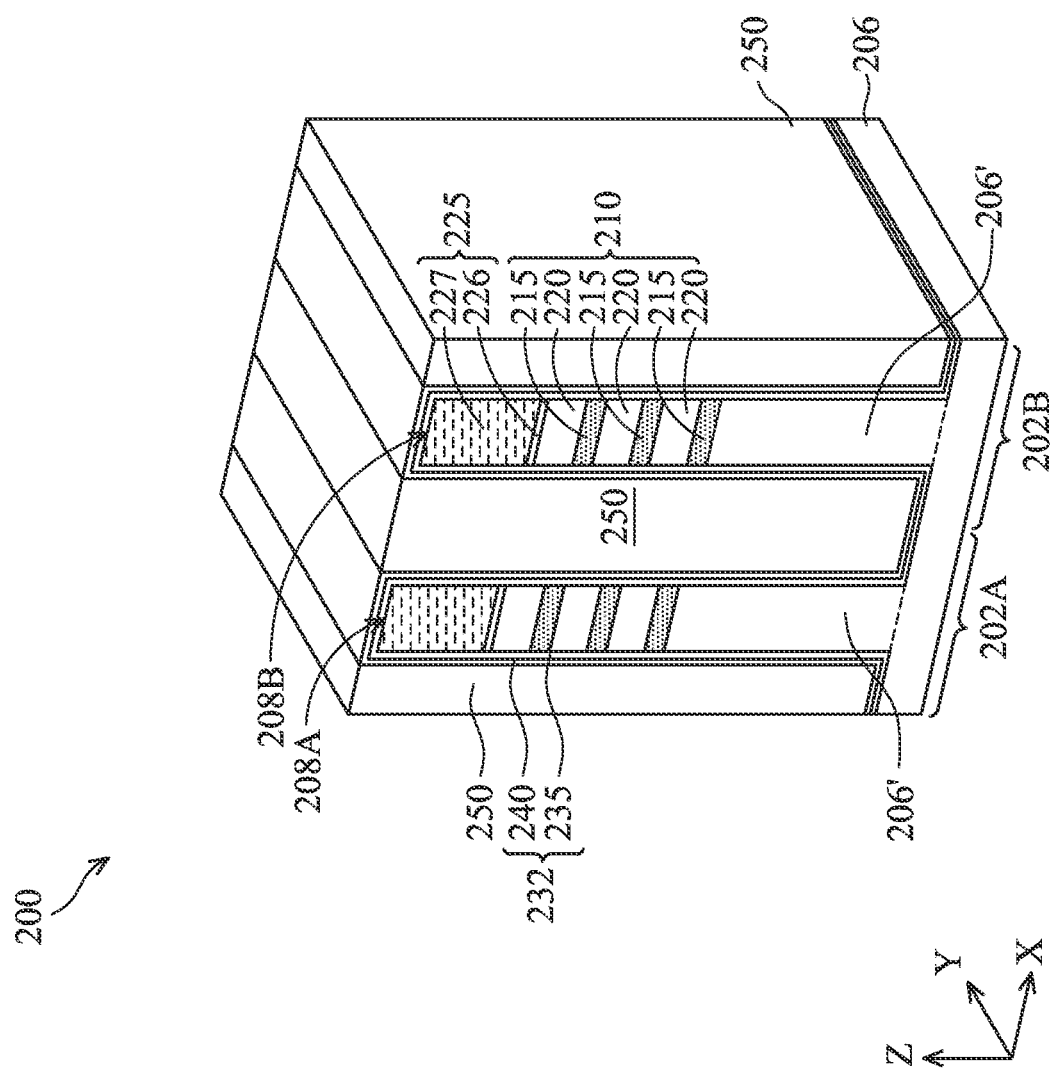

Turning to FIG. 4, remainders of trenches 230A-230C are filled with an oxide material 250. For example, a deposition process and a planarization process are performed to form oxide material 250 over silicon liner 240 and fill any remaining portions of trenches 230A-230C. In some embodiments, oxide material 250 is deposited by a flowable CVD (FCVD) process that includes, for example, depositing a flowable oxide material (for example, in a liquid state) over multigate device 200 and converting the flowable oxide material into a solid oxide material by an annealing process. The flowable oxide material can flow into trenches 230A-230C and conform to exposed surfaces of multigate device 200, enabling void free filling of trenches 230A-230C. For example, the FCVD process introduces a silicon-comprising precursor and an oxidizer (collectively referred to as reactants) into a deposition chamber, where the silicon-comprising precursor and the oxidizer react and condense onto exposed surfaces of multigate device 200 (for example, silicon liner 240) to form the flowable oxide material. In some embodiments, the flowable oxide material is a flowable silicon-and-oxygen comprising material. In some embodiments, the silicon-containing precursor is a silazene-based precursor (e.g., polysilazane, silylamine, ditrisilylamine, dimethylsilane, trimethylsilane, tetramethylsilane, diethylsilane, other suitable silicon-containing precursor, or combinations thereof) and the oxidizer includes oxygen (e.g., $O_2$, $O_3$, hydrogen peroxide ($H_2O_2$), $H_2O$, other suitable oxygen-containing constituents, or combinations thereof). In some embodiments, the silicon-containing precursor, such as the silazene-based precursor, is introduced into the deposition chamber in a liquid or vapor state. In some embodiments, the oxidizer is excited to an ionized state by plasma, such that the oxidizer is introduced into the deposition chamber in a plasma state. In some embodiments, the silicon-containing precursor and/or the oxidizer is mixed with a carrier gas (including, for example, hydrogen, helium, argon, nitrogen, xenon, krypton, neon, other suitable constituent, or combinations thereof) before or after introduction into the deposition chamber. In the depicted embodiment, the annealing process converts the flowable silicon-and-oxygen material into a silicon-and-oxygen containing layer, such as a silicon oxide layer. Oxide material 250 may thus be referred to as a silicon oxide layer. In some embodiments, the annealing process is a thermal annealing that heats multigate device 200 to a temperature that can facilitate conversion of the flowable oxide material into the solid oxide material. In some embodiments, the annealing process exposes the flowable oxide material to UV radiation. In some embodiments, oxide material 250 is deposited by a high aspect ratio deposition (HARP) process. The HARP process can implement a TEOS precursor and an $O_3$ precursor. In some embodiments, oxide material 250 is deposited by HDPCVD. The HDPCVD can implement an $SiH_4$ precursor and an $O_2$ precursor. The present disclosure contemplates implementing other deposition processes and/or precursors to deposit oxide material 250.

The deposition process overfills trenches 230A-230C, such that a thickness of oxide material 250 is greater than a height of fins 208A, 208B. After the deposition process, the planarization process, such as a chemical mechanical polishing (CMP) process, is performed on oxide material 250, thereby reducing the thickness of oxide material 250. In the depicted embodiment, silicon liner 240 functions as a planarization (e.g., CMP) stop layer, such that the planarization process is performed until reaching and exposing silicon liner 240 that is disposed over top surfaces of fins 208A, 208B. Accordingly, after the planarization process, the thickness of oxide material is substantially equal to a sum of a height of fins 208A, 208B, thickness t4 of dielectric liner 235 disposed over top surfaces of fins 208A, 208B, and thickness t4 of silicon liner 240 disposed over the top surfaces of fins 208A, 208B. The planarization process thus removes any oxide material 250 that is disposed over the top surfaces of fins 208A-208D. In some embodiments, top surfaces of oxide material 250 and silicon liner 240 are substantially planar after the planarization process. In some embodiments, an annealing process is subsequently performed to further cure and/or densify oxide material 250.

Figure 5:
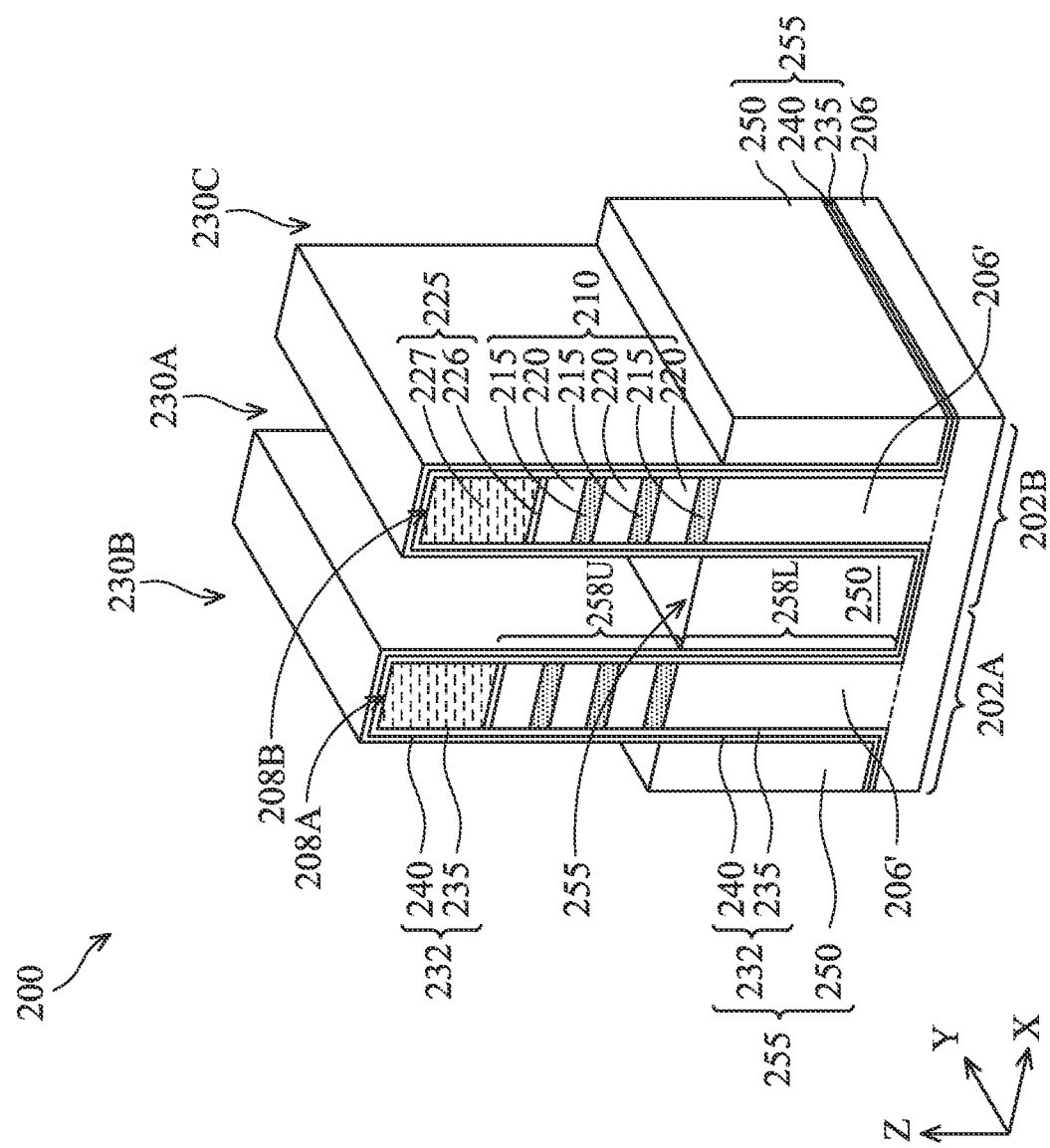

Turning to FIG. 5, oxide material 250 is recessed (for example, by an etching process) to form isolation features 255, such that fins 208A, 208B extend (protrude) from between oxide material 250. For example, oxide material 250 surrounds a bottom portion of fins 208A, 208B, thereby defining upper fin active regions 258U of fins 208A, 208B (generally referring to a portion of fins 208A, 208B that extends from top surfaces of oxide material 250) and lower fin active regions 258L of fins 208A, 208B (generally referring to a portion of fins 208A, 208B surrounded by oxide material 250, which extend from the top surface of substrate 206 to the top surfaces of oxide material 250). After recessing oxide material 250, lower portions of trench 230A-230C are filled with oxide material 250, silicon liner 240, and dielectric liner 235 while upper portions of trench 230A-230C are partially filled with silicon liner 240 and dielectric liner 235. Isolation features 255 are formed from oxide material 250, silicon liner 240, and dielectric liner 235 that fills lower portions of trenches 230A-230C. Isolation features 255 thus include oxide material 250, silicon liner 240, and dielectric liner 235, where oxide material 250 is disposed on silicon liner 240 and silicon liner 240 is disposed on dielectric liner 235, which is disposed on sidewalls of lower fin active regions 258L. Oxide material 250 of isolation features 255 can be referred to as oxide layer, a bulk dielectric, and/or bulk dielectric layer of isolation features 255. Isolation features 255 electrically isolate active device regions and/or passive device regions of multigate device 200 from each other. For example, isolation features 255 separate and electrically isolate first transistor region 202A from second transistor region 202B, first transistor region 202A from other active device regions and/or passive device regions of multigate device 200, and second transistor region 202B from other active device regions and/or passive device regions of multigate device 200. Various dimensions and/or characteristics of isolation features 255 can be configured during the processing associated with FIGS. 2-5 to achieve shallow trench isolation (STI) structures, deep trench isolation (DTI) structures, local oxidation of silicon (LOCOS) structures, other suitable isolation structures, or combinations thereof. In the depicted embodiment, isolation features 255 are STIs. In some embodiments, an etching process recesses oxide material 250 until achieving a desired (target) height of upper fin active regions 258U. In the depicted embodiment, the etching process proceeds until reaching fin portions 206' of fins 208A, 208B, such that semiconductor layer stacks 210 define upper fin active regions 258U. In some embodiments, as depicted, top surfaces of fin portions 206' are substantially planar with top surfaces of oxide material 250 after the etching process. In some embodiments, fin portions 206' are partially exposed by the etching process, such that top surfaces of fin portions 206' are higher than top surfaces of oxide material 250 relative to the top surface of substrate 206 after the etching process. In some embodiments, semiconductor layer stacks 210 are partially, instead of fully exposed, by the etching process, such that top surfaces of fin portions 206' are lower than top surfaces of oxide material 250 relative to the top surface of substrate 206 after the etching process.

The etching process is configured to selectively remove oxide material 250 with respect to silicon liner 240. In other words, the etching process substantially removes oxide material 250 but does not remove, or does not substantially remove, silicon liner 240. For example, an etchant is selected for the etch process that etches silicon oxide (i.e., oxide material 250) at a higher rate than silicon (i.e., silicon liner 240) (i.e., the etchant has a high etch selectivity with respect to silicon oxide). The etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement a fluorine-comprising etch gas, such as $NF_3$, to achieve selective etching of silicon oxide (i.e., oxide material 250) with respect to silicon (i.e., silicon liner 240). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$ (sulfuric acid), $H_2O_2$ (hydrogen peroxide), $NH_4OH$ (ammonium hydroxide), HCl (hydrochloric acid), HF (hydrofluoric acid), DHF (diluted HF), $HNO_3$ (nitric acid), $H_3PO_4$ (phosphoric acid), $H_2O$ (water) (which can be deionized water (DIW) or ozonated de-ionized water ($DIWO_3$)), ozone ($O_3$), other suitable chemicals, or combinations thereof. Various parameters of the etch process can be tuned to achieve selective etching of oxide material 250, such as a flow rate of an etch gas, a concentration of the etch gas, a concentration of the carrier gas, a ratio of the concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps. In some embodiments, the etching process uses a patterned mask layer as an etch mask, where the patterned mask layer covers silicon liner 240 disposed over tops surfaces of fins 208A, 208B but has openings therein that expose oxide material 250.

Figure 6:
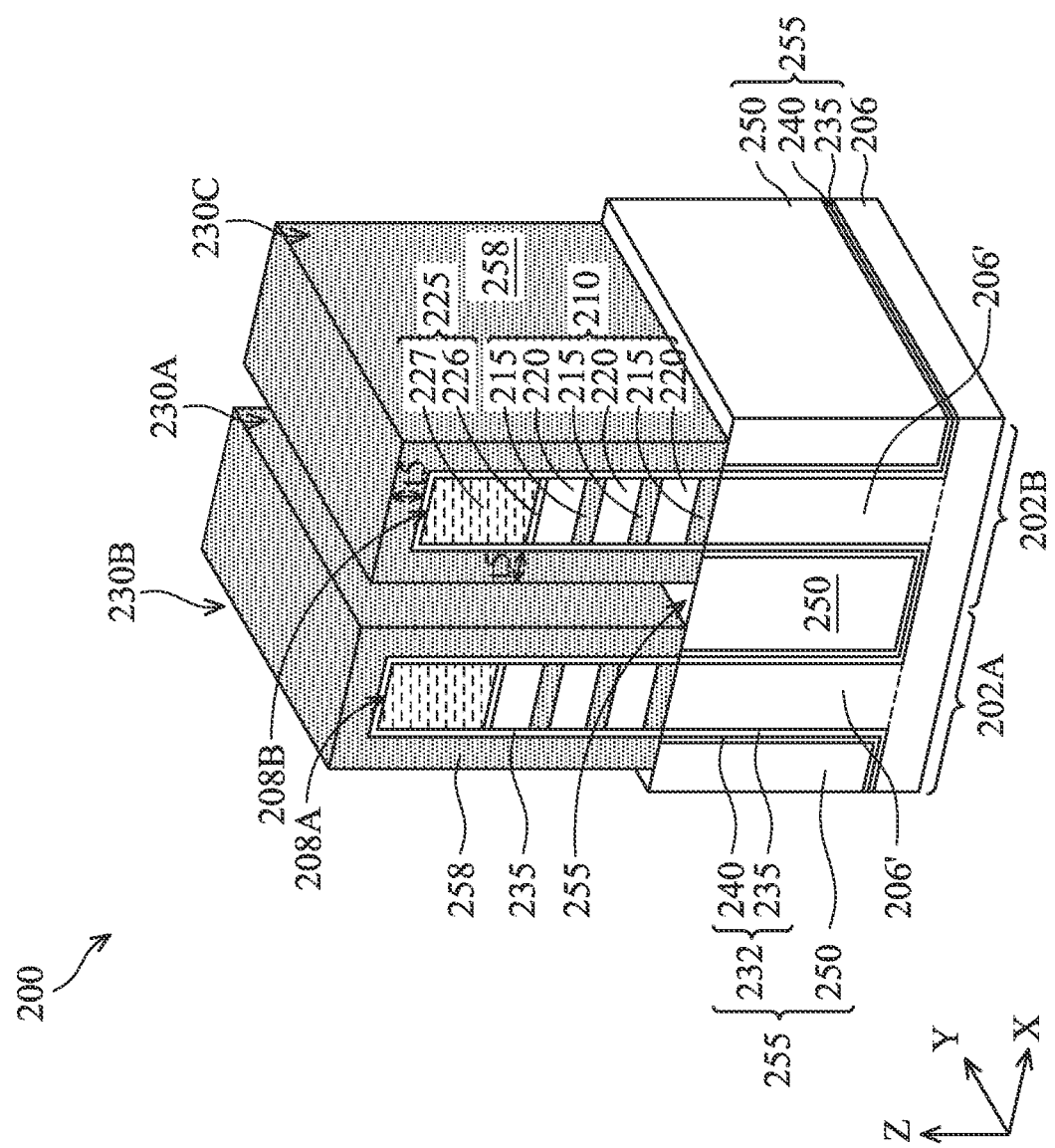

Turning to FIG. 6, silicon germanium sacrificial layers 258 are formed over fins 208A, 208B. In the depicted embodiment, silicon germanium sacrificial layers 258 are formed on top surfaces and sidewalls of upper fin active regions 258U of fins 208A, 208B, such that silicon germanium sacrificial layers wrap upper fin active regions 258U of fins 208A, 208B. In furtherance of the depicted embodiment, upper portions of trenches 230A-230C are partially filled with silicon germanium sacrificial layers 258. Silicon germanium sacrificial layer 258 has a thickness t5 that is greater than thickness t4 of silicon liner 240. In some embodiments, thickness t5 is about 3.5 nm to about 12 nm. In some embodiments, thickness t5 is less than thickness t4 depending on processing steps and/or conditions used to replace exposed portions of silicon liner 240 with silicon germanium sacrificial layers 258. Thickness t5 may be selected depending on desired inner spacer thicknesses of multigate device 200. In some embodiments, thickness t5 is substantially equal to thickness t1 of semiconductor layers 215, such that first thicknesses of first inner spacers subsequently formed to replace portions of silicon germanium layers 258 are substantially the same as second thicknesses of second inner spacers subsequently formed to replace portions of semiconductor layers 215. In some embodiments, thickness t5 is greater than thickness t1 of semiconductor layers 215, such that first thicknesses of first inner spacers subsequently formed to replace portions of silicon germanium layers 258 are greater than second thicknesses of second inner spacers subsequently formed to replace portions of semiconductor layers 215. In some embodiments, exposed portions of silicon liner 240 are converted into silicon germanium sacrificial layers 258. For example, a deposition process is performed that selectively grows silicon germanium layers over exposed portions of silicon liner 240 (i.e., semiconductor surfaces) without growing the silicon germanium layers on exposed portions of oxide material 250 (e.g., dielectric surfaces), and an annealing process is performed that drives (diffuses) germanium from the silicon germanium layers into the exposed portions of silicon liner 240, thereby causing the exposed portions of the silicon liner 240 to become a part of the silicon germanium layers. In some embodiments, the deposition process is an epitaxy process that uses CVD deposition techniques (for example, LPCVD, VPE, and/or UHV-CVD), molecular beam epitaxy, other suitable epitaxial growth processes, or combinations thereof. The epitaxy process can use gaseous and/or liquid precursors (e.g., a silane precursor and a germanium precursor), which interact with the composition of silicon liner 240. Alternative or additionally to performing the annealing process, the silicon germanium layers can be exposed to an oxidizing ambient (e.g., oxygen), where silicon from the silicon germanium layers reacts with oxygen to form a thin outer silicon oxide layer and germanium from the silicon germanium layers diffuses into and reacts with silicon in the exposed portions of silicon liner 240, thereby causing the exposed portions of the silicon liner 240 to become a part of the silicon germanium layers. Such process can be referred to as a silicon germanium condensation process. A suitable cleaning process and/or etching process can be implemented to remove the thin silicon oxide layer. Silicon germanium sacrificial layers 258 can also be referred to as silicon germanium cladding layers, silicon germanium helmets, and/or a silicon germanium protection layers.

In FIG. 6, dielectric liner 235, which is disposed between silicon liner 240 (which is converted into silicon germanium sacrificial layers 258) and fins 208A, 208B, minimizes thickness variations and improves conformability of silicon germanium sacrificial layers 258 wrapping fins 208A, 208B. For example, without dielectric liner 235, portions of semiconductor layer stacks 210 (e.g., portions of semiconductor layers 220 and/or semiconductor layers 215) and portions of patterning layers 225 may be consumed while converting silicon liner 240 into silicon germanium sacrificial layers 258. This can result in silicon germanium sacrificial layers 258 having non-conformal thickness profiles, where thickness t5 varies along sidewalls of fins 208A, 208B. For example, thickness t5 along sidewalls of patterning layers 225 may be less than thickness t5 along sidewalls of semiconductor layer stacks 210. In some embodiments, thickness t5 along interface regions between patterning layers 225 and semiconductor layers tacks 210 may be less than thickness t5 along sidewalls of patterning layers 225 and thickness t5 along sidewalls of semiconductor layer stacks 210, causing dips in silicon germanium sacrificial layers 258 at the interface. In furtherance of such example, thickness t5 along sidewalls of semiconductor layers 215 may be different than thickness t5 along sidewalls of semiconductor layers 220. In contrast, inserting dielectric liner 235 between fins 208A, 208B and silicon liner 240 prevents portions of fins 208A, 208B (i.e., semiconductor layer stacks 210 and/or patterning layers 225) from being converted into portions of silicon germanium sacrificial layers 258. This can result in silicon germanium sacrificial layers 258 having conformal thickness profiles, where thickness t5 does not vary, or minimally varies, along sidewalls of fins 208A, 208B. For example, thickness t5 along sidewalls of patterning layers 225 may about the same as thickness t5 along sidewalls of semiconductor layer stacks 210. In some embodiments, thickness t5 along interface regions between patterning layers 225 and semiconductor layers tacks 210 is about the same as thickness t5 along sidewalls of patterning layers 225 and thickness t5 along sidewalls of semiconductor layer stacks 210, eliminating dips in silicon germanium sacrificial layers 258 at the interface. In furtherance of such example, thickness t5 along sidewalls of semiconductor layers 215 may be about the same as thickness t5 along sidewalls of semiconductor layers 220. In some embodiments, such as depicted, any variation in thickness t5 of silicon germanium sacrificial layers 258 is less than or equal to about 4%, and in the depicted embodiment, less than or equal to about 3%. Silicon germanium sacrificial layers 258 having conformal profiles provides better inner spacer formation control. For example, subsequently formed inner spacers, which are described below and replace portions of silicon germanium sacrificial layers 258, have more uniform, conformal thicknesses.

Figure 7:
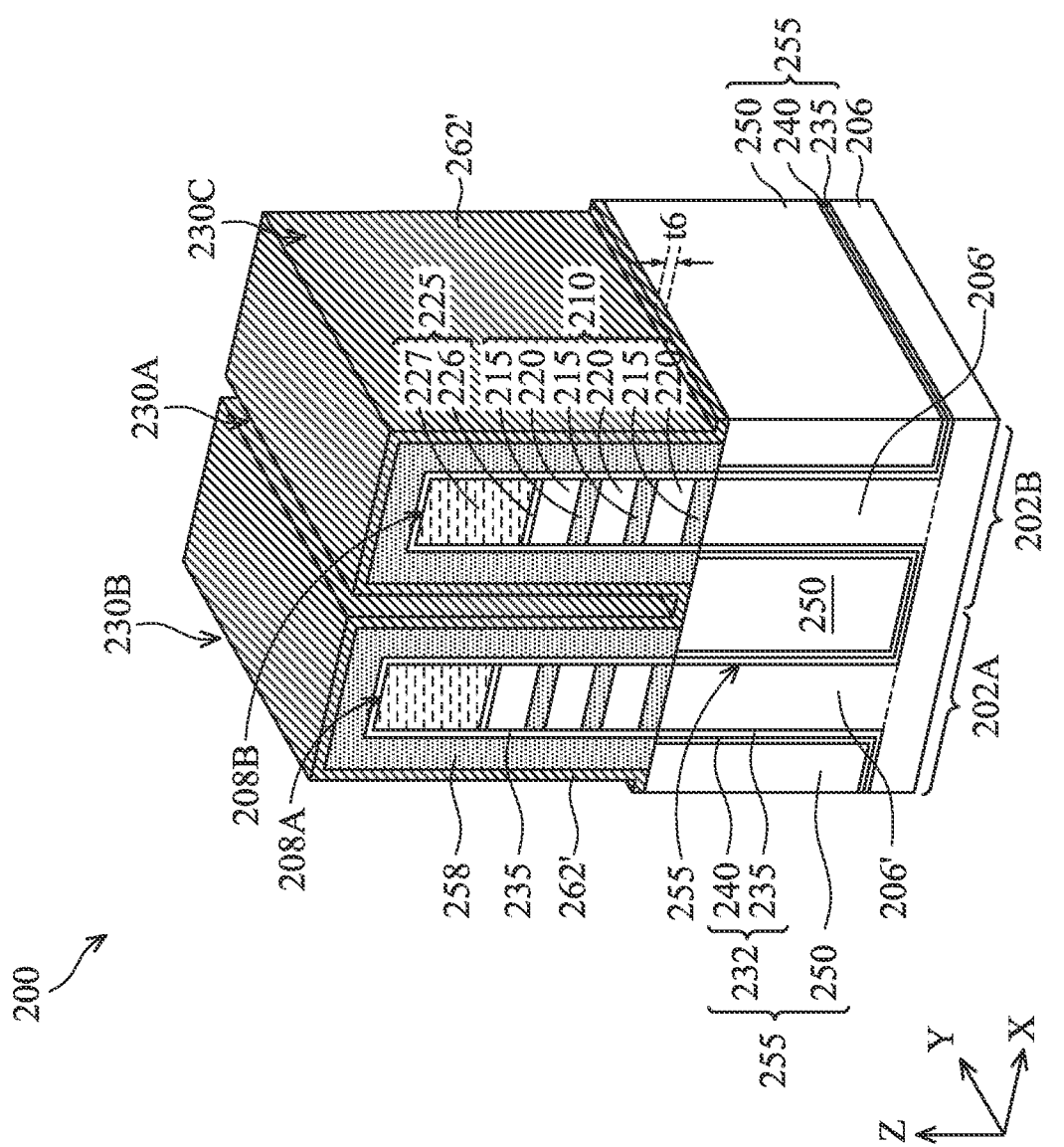
Figure 8:
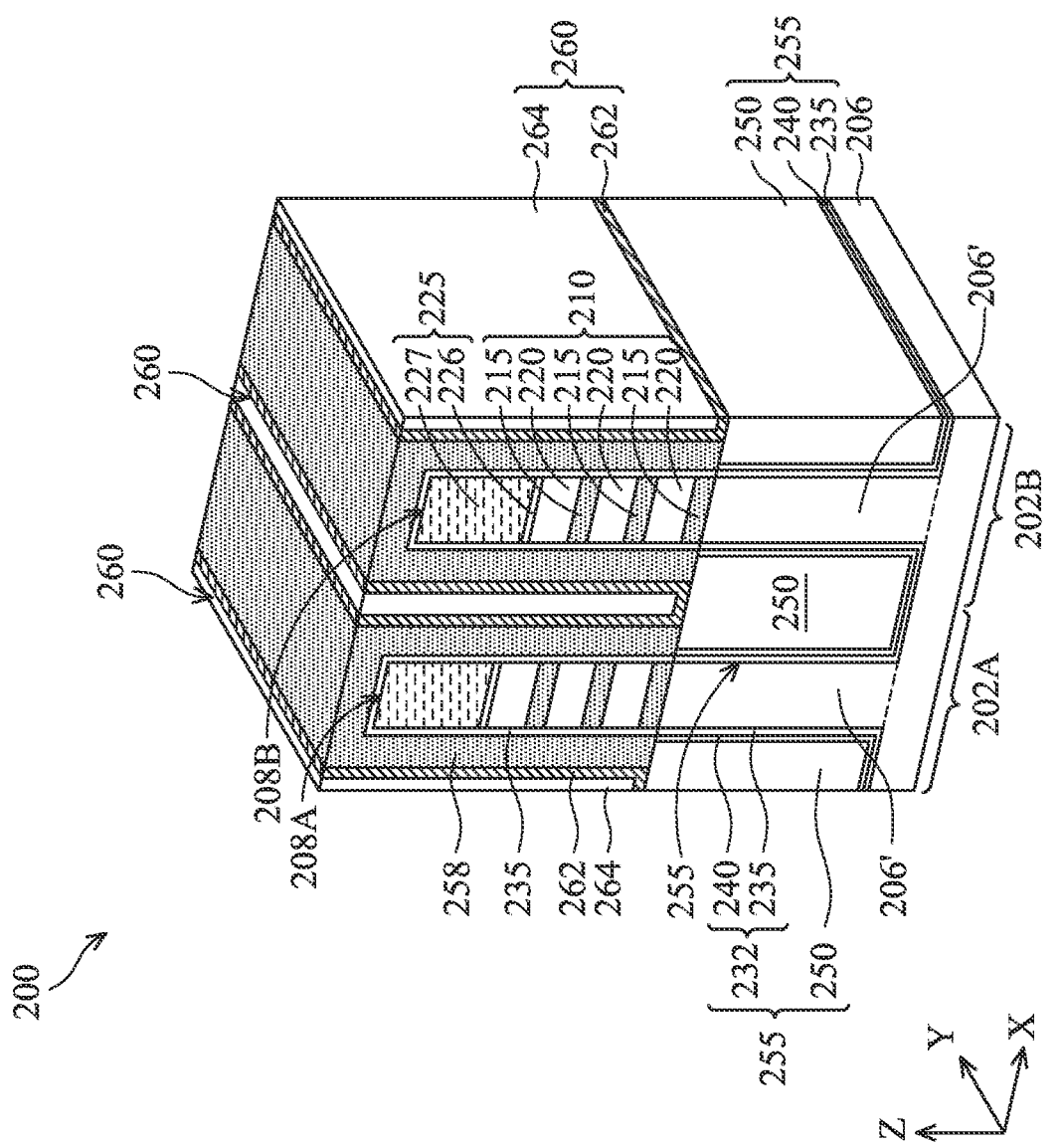

Turning to FIG. 7 and FIG. 8, a remainder of upper portions of trenches 230A-230C are filled with dielectric features 260, each of which includes a dielectric liner 262 and an oxide layer 264 disposed over dielectric liner 262. In the depicted embodiment, dielectric liner 262 includes a dielectric material having a dielectric constant that is less than about 7.0 (k<7.0). For purposes of the present disclosure, such dielectric materials are referred to as low-k dielectric materials, and dielectric liner 262 can be referred to as a low-k dielectric liner. In some embodiments, dielectric liner 262 includes a dielectric material having a dielectric constant of about 1.0 to about 7.0. In some embodiments, dielectric liner 262 includes a silicon-comprising dielectric material, such as a dielectric material that includes silicon in combination with oxygen, carbon, and/or nitrogen. For example, dielectric liner 262 includes silicon oxide, silicon nitride, silicon carbon nitride, silicon oxycarbide, silicon oxycarbonitride, or combinations thereof. In some embodiments, dielectric liner 262 includes n-type dopants and/or p-type dopants. For example, dielectric liner 262 can be a boron-doped nitride liner. In some embodiments, dielectric liner 262 includes a dielectric material having a dielectric constant that is less than a dielectric constant of silicon dioxide ($SiO_2$) (k≈3.9), such as fluorine-doped silicon oxide (often referred to as fluorosilicate glass (FSG)), carbon-doped silicon oxide (often referred to as carbon-doped FSG), Black Diamond® (Applied Materials of Santa Clara, Calif.), xerogel, aerogel, amorphous fluorinated carbon, parylene, benzocyclobutene (BCB)-based dielectric material, SiLK (Dow Chemical, Midland, Mich.), polyimide, other low-k dielectric material, or combinations thereof. In some embodiments, dielectric liner 262 includes boron silicate glass (BSG), phosphosilicate glass (PSG), and/or boron-doped phosphosilicate glass (BPSG). In some embodiments, oxide layer 264 is similar to oxide material 250 and thus may be formed and include materials as described above with reference to oxide material 250 in FIG. 5. For example, oxide layer 264 includes silicon and oxygen and is referred to as a silicon oxide layer.

In some embodiments, dielectric features 260 are formed over isolation features 255 by depositing a dielectric layer 262' over multigate device 200, where dielectric layer 262' partially fills upper portions of trenches 230A-230C (FIG. 7); depositing an oxide material over dielectric layer 262', where the oxide material fills a remainder of upper portions of trenches 230A-230C (FIG. 8); and performing a planarization process, such as a chemical mechanical polishing (CMP) process, to remove any of the oxide material and/or dielectric layer 262' that is disposed over top surfaces of silicon germanium sacrificial layers 258 (FIG. 8). For example, silicon germanium sacrificial layers 258 function as a planarization (e.g., CMP) stop layer, such that the planarization process is performed until reaching and exposing silicon germanium sacrificial layers 258. A remainder of the oxide material and dielectric layer 262' form dielectric liners 262 and oxide layers 264 of dielectric features 260, as depicted in FIG. 8. In such embodiments, the planarization process removes portions of dielectric layer 262' that are disposed over top surfaces of silicon germanium sacrificial layers 258, thereby forming dielectric liners 262 that partially fill each of trenches 230A-230C. In some embodiments, an ALD process is performed to form dielectric layer 262'. In some embodiments, an LPCVD process is performed to form dielectric layer 262'. Dielectric layer 262' has a thickness t6 over multigate device 200. In some embodiments, thickness t6 is about 3 nm to about 6 nm. In some embodiments, thickness t6 is substantially uniform over various surfaces of multigate device 200. For example, thickness t6 along sidewalls of upper portions of trenches 230A-230C (i.e., over top and sidewall surfaces of silicon germanium sacrificial layers 258) is substantially the same as thickness t6 along bottoms of upper portions of trenches 230A-230C (i.e., over top surfaces of isolation features 255). In some embodiments, dielectric layer 262' is formed by CVD, PVD, HDPCVD, MOCVD, RPCVD, PECVD, APCVD, SAVCD, other suitable deposition processes, or combinations thereof. In some embodiments, the oxide material is deposited over the dielectric layer by FCVD, HPCVD, HARP, CVD, and/or other suitable deposition process. In the depicted embodiment, the oxide material is deposited over dielectric layer 262' by FCVD. In FIG. 8, dielectric features 260 and silicon germanium sacrificial layers 258 combine to fill an entirety of upper portions of trenches 230A-230C, and isolation features 255 fill an entirety of lower portions of trenches 230A-230C.

Figure 9:
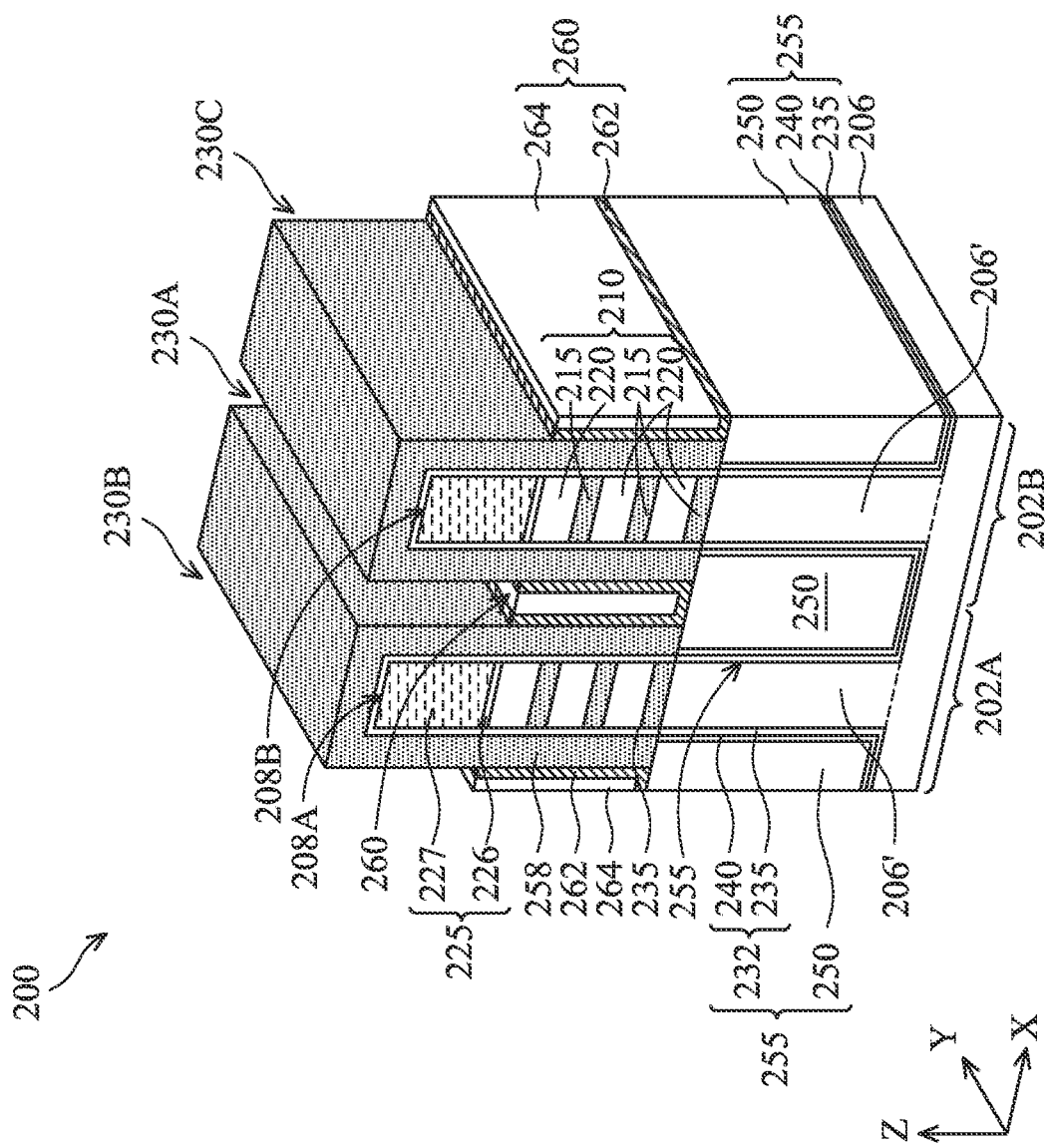

Turning to FIG. 9, dielectric features 260 are partially removed from trenches 230A-230C. For example, dielectric features 260 are recessed to expose portions of silicon germanium sacrificial layers 258 that cover patterning layer 225, such as top surfaces and sidewalls of patterning layer 225. After recessing dielectric features 260, dielectric features 260 partially fill upper portions of trenches 230A-230C (i.e., fills a lower portion of upper portions of trenches 230A-230C). In some embodiments, an etching process recesses dielectric features 260 until reaching semiconductor layer stacks 210 of fins 208A, 208B. For example, top surfaces of semiconductor layer stacks 210 (here, top surfaces of topmost semiconductor layers 220 of semiconductor layer stacks 210) are substantially planar with top surfaces of dielectric features 260 after the etching process. In some embodiments, portions of silicon germanium layers 258 that are disposed along sidewalls of semiconductor layer stacks 210 are partially exposed by the etching process, such that top surfaces of dielectric features 260 are lower than top surfaces of semiconductor layer stacks 210 relative to the top surface of substrate 206 after the etching process. The etching process is configured to selectively remove dielectric liner 262 and oxide layer 264 with respect to silicon germanium sacrificial layers 258. In other words, the etching process substantially removes dielectric liner 262 and oxide layer 264 but does not remove, or does not substantially remove, silicon germanium sacrificial layers 258. For example, an etchant is selected for the etch process that etches silicon-comprising dielectric materials (i.e., dielectric liner 262 and oxide layer 264) at a higher rate than silicon germanium (i.e., silicon germanium sacrificial layers 258) (i.e., the etchant has a high etch selectivity with respect to silicon-comprising dielectric materials). The etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement an etch gas that includes $CF_4$ and $H_2$ to achieve selective etching of silicon-comprising dielectric materials (i.e., dielectric liner 262 and oxide layer 264) with respect to silicon germanium (i.e., silicon germanium sacrificial layers 258). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. Various parameters of the etch process can be tuned to achieve selective etching of dielectric liner 262 and oxide layer 264, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps, for example, implementing a first etchant to recess oxide layer 264 and a second etchant to recess dielectric liner 262. In some embodiments, the etching process uses a patterned mask layer as an etch mask, where the patterned mask layer covers silicon germanium sacrificial layers 258 but has openings therein that expose dielectric liner 262 and oxide layer 264.

Figure 10:
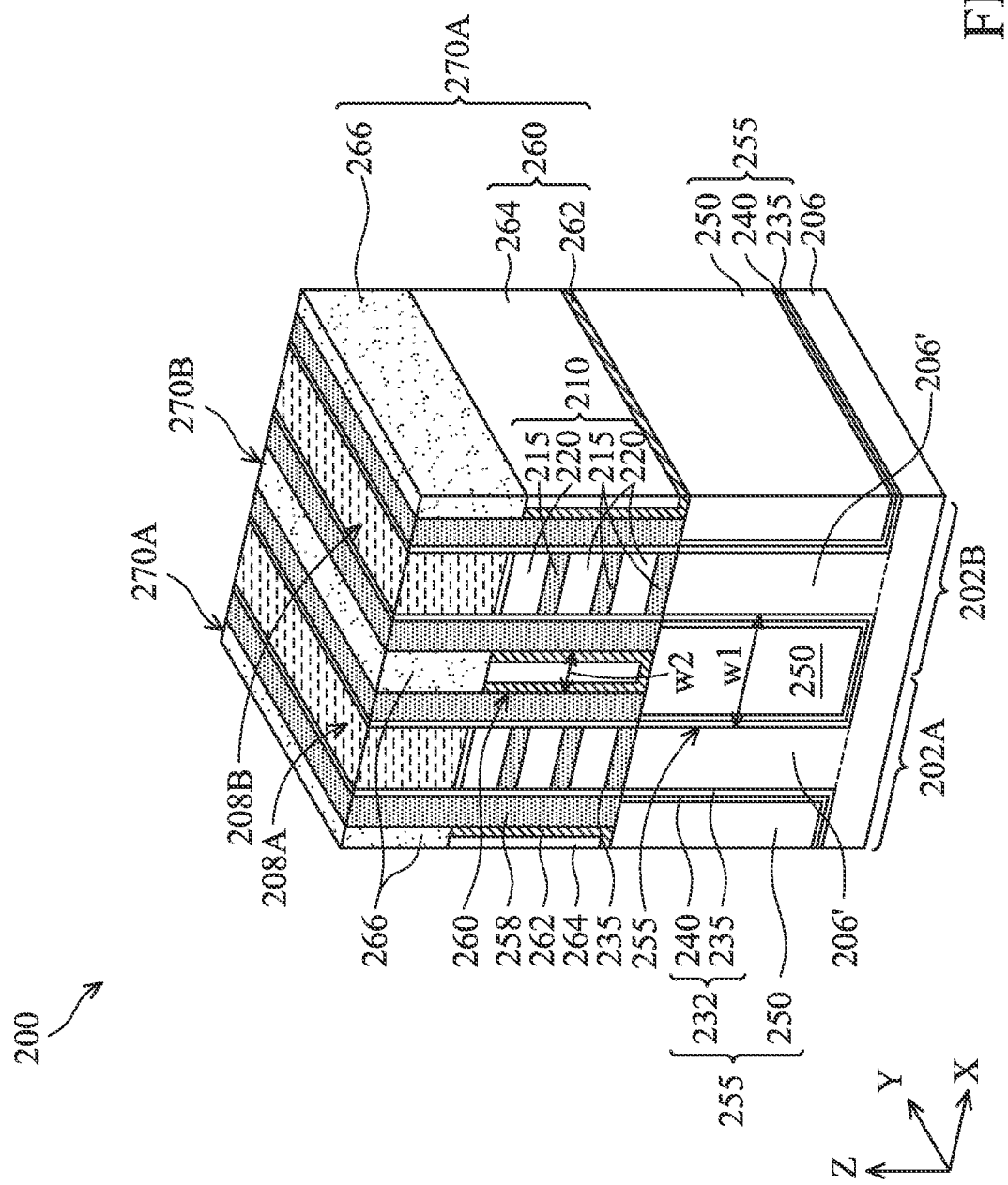

Turning to FIG. 10, dielectric layers 266 are formed over dielectric features 260 to fill a remainder of upper portions of trenches 230A-230C, thereby forming a dielectric fins 270A and a dielectric fin 270B over isolation features 255. Each of dielectric fins 270A, 270B includes a respective dielectric layer 266 disposed over a respective dielectric feature 260. In the depicted embodiment, dielectric fins 270A separate and/or isolate device features and/or transistor features within a transistor region from one another. For example, where first transistor region 202A includes a first CMOS transistor and second transistor region 202B includes a second CMOS transistor, leftmost dielectric fin 270A in first transistor region 202A may separate and/or isolate a gate of a p-type transistor of the first CMOS transistor from a gate of an n-type transistor of the first CMOS transistor, while rightmost dielectric fin 270A in second transistor region 202B may separate and/or isolate a gate of a p-type transistor of the second CMOS transistor from a gate of an n-type transistor of the second CMOS transistor. Dielectric fin 270B separates and isolates device features and/or transistor features in different transistor regions from one another. For example, where first transistor region 202A includes a first transistor and second transistor region 202B includes a second transistor, dielectric fin 270B may separate and/or isolate a gate of the first transistor in first transistor region 202A from a gate of the second transistor in second transistor region 202B. Dielectric fin 270B spans a transistor interface region, which includes an interface between first transistor region 202A and second transistor region 202B, a portion of first transistor region 202A adjacent to the interface, and a portion of second transistor region 202B adjacent to the interface. In the depicted embodiment, silicon germanium sacrificial layers 258 and dielectric liners 235 are disposed between dielectric fins 270A, 270B and fins 208A, 208B, such that sidewalls of fins 208A, 208B do not physically contact dielectric fins 270A, 270B. Further, because trenches 230A-230C are partially filled with silicon germanium sacrificial layers 258, a width w1 of dielectric fins 270A, 270B along the x-direction is less than a width w2 of isolation features 255 along the x-direction.

In some embodiments, dielectric layers 266 are formed by depositing a dielectric material over multigate device 200, where the dielectric material fills remaining upper portions of trenches 230A-230C, and performing a planarization process, such as a CMP process, to remove any of the dielectric material that is disposed over top surfaces of fins 208A, 208B. For example, patterning layer 225 can function as a planarization stop layer, such that the planarization process is performed until reaching and exposing patterning layer 225 of fins 208A, 208B. A remainder of the dielectric material forms dielectric layers 266. In some embodiments, the dielectric material is formed by ALD, CVD, PVD, HDPCVD, MOCVD, RPCVD, PECVD, APCVD, SAVCD, other suitable deposition processes, or combinations thereof. Dielectric layers 266 include a dielectric material having a dielectric constant that is greater than a dielectric constant of the dielectric material of dielectric liners 262. For example, dielectric layers 266 include a dielectric material having a dielectric constant that is greater than or equal to about 7.0 ($k \geq 7.0$). For purposes of the present disclosure, such dielectric materials are referred to as high-k dielectric materials, and dielectric layers 266 can be referred to as a high-k dielectric layers. In some embodiments, dielectric layers 266 includes a dielectric material having a dielectric constant of about 7.0 to about 30.0. In some embodiments, dielectric layers 266 include a metal-and-oxygen-comprising dielectric material having, for example, a dielectric constant of about 7.0 to about 30.0, such as a dielectric material that includes oxygen in combination with hafnium, aluminum, and/or zirconium. In such embodiments, dielectric layers 266 can also be referred to as metal oxide layers. For example, dielectric layers 266 include hafnium oxide (e.g., $HfO_x$), aluminum oxide ($AlO_x$), zirconium oxide ($ZrO_x$), or combinations thereof, where x is a number of oxygen atoms in the dielectric material of dielectric layers 266. In some embodiments, dielectric layers 266 include n-type dopants and/or p-type dopants. In some embodiments, dielectric layers 266 include $HfO_2$, $HfSiO_x$ (e.g., HfSiO or $HfSiO_4$), HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, $(Ba,Sr)TiO_3$, $HfO_2$—$Al_2O_3$, other suitable high-k dielectric material, or combinations thereof.

Figure 11:
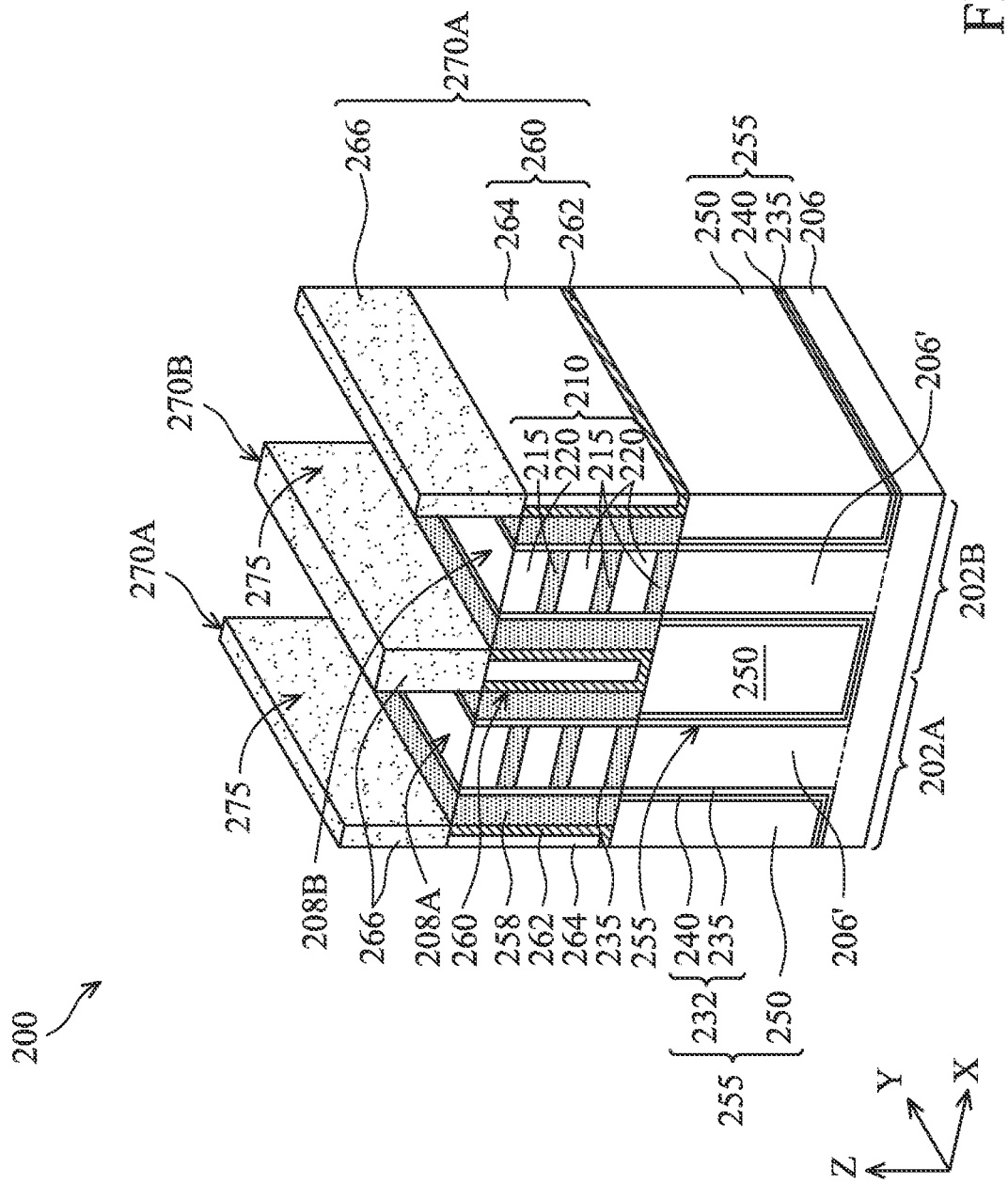

Turning to FIG. 11, an etching process is performed to remove patterning layer 225 from fins 208A, 208B and portions of silicon germanium sacrificial layers 258 disposed along sidewalls of patterning layer 225, thereby forming openings 275 (defined between dielectric layers 266) that expose semiconductor layer stacks 210 of fins 208A, 208B. The etching process is configured to selectively remove patterning layer 225 and silicon germanium sacrificial layers 258 with respect to dielectric layers 266 and semiconductor layers 220 of semiconductor layer stacks 210. In other words, the etching process substantially removes patterning layer 225 and silicon germanium sacrificial layers 258 (in particular, portions of silicon germanium sacrificial layers 258 disposed along sidewalls of patterning layer 225) but does not remove, or does not substantially remove, dielectric layers 266 and semiconductor layers 220. For example, an etchant is selected for the etch process that etches silicon nitride (i.e., patterning layer 225) and silicon germanium (i.e., silicon germanium sacrificial layers 258) at a higher rate than metal-and-oxygen comprising material (i.e., dielectric layers 266) and silicon (i.e., semiconductor layers 220) (i.e., the etchant has a high etch selectivity with respect to silicon nitride and silicon germanium). The etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement a fluorine-comprising etch gas to achieve selective etching of silicon nitride (i.e., patterning layer 225) and silicon germanium (i.e., silicon germanium sacrificial layers 258) with respect to metal-and-oxygen comprising dielectric materials (i.e., dielectric layers 266) and silicon (i.e., semiconductor layers 220). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. Various parameters of the etch process can be tuned to achieve selective etching of patterning layer 225 and silicon germanium sacrificial layers 258, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps, such as a first etch step that selectively etches patterning layer 225 and a second etch step that selectively etches silicon germanium sacrificial layers 258 (e.g., the first etch step and the second etch step implement different etchants). In some embodiments, the etching process uses a patterned mask layer as an etch mask, where the patterned mask layer covers dielectric layers 266 but has openings therein that expose patterning layer 225 and, in some embodiments, portions of silicon germanium sacrificial layers 258 disposed along sidewalls of patterning layer 225.

Figure 12:
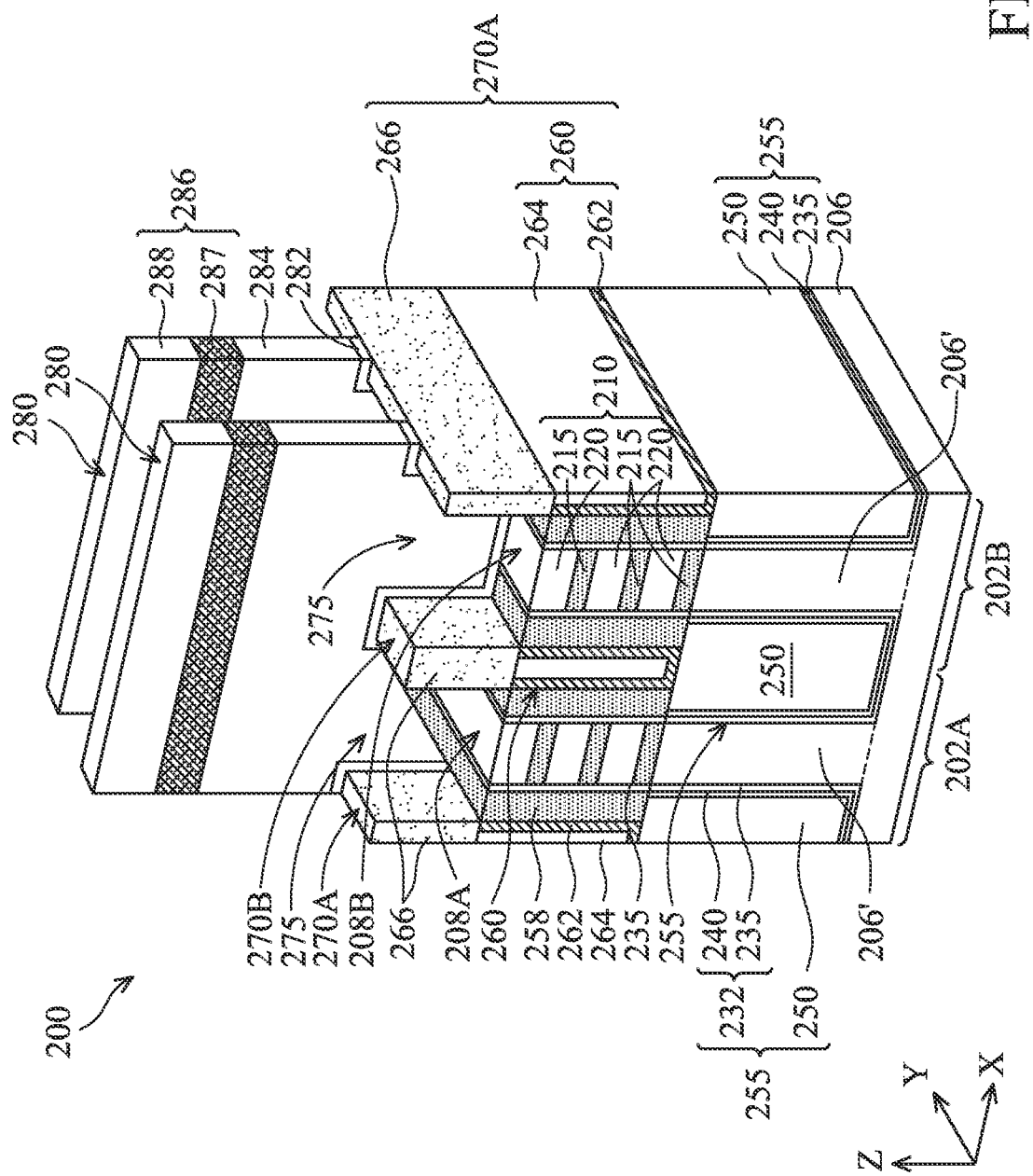

Turning to FIG. 12, dummy gate stacks 280 are formed over portions of fins 208A, 208B and dielectric fins 270A, 270B. Dummy gate stacks 280 fill portions of openings 275. Dummy gate stacks 280 extend lengthwise in a direction that is different than (e.g., orthogonal to) the lengthwise direction of fins 208A, 208B. For example, dummy gate stacks 280 extend substantially parallel to one another along the x-direction, having a length defined in the x-direction, a width defined in the y-direction, and a height defined in the z-direction. Dummy gate stacks 280 are disposed over channel regions (C) of multigate device 200 and between source/drain regions (S/D) of multigate device 200. In the X-Z plane, dummy gate stacks 280 are disposed on top surfaces of fins 208A, 208B (in particular, top surfaces of semiconductor layer stacks 210), top surfaces of dielectric layers 266 of dielectric fins 270A, 270B, and sidewall surfaces of dielectric layers 266 of dielectric fins 270A, 270B, such that dummy gate stacks 280 wrap portions of dielectric layers 266 of dielectric fins 270A, 270B in channel regions of multigate device 200. In the Y-Z plane, dummy gate stacks 280 are disposed over top surfaces of respective channel regions of fins 208A, 208B, such that dummy gate stacks 280 interpose respective source/drain regions of fins 208A, 208B. Each dummy gate stack 280 includes a dummy gate dielectric 282, a dummy gate electrode 284, and a hard mask 286 (including, for example, a first mask layer 287 and a second mask layer 288). Dummy gate dielectric 282 includes a dielectric material, such as silicon oxide, a high-k dielectric material, other suitable dielectric material, or combinations thereof. In some embodiments, dummy gate dielectric 282 includes an interfacial layer (including, for example, silicon oxide) and a high-k dielectric layer disposed over the interfacial layer. Dummy gate electrode 284 includes a suitable dummy gate material, such as polysilicon. In some embodiments, dummy gate stacks 280 include numerous other layers, for example, capping layers, interface layers, diffusion layers, barrier layers, or combinations thereof. Dummy gate stacks 280 are formed by deposition processes, lithography processes, etching processes, other suitable processes, or combinations thereof. For example, a first deposition process is performed to form a dummy gate dielectric layer over multigate device 200, a second deposition process is performed to form a dummy gate electrode layer over the dummy gate dielectric layer, and a third deposition process is performed to form a hard mask layer over the dummy gate electrode layer. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the hard mask layer, the dummy gate electrode layer, and the dummy gate dielectric layer to form dummy gate stacks 280, which include dummy gate dielectric 282, dummy gate electrode 284, and hard mask 286 as depicted in FIG. 12. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Figure 13:
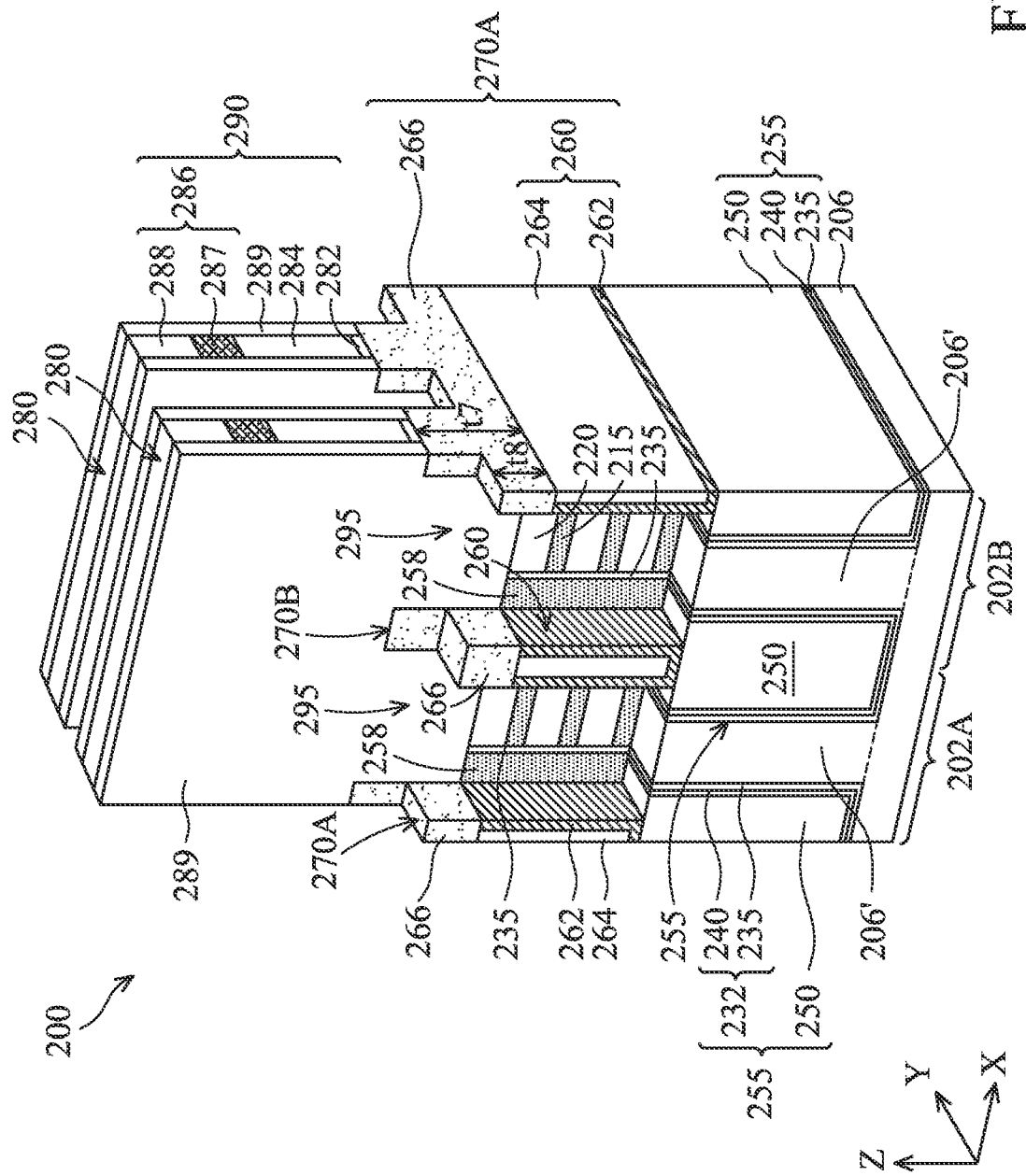

Turning to FIG. 13, gate spacers 289 are formed along sidewalls of dummy gate stacks 280, thereby forming gate structures 290 (which collectively refers to dummy gate stacks 280 and gate spacers 289). In FIG. 13, portions of fins 208A, 208B in source/drain regions of multigate device 200 (i.e., source/drain regions of fins 208A, 208B that are not covered by gate structures 290) are also at least partially removed to form source/drain recesses (trenches) 295. Processing associated with forming gate spacers 289 and/or source/drain recesses 295 reduces a thickness of exposed portions of dielectric layers 266 (e.g., portions of dielectric layers 266 in source/drain regions of multigate device 200) relative to unexposed portions of dielectric layers 266 (e.g., portions of dielectric layers 266 in channel regions of multigate device 200). For example, dielectric layers 266 have a thickness t7, and etching processes implemented to form gate spacers 289 and/or source/drain recesses 295 reduce, intentionally or unintentionally, a thickness of exposed portions of dielectric layers 266 from thickness t7 to a thickness t8. In some embodiments, thickness t7 is about 10 nm to about 30 nm, and thickness t8 is about 0 nm to about 15 nm. Accordingly, portions of dielectric layers 266 disposed in channel regions of multigate device 200 under gate structures 290 (here, dummy gate stacks 280 and gate spacers 289) have thickness t7 while portions of dielectric layers 266 disposed in source/drain regions of multigate device 200 and not disposed under gate structures 290 have thickness t8.

Gate spacers 289 are disposed adjacent to (i.e., along sidewalls of) respective dummy gate stacks 280. Gate spacers 289 are formed by any suitable process and include a dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonnitride). For example, a dielectric layer including silicon and nitrogen, such as a silicon nitride layer, is deposited over multigate device 200 and etched (e.g., anisotropically etched) to form gate spacers 289. In some embodiments, gate spacers 289 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 280. In such embodiments, the various sets of spacers can include materials having different etch rates. For example, a first dielectric layer including silicon and oxygen (e.g., silicon oxide) is deposited and etched to form a first spacer set adjacent to sidewalls of dummy gate stacks 280, and a second dielectric layer including silicon and nitrogen (e.g., silicon nitride) is deposited and etched to form a second spacer set adjacent to the first spacer set.

In the depicted embodiment, an etching process completely removes semiconductor layer stacks 210 in source/drain regions of multigate device 200, thereby exposing fin portions 206' in source/drain regions of multigate device 200. The etching process also completely removes portions of silicon germanium sacrificial layers 258 and dielectric liner 235 that are disposed along sidewalls of semiconductor layer stacks 210 in source/drain regions of multigate device 200. In the depicted embodiment, each source/drain recess 295 thus has a sidewall defined by a respective first one of dielectric fins 270A, a sidewall defined by dielectric fin 270B, and a sidewall (or sidewalls) defined by both remaining portions of semiconductor layer stacks 210 in channel regions of multigate device 200 and remaining portions of silicon germanium sacrificial layers 258 and dielectric liner 235 disposed along sidewalls of the remaining portions of semiconductor layer stacks 210 (which remaining portions are disposed under gate structures 290). Each source/drain recess 295 further has a bottom defined by a respective fin portion 206' and a respective isolation feature 255. In some embodiments, the etching process removes some, but not all, of semiconductor layer stacks 210, such that source/drain recesses 295 have bottoms defined by respective semiconductor layers 215 or semiconductor layer 220. In some embodiments, the etching process further removes some, but not all, of fin portions 206', such that source/drain recesses 295 extend below top surfaces of isolation features 255. The etching process can include a dry etching process, a wet etching process, other suitable etching process, or combinations thereof. In some embodiments, the etching process is a multi-step etch process. For example, the etching process may alternate etchants to separately and alternately remove semiconductor layers 215, semiconductor layers 220, silicon germanium layers 258, and/or dielectric liner 235. In some embodiments, parameters of the etching process are configured to selectively etch semiconductor layer stacks 210 with minimal (to no) etching of gate structures 290 (i.e., dummy gate stacks 280 and gate spacers 289), dielectric fins 270A, 270B, and/or isolation features 260. In some embodiments, a lithography process, such as those described herein, is performed to form a patterned mask layer that covers gate structures 290 and/or dielectric fins 270A, 270B, and the etching process uses the patterned mask layer as an etch mask. In such embodiments, thicknesses of dielectric layers 266 are not reduced in the source/drain regions, such that dielectric layers 266 have thickness t7 is both channel regions and source/drain regions of multigate device 200.

Figure 14:
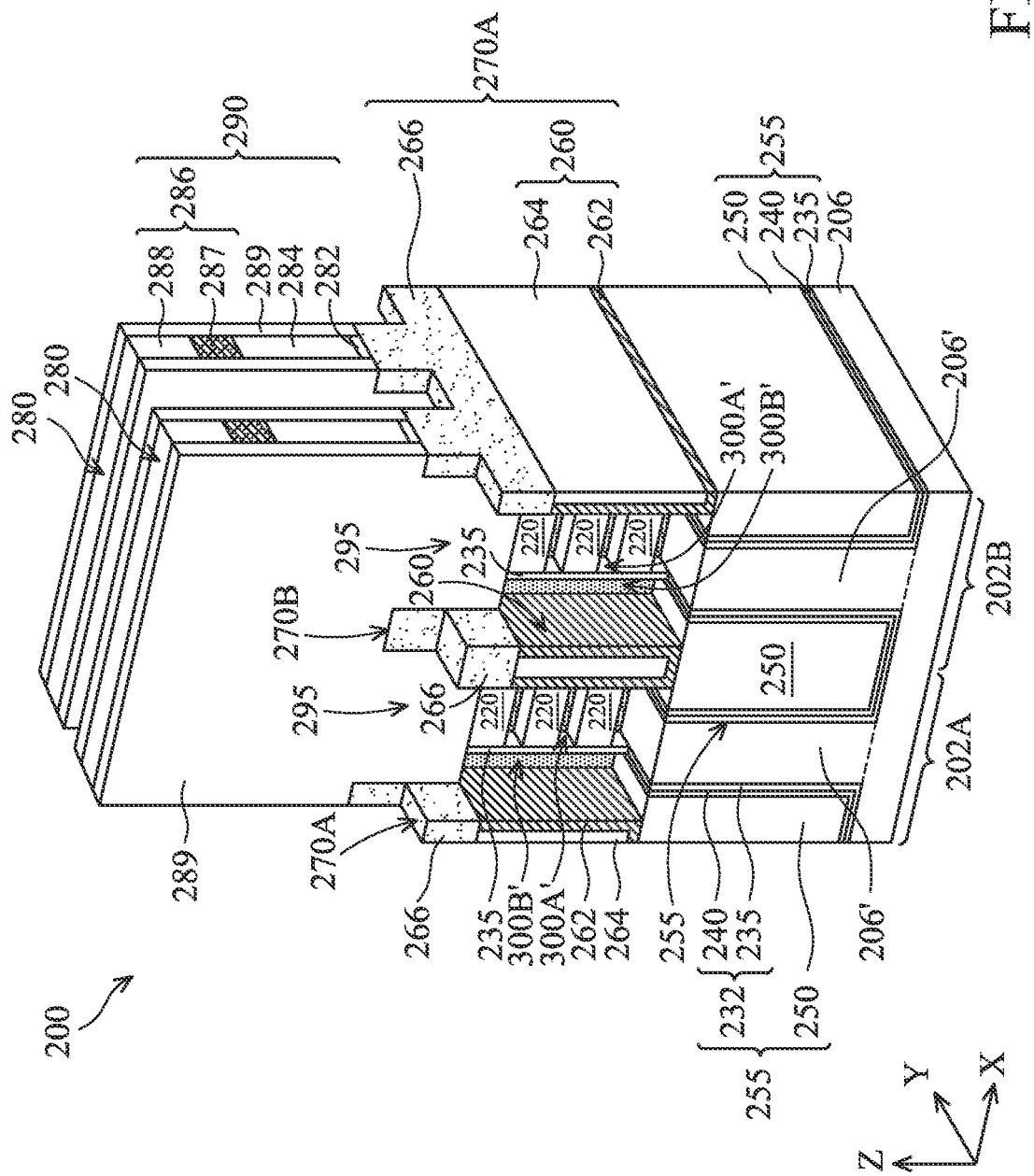
Figure 15:
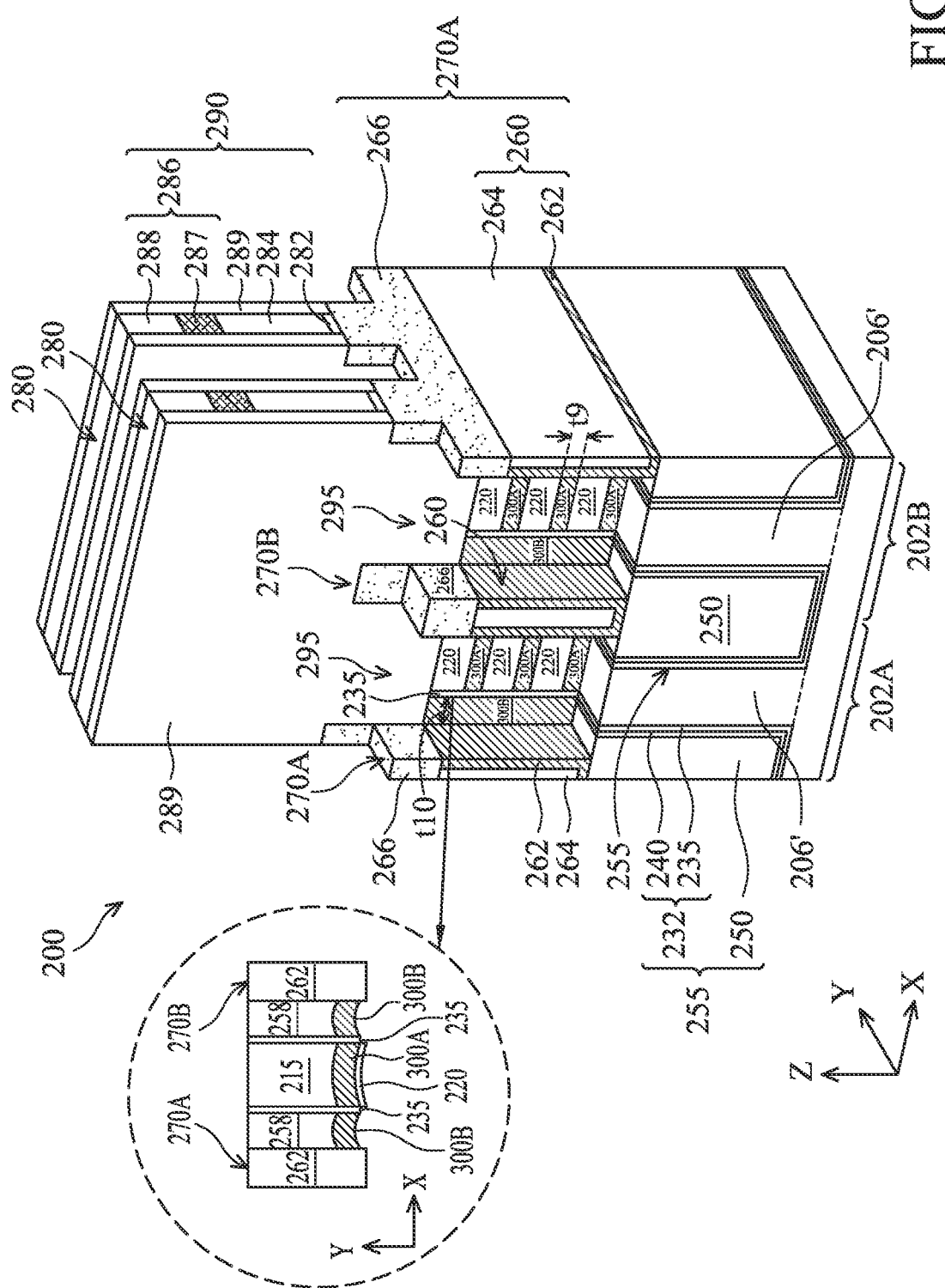

Turning to FIG. 14 and FIG. 15, inner spacers 300A and inner spacers 300B are formed under gate structures 290 (in particular, under gate spacers 289) along sidewalls of semiconductor layers 220 and semiconductor layers 215 under dummy gate stacks 280. Inner spacers 300A separate semiconductor layers 220 from one another and bottommost semiconductor layers 220 from fin portions 206' under gate spacers 289, while inner spacers 300B separate dielectric liners 235, sidewalls of semiconductor layers 220, and sidewalls of semiconductor layers 215 from dielectric fins 270A, 270B under gate spacers 289. In the X-Z plane, under gate spacers 289, dielectric liners 235 extend along and physically contact first sidewalls of semiconductor layers 220 and inner spacers 300A and second sidewalls of semiconductor layers 220 and inner spacers 300A (where top surfaces and bottom surfaces of semiconductor layers 220 and inner spacers 300A extend between the first sidewalls and the second sidewalls), such that dielectric liners 235 separate first sidewalls and second sidewalls of semiconductor layers 220 and inner spacers 300A from inner spacers 300B. In FIG. 14, a first etching process is performed that selectively etches semiconductor layers 215 exposed by source/drain trenches 295 with minimal (to no) etching of semiconductor layers 220, fin portions 206', dielectric liners 235, isolation features 255, dielectric fins 270A, 270B, and gate structures 290, such that gaps 300A' are formed between semiconductor layers 220 and between fin portions 206' and semiconductor layers 220. The first etching process further selectively etches silicon germanium sacrificial layers 258 that are exposed by source/drain trenches 295, such that gaps 300B' are formed between dielectric liners 235 and dielectric fins 270A, 270B. Gaps 300A' and gaps 300B' are disposed under gate spacers 289. Semiconductor layers 220 are thus suspended under gate spacers 289, separated from one another by gaps 300A' and separated from dielectric fins 270A, 270B by dielectric liners 235 and gaps 300B'. In some embodiments, gaps 300A' and/or gaps 300B' extend at least partially under dummy gate stacks 280. The first etching process is configured to laterally etch (e.g., along the y-direction) semiconductor layers 215 and silicon germanium layers 258, thereby reducing a length of semiconductor layers 215 along the y-direction. The first etching process is a dry etching process, a wet etching process, other suitable etching process, or combinations thereof.

In FIG. 15, a deposition process then forms a spacer layer over gate structures 290 and over features defining source/drain recesses 295 (e.g., semiconductor layers 215, semiconductor layers 220, fin portions 206', dielectric fins 270A, 270B, isolation features 255, silicon germanium layers 258, and/or dielectric liners 235), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills source/drain recesses 295. The deposition process is configured to ensure that the spacer layer fills gaps 300A' and gaps 300B'. A second etching process is then performed that selectively etches the spacer layer to form inner spacers 300A, which fill gaps 300A', and inner spacers 300B, which fill gaps 300B', as depicted in FIG. 15 with minimal (to no) etching of semiconductor layers 220, fin portions 206', dielectric liners 235, isolation features 255, dielectric fins 270A, 270B, and gate structures 290. The spacer layer (and thus inner spacers 300A and inner spacers 300B) includes a material that is different than a material of semiconductor layers 220, a material of fin portions 206', a material of isolation features 255, a material of dielectric fins 270A, 270B, and materials of gate structures 290 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that the spacer layer includes a doped dielectric material.

Inner spacers 300A have a thickness t9 defined along the z-direction, a width defined along the x-direction, and a depth defined along the y-direction. Inner spacers 300B have a thickness t10 defined along the x-direction, a width defined along the z-direction, and a depth defined along the y-direction. In some embodiments, thickness t9 is substantially the same as thickness t1 (i.e., thickness of semiconductor layers 215 replaced by inner spacers 300A under gate spacers 289), and thickness t10 is substantially the same as thickness t5 (i.e., thickness of silicon germanium sacrificial layers 258 replaced by inner spacers 300B under gate spacers 289). In the depicted embodiment, process parameters are controlled during fabrication of semiconductor layers 215, silicon germanium sacrificial layers 258, and dielectric liners 235 to ensure that thickness t5 is substantially the same as thickness t1, such that thickness t10 is substantially the same as thickness t9. In other words, inner spacers 300B and inner spacers 300B have the same thickness. In some embodiments, process parameters are controlled during fabrication of semiconductor layers 215, silicon germanium sacrificial layers 258, and dielectric liners 235 to ensure that thickness t5 is greater than thickness t1, such that thickness t10 is greater than thickness t9. In other words, thicknesses of inner spacers 300B re greater than thicknesses of inner spacers 300A. Dielectric liners 235 can improve uniformity and/or control of thicknesses of inner spacers 300B. For example, dielectric liners 235 protect sidewalls of semiconductor layers 220 during inner spacer formation, preventing any etching of semiconductor layers 220 along the x-direction that would increase spacing between semiconductor layers 220 and dielectric fins 270A, 270B and thereby cause thickness t10 to vary along the z-direction. Dielectric liners 235 also improve a profile of inner spacers 300A, providing inner spacers 300A with square-like/rectangular-like profiles (and/or more square-like/rectangular-like profiles) compared to inner spacers formed without dielectric liners 235. For example, in a top view of a portion of multigate device 200 taken along a line that cuts through inner spacers 300A, 300B and dielectric liners 262 of isolation features 270A, 270B along the x-direction, inner spacers 300A have a more uniform thickness along the x-direction compared with inner spacers formed without dielectric liners 235, where a thickness of ends of the inner spacers are less than a thickness of a middle of the inner spacers along the x-direction. A more uniform thickness along the x-direction can enlarge processing windows associated with channel formation (e.g., when semiconductor layers 215 are removed and replaced with metal gates), for example, processing windows implemented to prevent or minimize damage to subsequently formed source/drain features. In some embodiments, inner spacers having square-like/rectangular-like profiles can enlarge source/drain epitaxial damage process windows during channel formation and gain device capacitance. In some embodiments, as depicted, inner spacers 300A are slightly recessed along the y-direction relative to semiconductor layers 220, such that inner spacers 300A do not cover an entirety of top surfaces and/or bottom surfaces of semiconductor layers 220 under gate spacers 298 and one of semiconductor layers 220 can be seen extending from below one of inner spacers 300A. In some embodiments, inner spacers 300A cover an entirety of top surfaces and/or bottom surfaces of semiconductor layers 220 under gate spacers 298. Further, as described above, dielectric liners 235 improve thickness profiles of silicon germanium sacrificial layers 258, which thickness profiles are taken on by inner spacers 300B, which replace silicon germanium sacrificial layers 258. In furtherance of the depicted embodiment, inner spacers 300A are oriented horizontally (having widths along the x-direction) and can be referred to as channel spacers, and inner spacers 300B are oriented vertically (having width along the z-direction) and can be referred to as vertical inner spacers. In some embodiments, widths of inner spacers 300A are substantially the same as widths of semiconductor layers 220, while widths of inner spacers 300B are equal to about a total of a sum of thicknesses of semiconductor layers 220 and a sum of thicknesses of inner spacers 300A, such that inner spacers 300B span and extend along sidewalls of semiconductor layers 220 and inner spacers 300A (e.g., widths of inner spacers 300B=(t1×3)+(t9×3), where each transistor region has three semiconductor layers 220 and three inner spacers 300A). In some embodiments, depths of inner spacers 300A are about the same as depths of inner spacers 300B.

Figure 16:
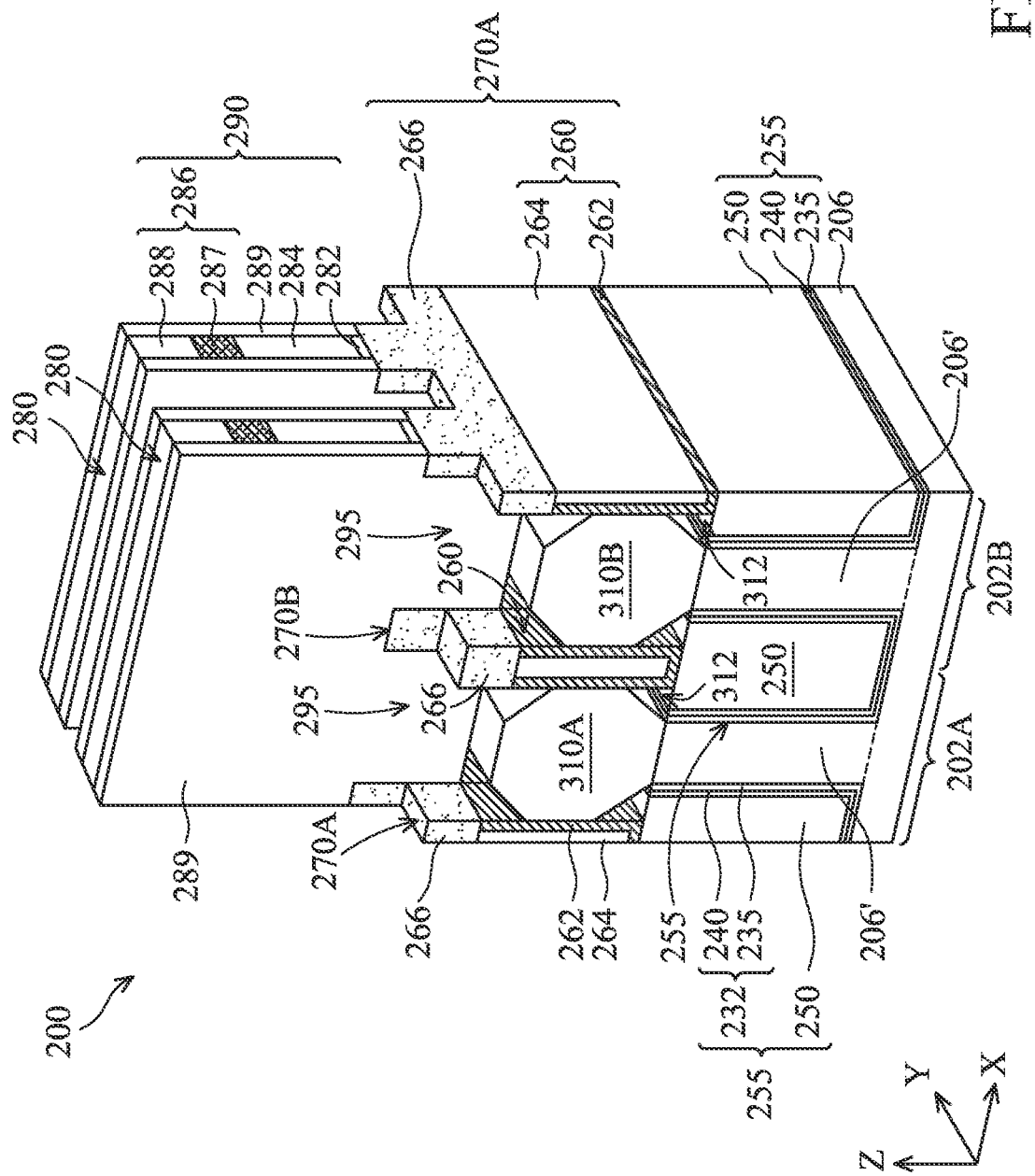

Turning to FIG. 16, epitaxial source/drain features are formed in source/drain recesses 295. For example, a semiconductor material is epitaxially grown from fin portions 206' of substrate 206 and semiconductor layers 220 exposed by source/drain recesses 295, forming epitaxial source/drain features 310A in source/drain recesses 295 in first transistor region 202A and epitaxial source/drain features 310B in source/drain recesses 295 in second transistor region 202B. In some embodiments, because semiconductor material does not grow from dielectric surfaces during an epitaxial growth process used to form epitaxial source/drain features 310A, 310B, air gaps 312 may be formed between epitaxial source/drain features 310A, 310B, dielectric fins 270A, 270B, and isolation features 255. In some embodiments, such as depicted, epitaxial source/drain features 310A, 310B do not completely fill source/drain recesses 295, such that top surfaces of epitaxial source/drain features 310A, 310B are lower than top surfaces of dielectric layers 266 relative to the top surface of substrate 206. In some embodiments, epitaxial source/drain features 310A, 310B completely fill source/drain recesses 295, such that top surfaces of epitaxial source/drain features 310A, 310B are substantially planar with top surfaces of dielectric layers 266 or higher than top surfaces of dielectric layers 266 relative to the top surface of substrate 206. An epitaxy process can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of fin portions 206' and/or semiconductor layers 220. Epitaxial source/drain features 310A, 310B are doped with n-type dopants and/or p-type dopants. In some embodiments, for n-type transistors, epitaxial source/drain features 310A, 310B include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial source/drain features 310A, 310B include silicon germanium or germanium, which can be doped with boron, other p-type dopant, or combinations thereof (for example, forming Si:Ge:B epitaxial source/drain features). In some embodiments, epitaxial source/drain features 310A and/or epitaxial source/drain features 310B include more than one epitaxial semiconductor layer, where the epitaxial semiconductor layers can include the same or different materials and/or dopant concentrations. In some embodiments, epitaxial source/drain features 310A, 310B include materials and/or dopants that achieve desired tensile stress and/or compressive stress in respective channel regions of the n-type transistors and/or the p-type transistors. In some embodiments, epitaxial source/drain features 310A, 310B are doped during deposition by adding impurities to a source material of the epitaxy process (i.e., in-situ). In some embodiments, epitaxial source/drain features 310A, 310B are doped by an ion implantation process subsequent to a deposition process.

In some embodiments, annealing processes (e.g., rapid thermal annealing and/or laser annealing) are performed to activate dopants in epitaxial source/drain features 310A, 310B and/or other source/drain regions (for example, heavily doped source/drain regions and/or lightly doped source/drain (LDD) regions). In some embodiments, epitaxial source/drain features 310A, 310B are formed in separate processing sequences that include, for example, masking second transistor region 202B when forming epitaxial source/drain features 310A in first transistor region 202A and masking first transistor region 202A when forming epitaxial source/drain features 310B in second transistor region 202B.

Figure 17:
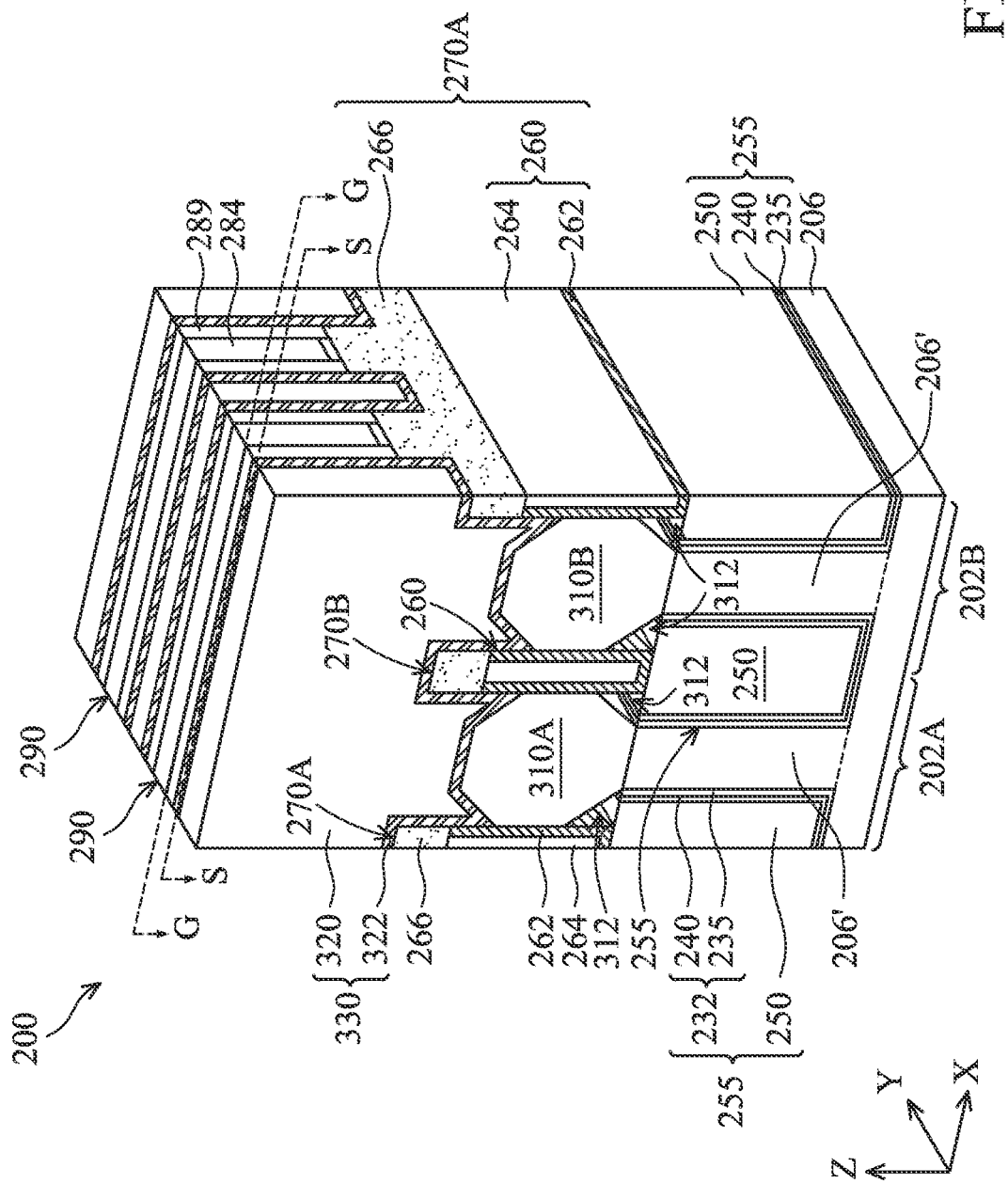

Turning to FIG. 17, a deposition process (such as CVD, PVD, ALD, HDPCVD, MOCVD, RPCVD, PECVD, LPCVD, ALCVD, APCVD, other suitable methods, or combinations thereof) is performed to form an inter-level dielectric (ILD) layer 320 over multigate device 200 and a CMP process and/or other planarization process is performed until reaching (exposing) top portions (or top surfaces) of dummy gate stacks 280. In some embodiments, ILD layer 320 is formed by FCVD, HARP, HDP, or combinations thereof. In some embodiments, such as depicted, the planarization process removes hard mask layers 296 of dummy gate stacks 280 to expose underlying dummy gate electrodes 294 of dummy gate stacks 280, such as polysilicon gate electrodes. ILD layer 320 is disposed over epitaxial source/drain features 310A, 310B and dielectric fins 270A, 270B in source/drain regions of multigate device 200. ILD layer 320 is further disposed between adjacent gate structures 290. ILD layer 320 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, Calif.), xerogel, aerogel, amorphous fluorinated carbon, parylene, BCB-based dielectric material, SiLK (Dow Chemical, Midland, Mich.), polyimide, other suitable dielectric material, or combinations thereof. In some embodiments, ILD layer 320 includes a dielectric material having a dielectric constant that is less than a dielectric constant of silicon dioxide (e.g., k<3.9). In some embodiments, ILD layer 320 includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. ILD layer 320 can include a multilayer structure having multiple dielectric materials. In some embodiments, a contact etch stop layer (CESL) 322 is disposed between ILD layer 320 and epitaxial source/drain features 310A, 310B, dielectric layers 266 (of dielectric fins 270A, 270B), and gate spacers 289. CESL 322 includes a material different than ILD layer 320, such as a dielectric material that is different than the dielectric material of ILD layer 320. For example, where ILD layer 320 includes a dielectric material that includes silicon and oxygen and having a dielectric constant that is less than about the dielectric constant of silicon dioxide, CESL 232 can include silicon and nitrogen, such as silicon nitride or silicon oxynitride.

ILD layer 320 and/or CESL 332 fill a remainder of source/drain recesses 295. In the depicted embodiment, ILD layer 320 and/or CESL 322 are disposed on and physically contact facets of epitaxial source/drain features 310A, 310B that extend from dielectric fins 270A, 270B to top surfaces (facets) of epitaxial source/drain features 310A, 310B, while facets of epitaxial source/drain features 310A, 310B that extend from dielectric fins 270A, 270B to bottom surfaces (facets) of epitaxial source/drain features 310A, 310B (i.e., surfaces disposed on fin portions 206') do not physically contact any dielectric material because of air gaps 312. ILD layer 320 and CESL 322 are a portion of a multilayer interconnect (MLI) feature 330. In some embodiments, ILD layer 320 and CESL 322 form a bottommost layer of MLI feature 330 (e.g., ILD0). MLI feature 330 electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors of multigate device 200), such that the various devices and/or components can operate as specified by design requirements of multigate device 200. MLI feature 330 includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 330. During operation, the interconnect features are configured to route signals between the devices and/or the components of multigate device 200 and/or distribute signals (for example, clock signals, voltage signals, and/or ground signals) to the devices and/or the components of multigate device 200.

Figure 18:
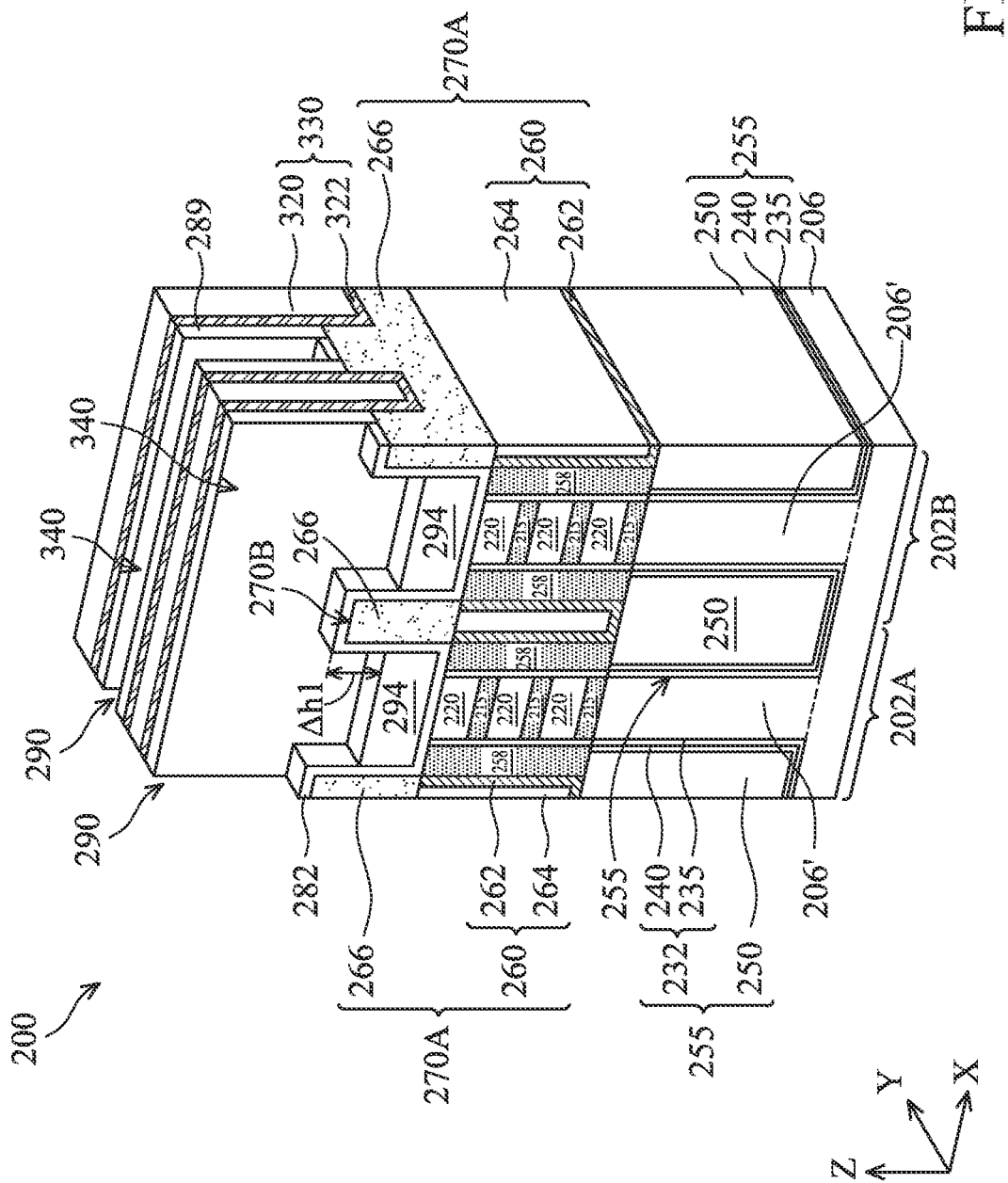

Turning to FIGS. 18-25, a gate replacement process is performed to replace dummy gate stacks 280 with metal gate stacks and a channel release process (see FIG. 22, FIG. 23) is performed to form suspended channel layers in channel regions of multigate device 200, where the metal gate stacks at least partially surround the suspended channel layers. For ease of description and understanding, FIGS. 18-25 are taken (cut) through one of gate structures 290 along line G-G in FIG. 18 (and are thus referred to as metal gate cut perspective views). Turning to FIG. 18, gate openings 340 are formed in gate structures 290 by partially removing dummy gate stacks 280. For example, an etching process is performed that recesses dummy gate electrodes 294 until dielectric layers 266 of dummy fins 270A, 270B are exposed and extend (protrude) from between remaining portions of dummy gate electrodes 294. In FIG. 18, after recessing dummy gate electrodes 294, topmost surfaces of dummy gate electrodes 294 are lower than topmost surfaces of dielectric layers 266 of dielectric fins 270A, 270B relative to top surface of substrate 206. In some embodiments, a height difference $\Delta h1$ between topmost surfaces of dummy gate electrodes 294 and topmost surfaces of dielectric layers 266 in channel regions of multigate device 200 is about 5 nm to about 20 nm. The etching process is configured to selectively remove dummy gate electrodes 294 with respect to ILD layer 320, CESL 322, gate spacers 289, and/or dummy gate dielectrics 292. In other words, the etching process substantially removes dummy gate electrodes 294 but does not remove, or does not substantially remove, ILD layer 320, CESL 322, gate spacers 289, and/or dummy gate dielectrics 292. For example, an etchant is selected for the etch process that etches polysilicon (i.e., dummy gate electrodes 294) at a higher rate than dielectric materials (i.e., ILD layer 320, CESL 322, gate spacers 289, and/or dummy gate dielectrics 292), such as silicon-comprising dielectric materials (i.e., the etchant has a high etch selectivity with respect to polysilicon). In some embodiments, such as depicted, the etching process does not remove dummy gate dielectrics 232, such that dummy gate dielectrics 292 remain covering exposed portions of dielectric layers 266. In some embodiments, the etching process partially or completely removes dummy gate dielectrics 292. The etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement an etch gas that includes HBr and/or $Cl_2$ to achieve selective etching of polysilicon (i.e., dummy gate electrodes 294) with respect to silicon-comprising dielectric materials (i.e., ILD layer 320, CESL 322, gate spacers 289, and/or dummy gate dielectrics 292). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. For example, in some embodiments, a wet etching process can implement a tetramethylammonium hydroxide (TMAH) etch solution to achieve selective etching of polysilicon (i.e., dummy gate electrodes 294) with respect to silicon-comprising dielectric materials (i.e., ILD layer 320, CESL 322, gate spacers 289, and/or dummy gate dielectrics 292). Various parameters of the etch process can be tuned to achieve selective etching of dummy gate electrodes 294, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps. In some embodiments, the etching process uses a patterned mask layer as an etch mask, where the patterned mask layer covers ILD layer 320, CESL 322, and/or gate spacers 289 but has openings therein that expose dummy gate electrodes 294.

Figure 19:
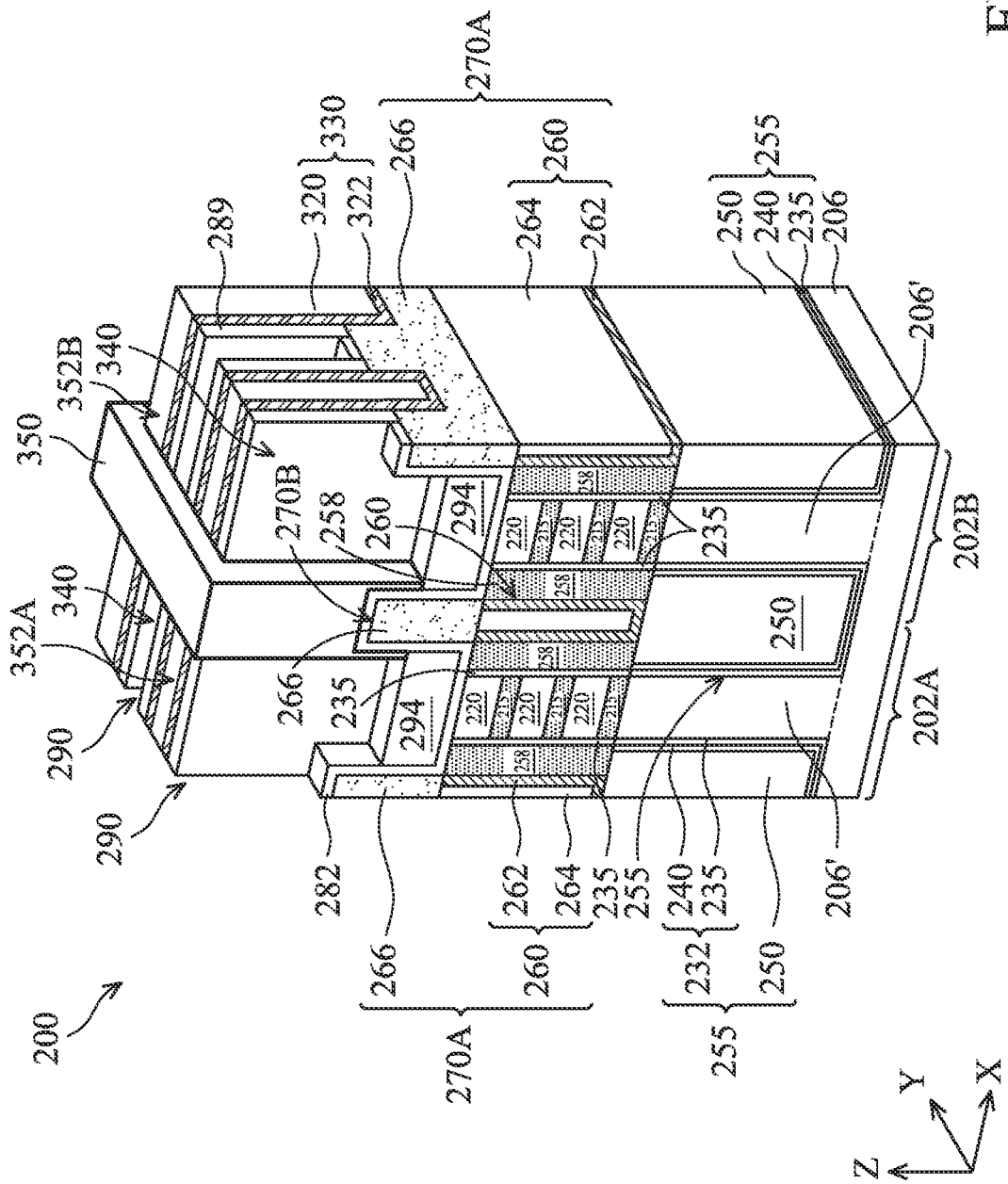
Figure 20:
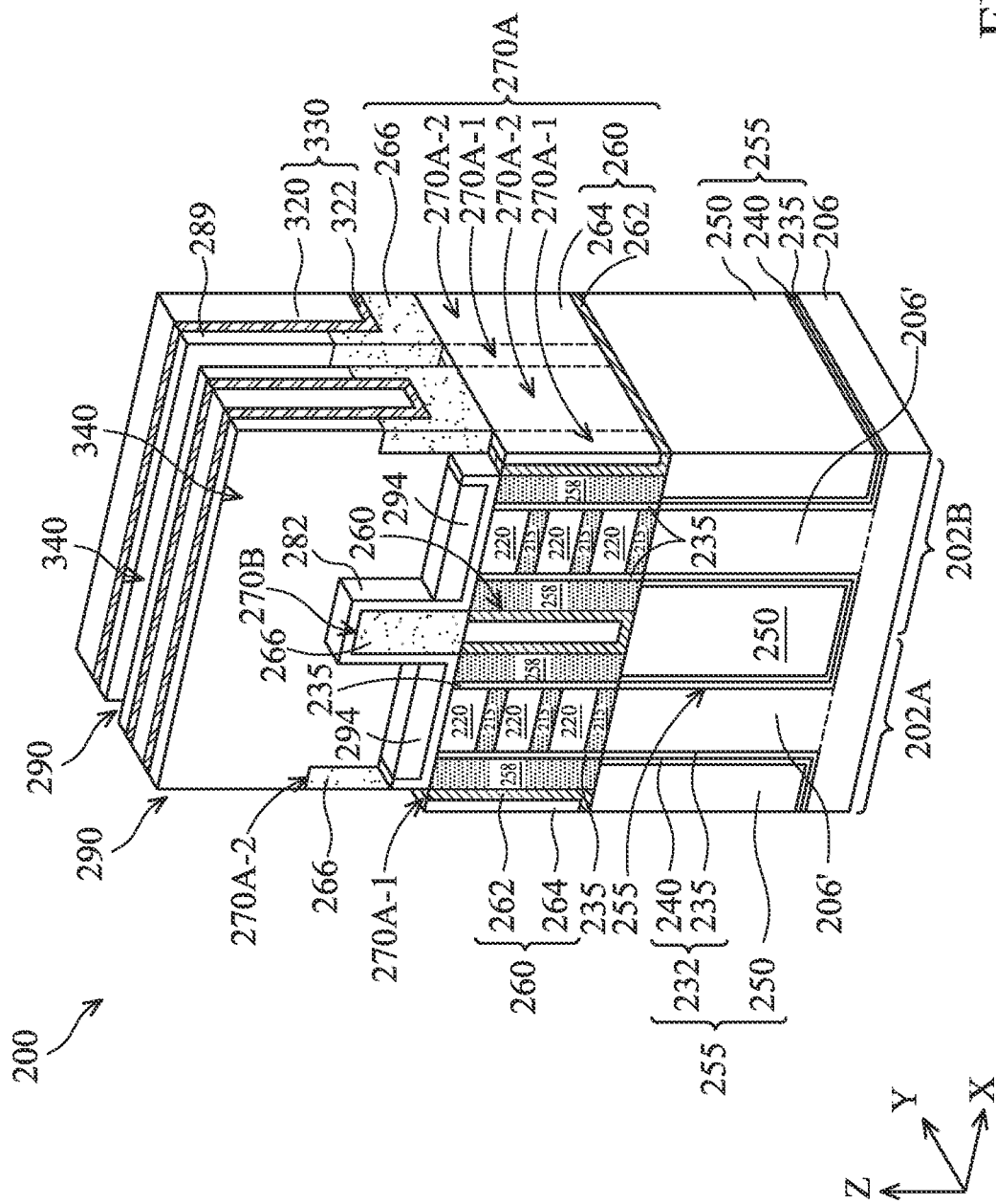

Turning to FIG. 19 and FIG. 20, dielectric layers 266 are removed from dielectric fins 270A in channel regions of multigate device 200. In FIG. 19, a lithography process, such as those described herein, is performed to form a patterned mask layer 350 having an opening 352A and an opening 352B defined therein. In some embodiments, patterned mask layer 350 is a patterned resist layer. Patterned mask layer 350 covers dielectric fins, such as dielectric fin 270B, that span transistor interface regions. For example, patterned mask layer 350 covers the transistor interface region between first transistor region 202A and second transistor region 202B, which includes an interface between first transistor region 202A and second transistor region 202B, a portion of first transistor region 202A adjacent to the interface, and a portion of second transistor region 202B adjacent to the interface. In the depicted embodiment, dielectric fin 270B spans the transistor interface region and thus is covered by patterned mask layer 350. In some embodiments, such as depicted, patterned mask layer 350 covers exposed top surfaces and sidewalls of dielectric fin 270B (including portions of gate dielectrics 232 disposed thereover). In some embodiments, patterned mask layer 350 covers only exposed top surfaces of dielectric fin 270B (including portions of gate dielectrics 232 disposed thereover). Openings 352A, 352B expose dielectric fins that span interface regions between different device features and/or different transistor features within transistor regions, such as dielectric fins 270A. For example, opening 352A exposes leftmost dielectric fin 270A in first transistor region 202A and rightmost dielectric fin 270A in second transistor region 202B. Opening 352A further exposes portions of gate structures 290 in first transistor region 202A and opening 352B further exposes portions of gate structures 290 in second transistor region 202B.

In FIG. 20, an etching process is then performed to remove dielectric layers 266 from the portions of dielectric fins 270A that are disposed in channel regions of multigate device 200, such that dielectric fins 270A have first portions 270A-1 in channel regions of multigate device 200 and second portions 270A-2 in source/drain regions of multigate device 200. First portions 270A-1 include only dielectric feature 260, while second portions 270A-2 include dielectric layer 266 and dielectric feature 260 (i.e., dielectric liner 262 and oxide layer 264. In the depicted embodiment, the etching process selectively etches dielectric layers 266 with minimal (to no) etch of gate spacers 289, ILD layer 320, and/or CESL 322. In other words, the etching process substantially removes dielectric layers 266 but does not remove, or does not substantially remove, gate spacers 289, ILD layer 320, and/or CESL 322. For example, an etchant is selected for the etch process that etches a metal-and-oxygen comprising dielectric material (i.e., dielectric layers 266) at a higher rate than silicon-comprising dielectric materials (i.e., ILD layer 320, CESL 322, and/or gate spacers 289) (i.e., the etchant has a high etch selectivity with respect to metal-and-oxygen comprising dielectric materials). In some embodiments, the etchant has a first etch selectivity between dielectric layers 266 and gate spacers 289, ILD layer 320, and/or CESL 232 and a second etch selectivity between dielectric layers 266 and dummy gate dielectrics 292 and/or dummy gate electrodes 294, where the first etch selectivity is greater than the second etch selectivity. In such embodiments, such as depicted in FIG. 20, the etching process does not remove, or does not substantially remove, gate spacers 289, ILD layer 320, and/or CESL 322, but partially removes dummy gate dielectrics 292 and/or dummy gate electrodes 294. For example, the etching process removes portions of dummy gate dielectrics 292 that cover dielectric layers 266 in openings 352A, 352B and partially removes portions of dummy gate dielectrics 292 and/or dummy gate electrodes 294 that cover fins 208A, 208B, silicon germanium layers 258, and/or dielectric liners 235 in channel regions of multigate device 200. In some embodiments, the etching process partially removes patterned mask layer 350. The etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement a chlorine-comprising etch gas to achieve selective etching of metal-and-oxygen comprising dielectric materials (i.e., dielectric layers 266) with respect to polysilicon (i.e., dummy gate electrodes 294), other dielectric materials (i.e., ILD layer 320, CESL 322, and/or gate spacers 289), and/or resist materials (i.e., patterned mask layer 350). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. Various parameters of the etch process can be tuned to achieve selective etching of dielectric layers 266, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps. Thereafter, patterned mask layer 350, or any remaining portion thereof, is removed from multigate device 200, for example, by a resist stripping process, an etching process, other suitable process, or combination thereof.

Figure 21:
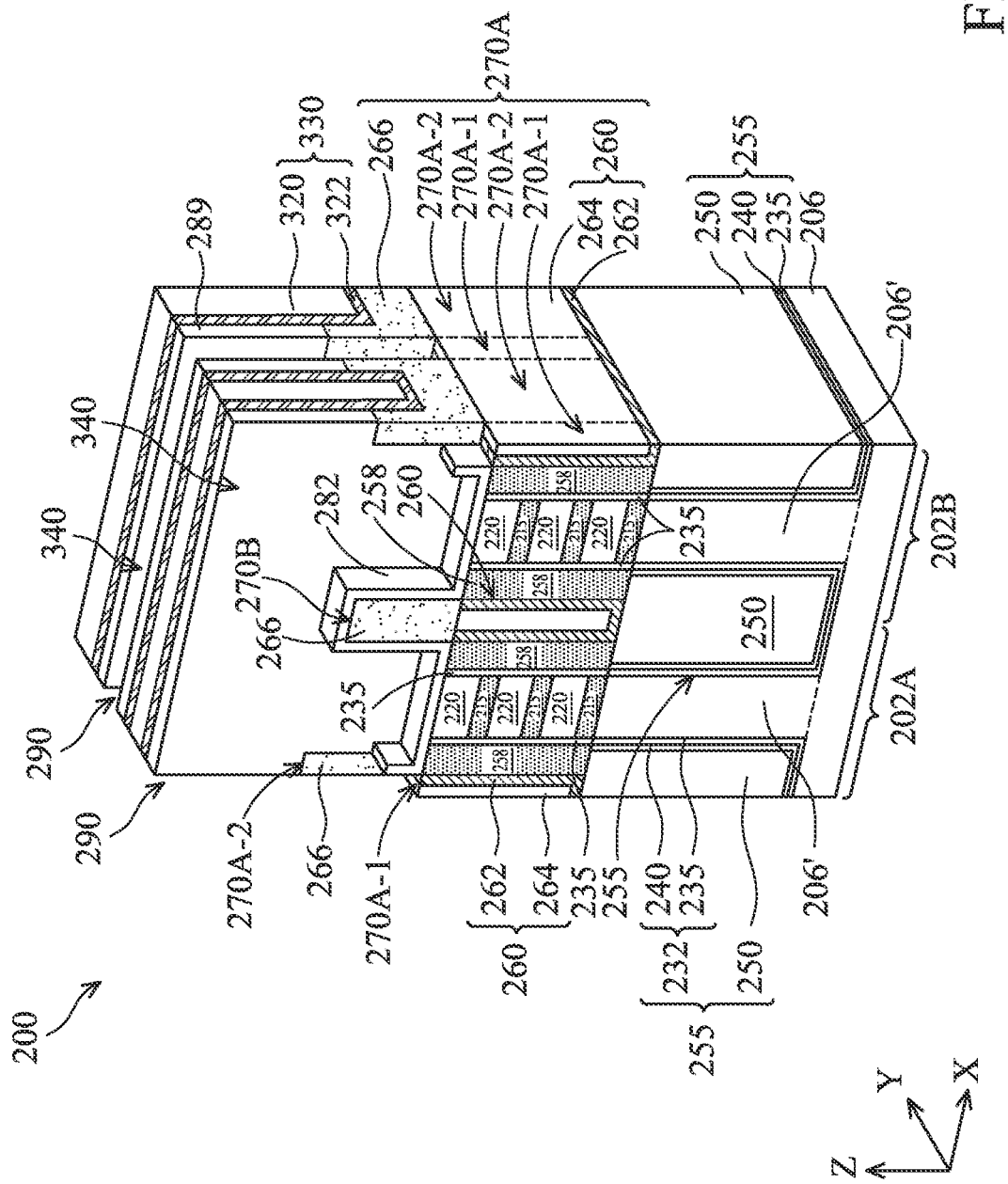

In FIG. 21, a remainder of dummy gate electrodes 294 is removed from gate openings 340. For example, an etching process completely removes dummy gate electrodes 294 to expose semiconductor layer stacks 210. The etching process is similar to the etching process used to partially remove dummy gate electrodes 294 described above with reference to FIG. 18. For example, the etching process is configured to selectively etch dummy gate electrodes 294 with minimal (to no) etching of other features of multigate device 200, such as gate spacers 289, dielectric fins 270A, 270B, ILD layer 320, CESL 322, and/or semiconductor layers 220. In the depicted embodiment, the etching process further selectively etches dummy gate electrodes 294 with minimal (to no) etching of dummy gate dielectrics 292, such that dummy gate dielectrics 292 remain covering semiconductor layers stacks 210 and dielectric layer 266 of dielectric fin 270B in channel regions of multigate device 200. In some embodiments, the etching process is configured to completely or partially remove dummy gate dielectrics 292. The etching process is a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. For example, in some embodiments, a dry etching process can implement an etch gas that includes HBr and/or $Cl_2$ to achieve selective etching of polysilicon (i.e., dummy gate electrodes 294) with respect to silicon-comprising dielectric materials (i.e., ILD layer 320, CESL 322, gate spacers 289, and/or dummy gate dielectrics 292). In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. For example, in some embodiments, a wet etching process can implement a tetramethylammonium hydroxide (TMAH) etch solution to achieve selective etching of polysilicon (i.e., dummy gate electrodes 294) with respect to silicon-comprising dielectric materials (i.e., ILD layer 320, CESL 322, gate spacers 289, and/or dummy gate dielectrics 292). Various parameters of the etch process can be tuned to achieve selective etching of dummy gate electrodes 294, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps. For example, the etching process may alternate etchants to separately remove various layers of dummy gate electrodes 294. In some embodiments, a lithography process, such as those described herein, is performed to form a patterned mask layer that covers ILD layer 320, CESL 322, dielectric fin 270B, and/or gate spacers 289 during the etching process. In some embodiments, the etching process used to remove the remainder of dummy gate electrodes 294 in FIG. 21 is different than the etching process used to partially remove dummy gate electrodes 294 described above with reference to FIG. 18. For example, the etching process used to remove the remainder of dummy gate electrodes 294 is a wet poly etch, while the etching process used to partially remove dummy gate electrodes 294 described above with reference to FIG. 18 is a dry poly etch, or vice versa. In some embodiments, the etching process used to remove the remainder of dummy gate electrodes 294 in FIG. 21 is the same as the etching process used to partially remove dummy gate electrodes 294 described above with reference to FIG. 18. For example, both etching processes are dry poly etches or wet poly etches depending on processing considerations.

Figure 22:
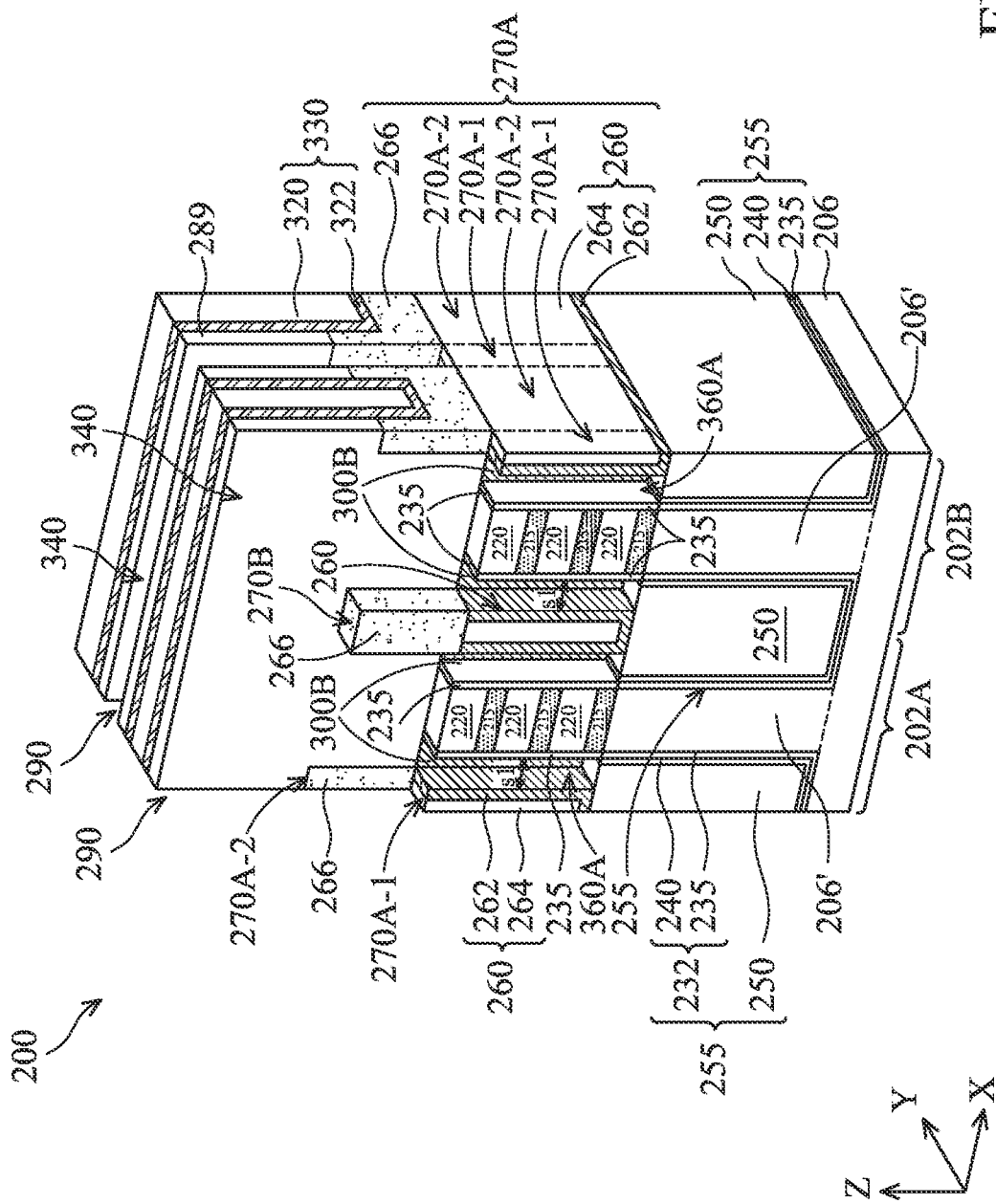
Figure 23:
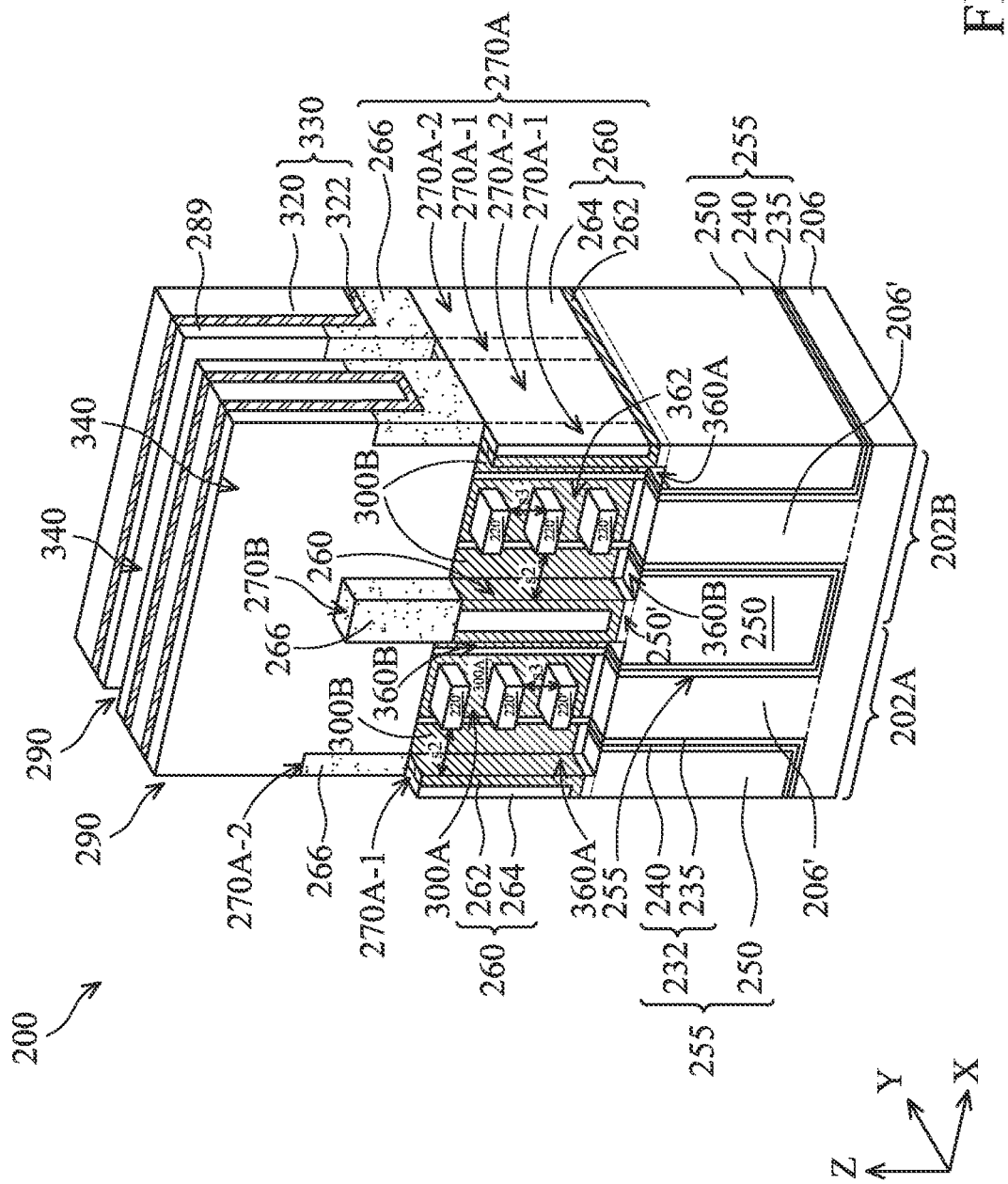

In FIG. 22 and FIG. 23, a two-step channel release process is performed to form channels for transistors within each transistor region of multigate device 200, such as first transistor region 202A and second transistor region 202B. For example, the two-step channel release process includes a first channel etching process for removing silicon germanium sacrificial layers 258 and a second channel etching process for removing semiconductor layers 215. In FIG. 22, silicon germanium sacrificial layers 258 exposed by gate openings 340 are selectively removed from channel regions of multigate device 200 by the first channel etching process, thereby forming gaps 360A that separate first sidewalls of semiconductor layer stacks 210 from first portions 270A-1 of dielectric fins 270A and gaps 360B that separate second sidewalls of semiconductor layer stacks 210 from dielectric fin 270B. The first channel etching process further selectively removes a remainder of dummy gate dielectrics 232 from channel regions of multigate device 200 but does remove dielectric liners 235 from the first sidewalls and the second sidewalls of semiconductor layer stacks 210. Accordingly, a spacing s1 is defined along the x-direction between first portions 270A-1 of dielectric fins 270A and dielectric liners 235 disposed along first sidewalls of semiconductor layer stacks 210 and between dielectric fins 270B and dielectric liners 235 disposed along second sidewalls of semiconductor layer stacks 210. Spacing s1 corresponds with widths along the x-direction of gaps 360A and gaps 360B. In some embodiments, spacing s1 is about equal to thickness t5 of silicon germanium layers 258, though the present disclosure contemplates embodiments where spacing s1 is greater than or less than thickness t5. In some embodiments, spacing s1 is about 4 nm to about 12 nm.

In FIG. 23, semiconductor layers 215 of semiconductor layer stacks 210 exposed by gate openings 340 are selectively removed from channel regions of multigate device 200 by the second channel etching process, thereby forming suspended semiconductor layers 220' separated from one another and/or fin portions 206' by gaps 362. The second channel etching process further selectively removes dielectric liners 235 from the first sidewalls and the second sidewalls of semiconductor layer stacks 210 exposed by gate openings 340, thereby increasing widths of gaps 360A and gaps 360B along the x-direction. For example, spacing s1 of gaps 360A, 360B increases to a spacing s2, where spacing s2 is about equal to a sum of thickness t5 of one of silicon germanium layers 258 and thickness t3 of one of dielectric liners 235 (i.e., s2≈t5+t3). As such, first transistor region 202A and second transistor region 202B each have at least one suspended semiconductor layer 220'. For example, first transistor region 202A and second transistor region 202B each include three suspended semiconductor layers 220' vertically stacked along the z-direction, which will provide three channels through which current can flow between respective epitaxial source/drain features (epitaxial source/drain features 310A or epitaxial source/drain features 310B) during operation of the transistors. Suspended semiconductor layers 220' are thus referred to as channel layers 220' hereinafter. A spacing s3 is defined between channel layers 220' along the z-direction, and spacing s2 is defined between channel layers 220' and dielectric fins 270A, 270B along the x-direction. Spacing s3 correspond with widths of gaps 362. In some embodiments, spacing s3 is about equal to thickness t1 of semiconductor layers 215, though the present disclosure contemplates embodiments where spacing s3 is greater than or less than thickness t1. In some embodiments, each channel layer 220' has nanometer-sized dimensions and can be referred to as "nanostructures," alone or collectively. For example, each channel layer 220' can have a width along the x-direction that is about 10 nm to about 90 nm, a length along the y-direction that is about 8 nm to about 400 nm, and a thickness along the z-direction that is about 4 nm to about 10 nm. In some embodiments, thicknesses of channel layers 220' is substantially the same as thickness t2. The present disclosure further contemplates embodiments channel layers 220' having sub-nanometer dimensions. In some embodiments, channel layers 220' have cylindrical-shaped profiles (e.g., nanowires), rectangular-shaped profiles (e.g., nanobars), sheet-shaped profiles (e.g., nanosheets (i.e., dimensions in the X-Y plane are greater than dimensions in the X-Z plane and the Y-Z plane to form sheet-like structures)), or any other suitable shaped profile.

The two-step channel release process implements separate etching steps for removing silicon germanium sacrificial layers 258 (FIG. 22) and semiconductor layers 215 (FIG. 23). It has been observed that such process minimizes any unintentional etching (and thus loss) of semiconductor layers 220 during channel release, thereby improving profile uniformity of channel layers 220'. For example, after the two-step channel release process, channel layers 220' have substantially the same thicknesses along the z-direction, widths along the x-direction, and lengths along the y-direction. Dielectric liners 235 can further improve profile uniformity of channel layers 220'. For example, dielectric liners 235 protect sidewalls of semiconductor layers 220 during removal of silicon germanium sacrificial layers 258 and semiconductor layers 215, preventing and/or limiting etching of semiconductor layers 220 along the x-direction that would reduce widths of semiconductor layers 220 along the x-direction and thereby cause width differences between channel layers 220' (for example, where one of semiconductor layers 220 is etched more along the x-direction than another one of semiconductor layers 220) and/or widths of channel layers 220' are less than target widths desired for the transistors of multigate device 200. Inserting dielectric liners 235 into fabrication also enlarges processing windows, such as an etch process window for the second channel etching process and/or a metal gap fill window for subsequently filling gate openings 340 with metal gates. For example, removing dielectric liners 235 increases spacing s1 to spacing s2, providing wider spaces between channel layers 220' and dielectric fins 270A, 270B than conventional fabrication processes for filling with metal gates. The wider spaces between channel layers 220' and dielectric fins 270A, 270B can reduce and/or prevent metal gap fill issues, such as voids forming within metal gates.

The first channel etching process and the second channel etching process are each configured to selectively etch silicon germanium sacrificial layers 258 and semiconductor layers 215, respectively, with minimal (to no) etching of semiconductor layers 220, fin portions 206', isolation features 255, dielectric fins 270A, dielectric fin 270B, gate spacers 289, inner spacers 300A, inner spacers 300B, ILD layer 320, and/or CESL 322. In some embodiments, an etchant is selected for the etch process that etches silicon germanium (i.e., silicon germanium sacrificial layers 258 semiconductor layers 215) at a higher rate than silicon (i.e., semiconductor layers 220 and fin portions 206') and dielectric materials (i.e., isolation features 255, dielectric fins 270A, dielectric fins 270B, gate spacers 289, inner spacers 300A, inner spacers 300B, ILD layer 320, and/or CESL 322) (i.e., the etchant has a high etch selectivity with respect to silicon germanium). In some embodiments, the etchant of the first channel etching process has a first etch selectivity between silicon germanium sacrificial layers 258 and isolation features 255, dielectric fins 270A, dielectric fins 270B, gate spacers 289, inner spacers 300A, inner spacers 300B, ILD layer 320, and/or CESL 322 and a second etch selectivity between silicon germanium sacrificial layers 258 and dummy gate dielectrics 292, where the first etch selectivity is greater than the second etch selectivity. In such embodiments, such as depicted in FIG. 22, the first channel etching process thus does not remove, or does not substantially remove, isolation features 255, dielectric fins 270A, dielectric fins 270B, gate spacers 289, inner spacers 300A, inner spacers 300B, ILD layer 320, and/or CESL 322, but removes dummy gate dielectrics 292. In some embodiments, the etchant of the second channel etching process has a first etch selectivity between semiconductor layers 215 and isolation features 255, dielectric fins 270A, dielectric fins 270B, gate spacers 289, inner spacers 300A, inner spacers 300B, ILD layer 320, and/or CESL 322 and a second etch selectivity between semiconductor layers 215 and dielectric liners 235, where the first etch selectivity is greater than the second etch selectivity. In such embodiments, such as depicted in FIG. 23, the second channel etching process thus does not remove, or does not substantially remove, isolation features 255, dielectric fins 270A, dielectric fins 270B, gate spacers 289, inner spacers 300A, inner spacers 300B, ILD layer 320, and/or CESL 322, but removes dielectric liners 235. In some embodiments, the first channel etching process and/or the second channel etching process partially, but minimally, etches semiconductor layers 220, fin portions 206', and/or isolation features 255. For example, in FIG. 23, the second channel etching process slightly recesses fin portions 206', such that topmost surfaces of fin portions 206' in channel regions of multigate device 200 are lower than topmost surfaces of fin portions 206' in source/drain regions of multigate device 200 relative to a top surface of substrate 206. In furtherance of the example, in FIG. 23, the second channel etching process also slightly recesses portions of isolation features 255 that are exposed by gate openings 340, such as dielectric liners 235 and portions of oxide material 250 not covered by dielectric fins 270A, 270B. The second channel etching process does not recess portions of oxide material 250 disposed under dielectric fins 270A, 270B, such that isolation features 255 have oxide extensions 250' in channel regions of multigate device 200. In such embodiments, topmost surface of fin portions 206' in channel regions of multigate device 200 are lower than topmost surfaces of oxide extensions 250' of isolation features 255 relative to the top surface of substrate 206. In some embodiments, topmost surfaces of recessed portions of isolation features 260 (i.e., dielectric liners 235 and oxide material 250) are substantially planar with topmost surfaces of fin portions 206' in channel regions of multigate device 200.

Each of the first channel etching process and the second channel etching process is a dry etching process, a wet etching process, or a combination thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$, $H_2O_2$, $NH_4OH$, HCl, HF, DHF, $HNO_3$, $H_3PO_4$, $H_2O$ (which can be DIW or $DIWO_3$), $O_3$, other suitable chemicals, or combinations thereof. Various parameters of the etch process can be tuned to achieve selective etching of silicon germanium sacrificial layers 258 and/or semiconductor layers 215, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, a dry etching process (such as an RIE process) utilizes a fluorine-containing gas (for example, $SF_6$) to selectively etch semiconductor layers 215 and silicon germanium sacrificial layers 258. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes $NH_4OH$ and $H_2O$ to selectively etch semiconductor layers 215 and silicon germanium sacrificial layers 258. In some embodiments, a chemical vapor phase etching process using HCl selectively semiconductor layers 215 and silicon germanium sacrificial layers 258. In some embodiments, before performing the first channel etching process and/or the second channel etching process, an oxidation process can be implemented to convert semiconductor layers 215 and silicon germanium sacrificial layers 258 into silicon germanium oxide features, where the first channel etching process and/or the second channel etching process then remove silicon germanium oxide features. In some embodiments, the etch process includes multiple steps. In some embodiments, the etching process uses a patterned mask layer as an etch mask, where the patterned mask layer covers ILD layer 320, CESL 322, and/or gate spacers 289 but has openings therein that expose channel regions of multigate device 200. In some embodiments, after removing silicon germanium sacrificial layers 258, semiconductor layers 215, and dielectric liners 235, an etching process is performed to modify a profile of channel layers 220' to achieve desired dimensions and/or desired shapes.

Figure 24:
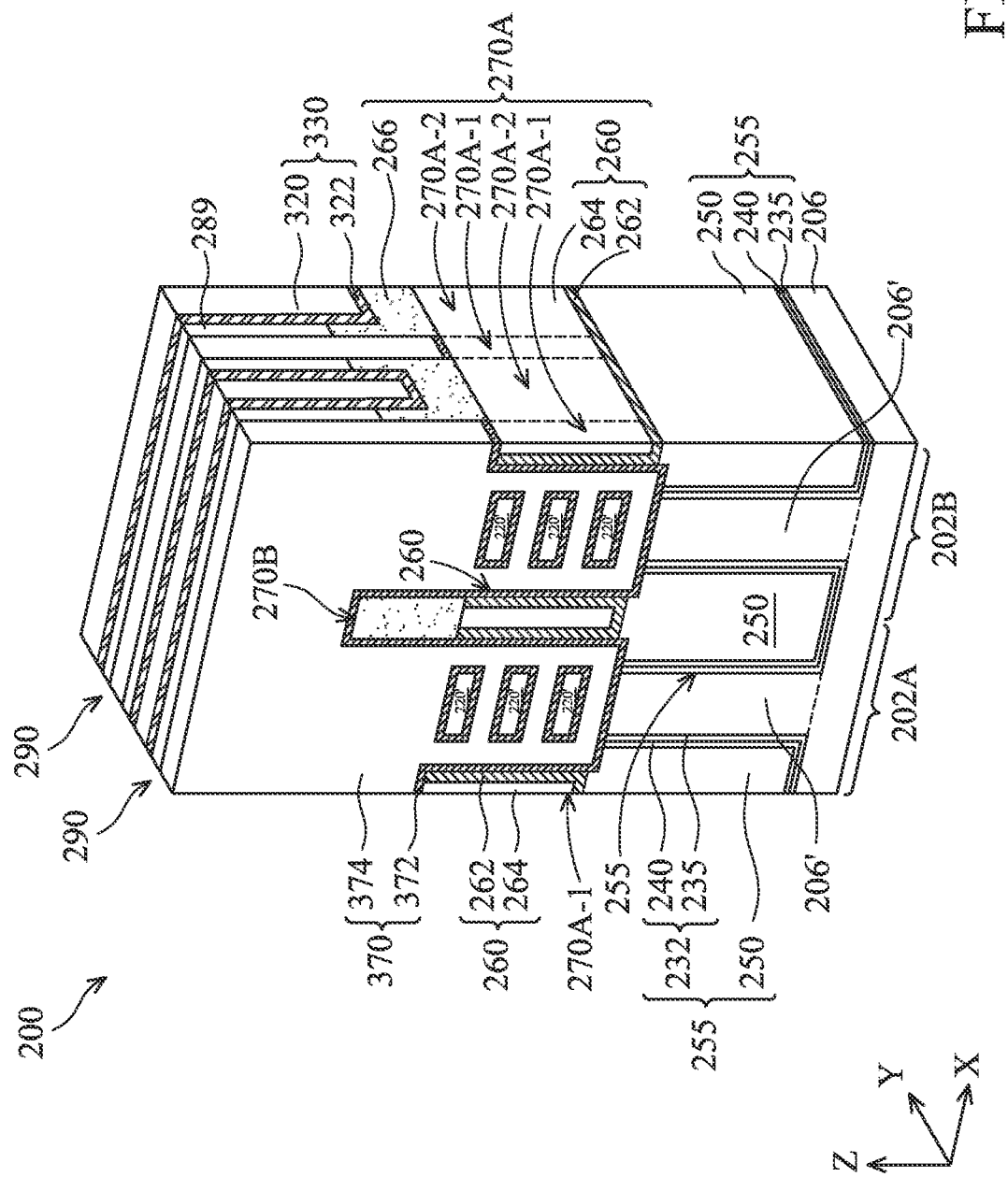

Turning to FIG. 24, metal gate stacks 370 (also referred to as metal gates and/or high-k/metal gates) are formed in gate openings 340. Metal gate stacks 370 are configured to achieve desired functionality according to design requirements of multigate device 200. Metal gate stacks 370 each include a gate dielectric 372 (for example, a gate dielectric layer) and a gate electrode 374 (for example, a work function layer and a bulk conductive layer). Metal gate stacks 370 may include numerous other layers, such as capping layers, interface layers, diffusion layers, barrier layers, hard mask layers, or combinations thereof. In some embodiments, forming metal gate stacks 370 includes depositing a gate dielectric layer over multigate device 200, where the gate dielectric layer partially fills gate openings 340, depositing a gate electrode layer over the gate electrode layer, where the gate electrode layer fills a remainder of gate openings 340, and performing a planarization process to remove excess gate materials from multigate 200. For example, a CMP process is performed until a top surface of ILD layer 320 is reached (exposed), such that top surfaces of gate structures 290 are substantially planar with a top surface of ILD layer 320 after the CMP process. Gate dielectric 372 and gate electrode 374 each extend uninterrupted from first transistor region 202A to second transistor region 202B. Since metal gate stacks 370 span first transistor region 202A and second transistor region 202B, metal gate stacks 370 may have different layers in regions corresponding with first transistor region 202A and second transistor region 202B. For example, a number, configuration, and/or materials of layers of gate dielectrics 372 and/or gate electrodes 374 corresponding with second transistor region 202B may be different than a number, configuration, and/or materials of layers of gate dielectrics 372 and/or gate electrodes 374 corresponding with first transistor region 202A.

Gate dielectrics 372 partially fill gate openings 340 and wrap respective channel layers 220', such that gate dielectrics 372 partially fill gaps 360 and gaps 362. In the depicted embodiment, gate dielectrics 372 cover exposed surfaces of channel layers 220', such that gate dielectrics 372 are disposed along top surfaces, bottom surfaces, and sidewalls of channel layers 220'. For example, gate dielectrics 372 surround channel layers 220', such that each channel layer 220' is wrapped and/or surrounded by a respective gate dielectric 372. In some embodiments, gate dielectrics 372 are further disposed over fin portions 206', isolation features 255, first portions 270A-1 of dielectric fins 270A, and dielectric fins 270B in channel regions of multigate device 200. In the depicted embodiment, each gate opening 340 is partially filled with a respective gate dielectric 372 that is disposed over fin portions 206', isolation features 255, first portions 270A-1 of dielectric fins 270A, and dielectric fins 270B, extending uninterrupted from first transistor region 202A to second transistor region 202B. Gate dielectrics 372 include a high-k dielectric layer, which includes a high-k dielectric material, which for purposes of metal gate stacks 370 refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectrics 372 include an interfacial layer disposed between the high-k dielectric layer and channel layers 220'. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes exposed surfaces of channel layers 220' to hydrofluoric acid. In some embodiments, the interfacial layer is formed by a thermal oxidation process that exposes the exposed surfaces of channel layers 220' to an oxygen and/or air ambient. In some embodiments, the interfacial layer is formed after forming the high-k dielectric layer. For example, in some embodiments, after forming the high-k dielectric layer, multigate device 200 may be annealed in an oxygen and/or nitrogen ambient (e.g., nitrous oxide).

Gate electrodes 374 are formed over gate dielectrics 372, filling a remainder of gate openings 340 and wrapping respective channel layers 220', such that gate electrodes 284 fill a remainder of gaps 360 and gaps 362. In the depicted embodiment, gate electrodes 374 are disposed along top surfaces, bottom surfaces, and sidewalls of channel layers 220'. For example, gate electrodes 374 surround channel layers 220'. In some embodiments, gate electrodes 374 are further disposed over fin portions 206', isolation features 255, first portions 270A-1 of dielectric fins 270A, and dielectric fins 270B in channel regions of multigate device 200. Gate electrodes 374 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes 374 include a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrodes 284 are formed by any of the processes described herein, such as ALD, CVD, PVD, plating, other suitable process, or combinations thereof.

Figure 25:
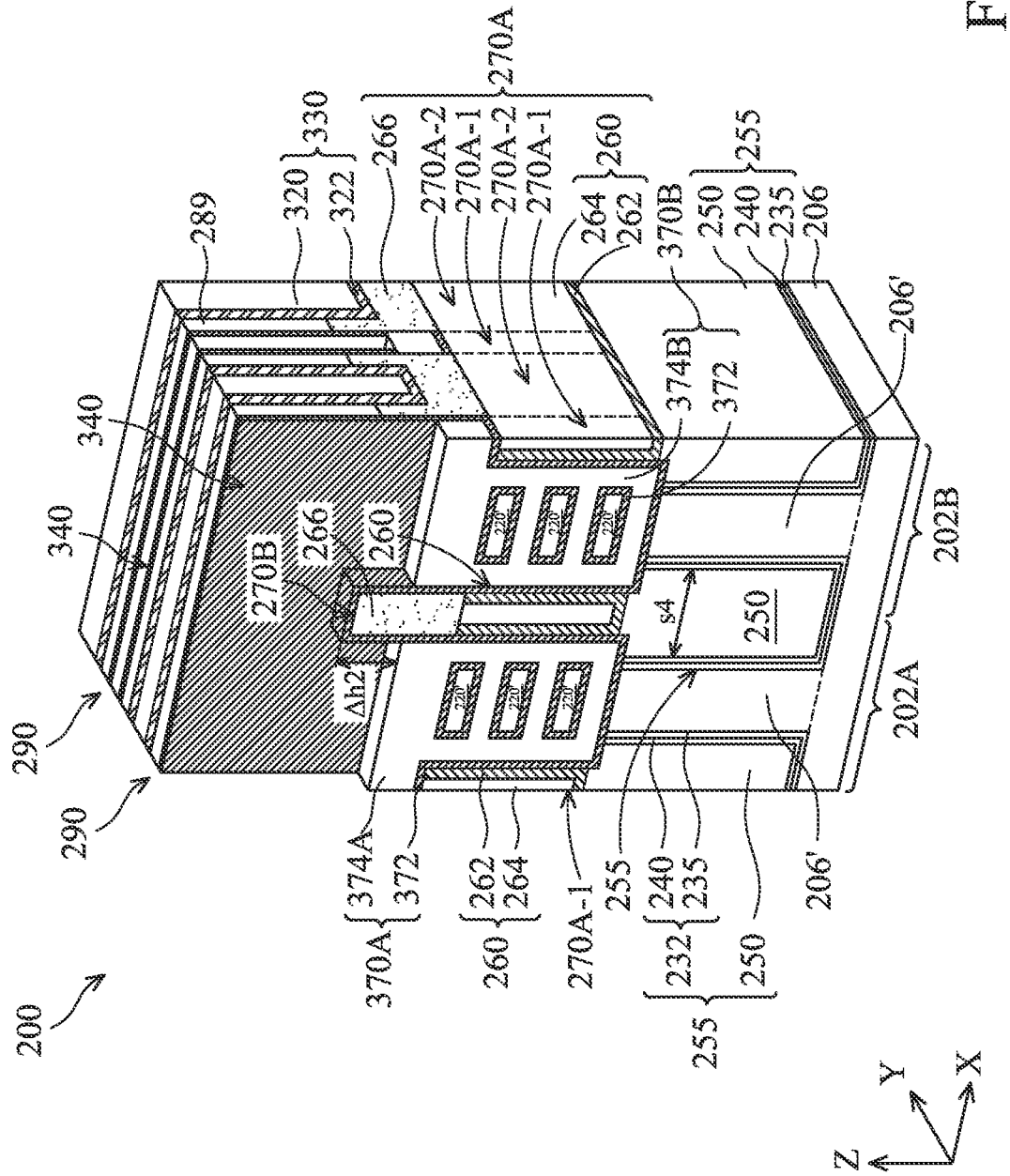
Figure 26:
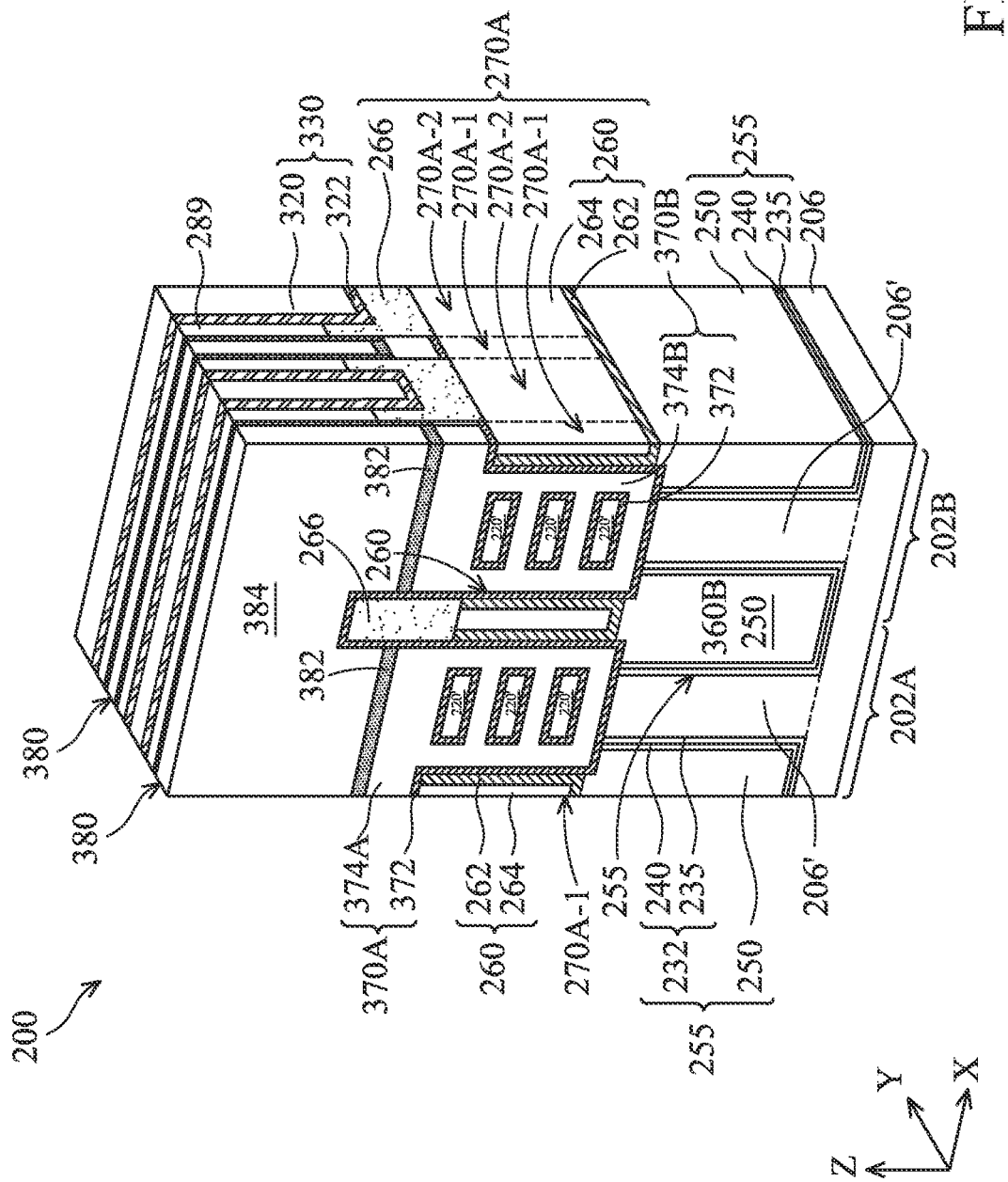

Turning to FIG. 25, a self-aligned metal gate cut process is performed that removes portions of metal gate stacks 370 to form metal gates 370A in first transistor region 202A and metal gates 370B in second transistor region 202B, where dielectric fin 270B separates and isolates metal gates 370A from metal gates 370B. For example, an etch back process is performed to recess gate electrodes 374 until top surface of dielectric fin 270B is free of gate electrodes 374 (i.e., gate electrodes 374 are not disposed over and do not extend over top surface of dielectric fin 270B). The etch back process reopens gate openings 340. After the etch back process, gate electrodes 374 no longer extend uninterrupted from first transistor region 202A to second transistor region 202B, thereby forming gate electrodes 374A in first transistor region 202A and gate electrodes 374B in second transistor region 202B, where dielectric fin 270B separates gate electrodes 374A and gate electrodes 374B from one another. Further, after the etch back process, gate electrodes 374A, 374B remain and extend over dielectric fins 270A (in particular, first portions 270A-1 of dielectric fins 270A). In the depicted embodiment, top surfaces of gate electrodes 374A, 374B are lower than top surface of dielectric fin 270B and higher than top surfaces of dielectric fins 270A relative to a top surface of substrate 206. For example, a height difference Δh2 between topmost surfaces of gate electrodes 374A, 374B and topmost surface of dielectric fin 270B (e.g., topmost surface of dielectric layer 266) is about 5 nm to about 20 nm. In some embodiments, top surfaces of gate electrodes 374A, 374B are substantially planar with top surface of dielectric fin 270B. In some embodiments, top surfaces of gate electrodes 374A, 374B are substantially planar with top surfaces of dielectric fins 270A. In the furtherance of the depicted embodiment, the etch back process does not, or minimally, etches gate dielectrics 372, such that gate dielectrics 372 still extend uninterrupted from first transistor region 202A to second transistor region 202B and further remain, completely or partially depending on etching amount, along sidewalls of gate spacers 289. Accordingly, metal gates 370A include respective portions of respective gate dielectrics 372 and respective gate electrodes 374A, and metal gates 370B include respective portions of respective gate dielectrics 372 and respective gate electrodes 374B.

The metal gate cut process is referred to as "self-aligned" because gate isolation structures (here, dielectric fins 270B) are aligned between metal gates 370A and metal gates 370B without having to perform a lithography process after forming metal gate stacks 370. The self-aligned placement of the gate isolation structures provides electrical isolation between different devices, such as transistors, of multigate device 200. The self-aligned placement of the gate isolation structures allows for higher packing density without negatively affecting operation of closely spaced devices in a high-density IC. For example, a spacing S4 between an active region (e.g., fin portion 206') of first transistor region 202A and an active region (e.g., fin portion 206') of second transistor region 202B can be smaller than spacings required between active regions of adjacent transistor regions when non-self-aligned metal gate cut techniques are implemented for providing gate isolation, which techniques often require a lithography process to form the gate isolation structures. In some embodiments, spacing S4 is about 20 nm to about 50 nm. Smaller spacings between active regions are possible because the proposed self-aligned metal gate cut technique does not suffer from overlay issues associated with non-self-aligned metal gate cut techniques. Smaller spacings between active regions can thus be implemented without risking unintentional damage to channel layers 220', metal gates 370A, and/or metal gates 370B, which damage can arise from process variations inherent in non-self-aligned metal gate cut techniques. Different embodiments may have different advantages, and no particular advantage is necessarily required of any embodiment.

The etch back process is configured to selectively remove gate electrodes 374 with respect to gate dielectrics 232, gate spacers 289, ILD layer 320, CESL 322, and/or dielectric layer 266. In other words, the etch back process substantially removes gate electrodes 374 but does not remove, or does not substantially remove, gate dielectrics 232, gate spacers 289, ILD layer 320, CESL 322, and/or dielectric layer 266. For example, an etchant is selected for the etch process that etches metal materials (e.g., gate electrodes 374) at a higher rate than dielectric materials (e.g., gate spacers 289, ILD layer 320, CESL 322, dielectric layer 266, and/or gate dielectrics 232) (i.e., the etchant has a high etch selectivity with respect to metal materials). The etch back process is a dry etching process, a wet etching process, other suitable etching process, or combinations thereof. In some embodiments, the etch back process is a wet etching process that implements a wet etchant solution that removes metal materials without substantially removing dielectric materials. For example, the wet etchant solution includes $NH_4OH$, $H_2O_2$, and $H_2O$. In some embodiments, the wet etchant solution includes DHF, KOH, $NH_4OH$, $H_2O_2$, $NH_3$, HF, $HNO_3$, $H_2SO_4$, $H_3PO_4$, HCl, $CH_3COOH$, $H_2O$ (which can be DIW or $DIWO_3$), $O_3$, other suitable wet etchant solution constituents, or combinations thereof. In some embodiments, the etch back process is a dry etching process that implements a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. Various parameters of the etch process can be tuned to achieve selective etching of gate electrodes 274, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch back process includes multiple steps (for example, each step is configured to etch a particular layer of gate electrodes 374).

Fabrication can then proceed with forming various contacts, such as gate contacts and source/drain contacts to facilitate operation of transistors of multigate device 200. Turning to FIG. 26, gate contacts 380 are formed to metal gates 370A, 370B. Gate contacts 380 fill a remainder of gate openings 340, such that gate contacts 380 are disposed between gate spacers 289 of gate structures 290. Gate contacts 380 extend uninterrupted from first transistor region 202A to second transistor region 202B. Gate contacts 290 thus extend over top surfaces of dielectric fin 270B. In the depicted embodiment, gate dielectrics 372 separate gate contacts 290 from dielectric fin 270B. The present disclosure contemplates embodiments where gate contacts 290 directly, physically contact dielectric fin 270B (in particular, dielectric layers 266), for example, in embodiments where gate dielectrics 372 are removed from top surfaces of dielectric fin 270B during the etch back process in FIG. 25. Gate contacts 290 include contact seed layers 382 and a contact bulk layer 384 disposed over contact seed layers 382. Contact seed layers 382 are disposed between ILD layer 320 and/or CESL 322 along the x-direction and between gate spacers 289 along the y-direction. Contact seed layers 382 are also disposed on and physically contact respective top surfaces of gate electrodes 374A, 374B. Contact bulk layer 384 has first portions disposed between dielectric fin 270B and ILD layer 320 and/or CESL 322 along the x-direction and a second portion disposed over the first portions and between ILD layer 320 and/or CESL 322 along the x-direction. Contact bulk layer 384 is also disposed between gate spacers 289 along the y-direction and physically contacts contact seed layers 382. Contact bulk layer 294 further extends uninterrupted from first transistor region 202A to second transistor region 202B. Contact seed layer 382 and contact bulk layer 384 each include tungsten, ruthenium, cobalt, copper, aluminum, iridium, palladium, platinum, nickel, low resistivity metal constituent, alloys thereof, or combinations thereof. In the depicted embodiment, contact seed layers 382 and contact bulk layer 384 include tungsten, ruthenium, and/or cobalt. For example, contact seed layers 382 are tungsten seed layers, and contact bulk layer 384 is a tungsten bulk layer.

In some embodiments, gate contacts 290 are formed by performing a first deposition process to form a contact seed material over gate electrodes 374A, 374B that partially fills gate openings 340 and performing a second deposition process to form a contact bulk material over the contact barrier material, where the contact bulk material fills a remainder of gate openings. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In the depicted embodiment, contact seed layers 382 are formed by a selective, bottom-up deposition process (for example, selective CVD), and contact bulk layer 384 is formed by a blanket deposition process (for example, blanket CVD). In such embodiments, contact seed material grows from gate electrodes 374A, 374B and contact seed material grown from gate electrode 374A does not merge or connect with contact seed material grown from gate electrode 374B, such that each of metal gates 370A, 370B has a respective contact seed layer 382 formed thereover. In furtherance of such embodiments, after the blanket deposition process, contact bulk layer 294 is disposed over contact seed layers 382 and top surfaces of ILD layer 320, CESL 322, and/or gate spacers 289. A CMP process and/or other planarization process is performed to remove excess contact bulk material, for example, from over the top surface of ILD layer 320, resulting in gate contacts 290 (i.e., contact seed layer 382 and contact bulk layer 384 filling gate openings 340). The CMP process planarizes top surfaces of gate contacts 290, such that the top surfaces of ILD layer 320 and top surfaces of gate contacts 290 form a substantially planar surface. In some embodiments, gate contacts 290 include a contact barrier layer, which includes a material that promotes adhesion between a surrounding dielectric material (here, gate spacers 289, dielectric layers 266, gate dielectrics 232, ILD layer 320, and/or CESL 322) and contact seed layers 382 and between the surrounding dielectric material and contact bulk layer 294. The material of contact barrier layer may further prevent diffusion of metal constituents (for example, metal atoms/ions) from gate contacts 290 into the surrounding dielectric material. In some embodiments, the contact barrier layer includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof.

Figure 27A:
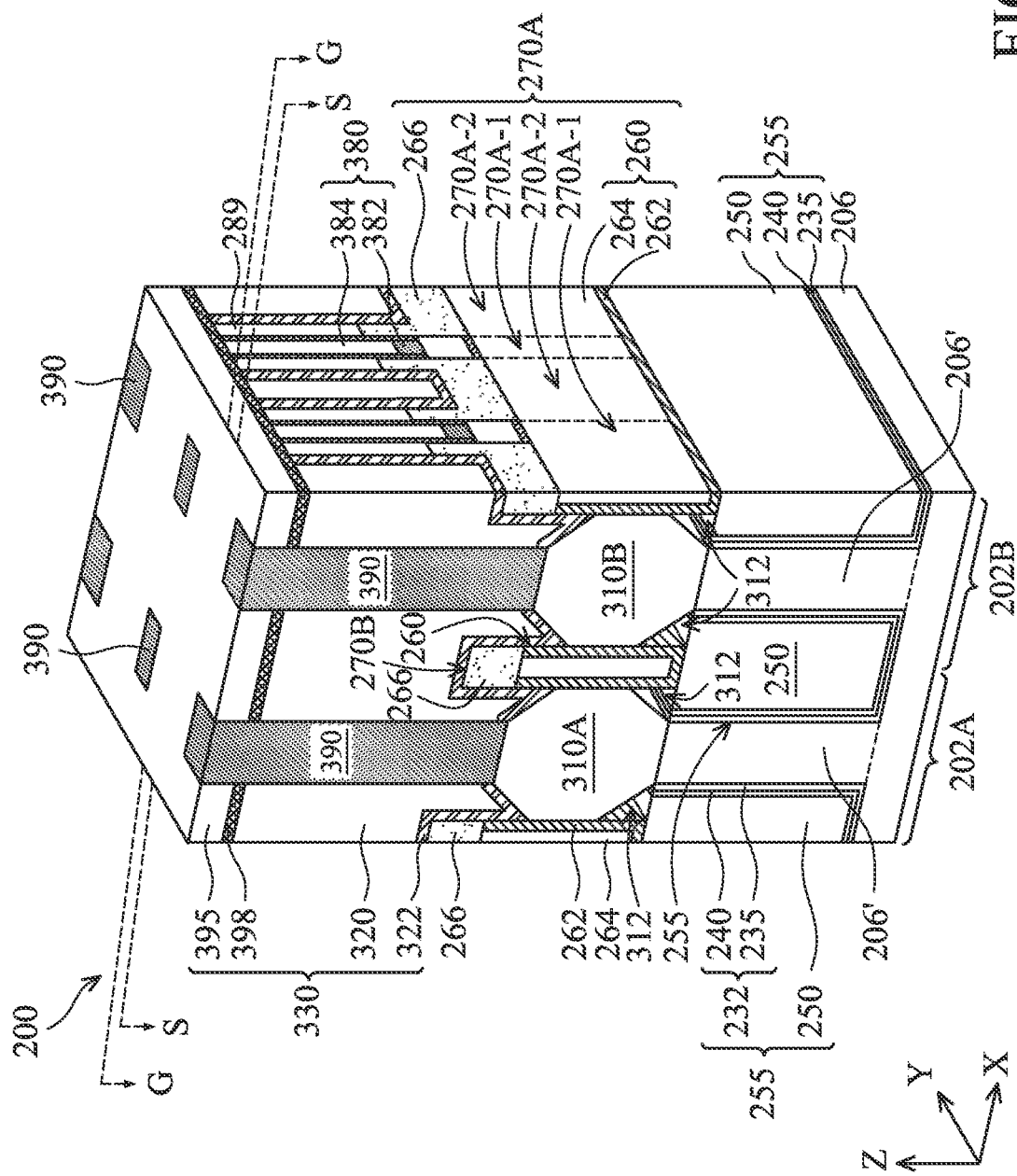
Figure 27B:
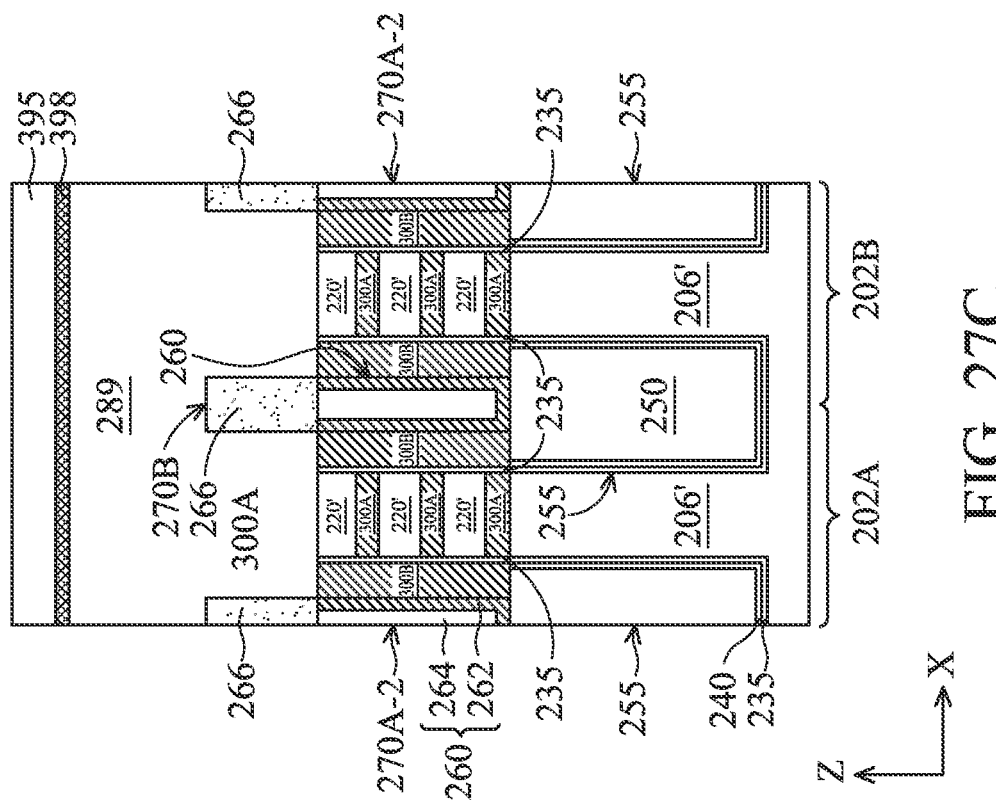
FIG. 27B and FIG. 27C are fragmentary cross-sectional views of the multigate device of FIG. 27A, in portion or entirety, at various fabrication stages (such as those associated with the method in FIG. 1) according to various aspects of the present disclosure.
Figure 27C:
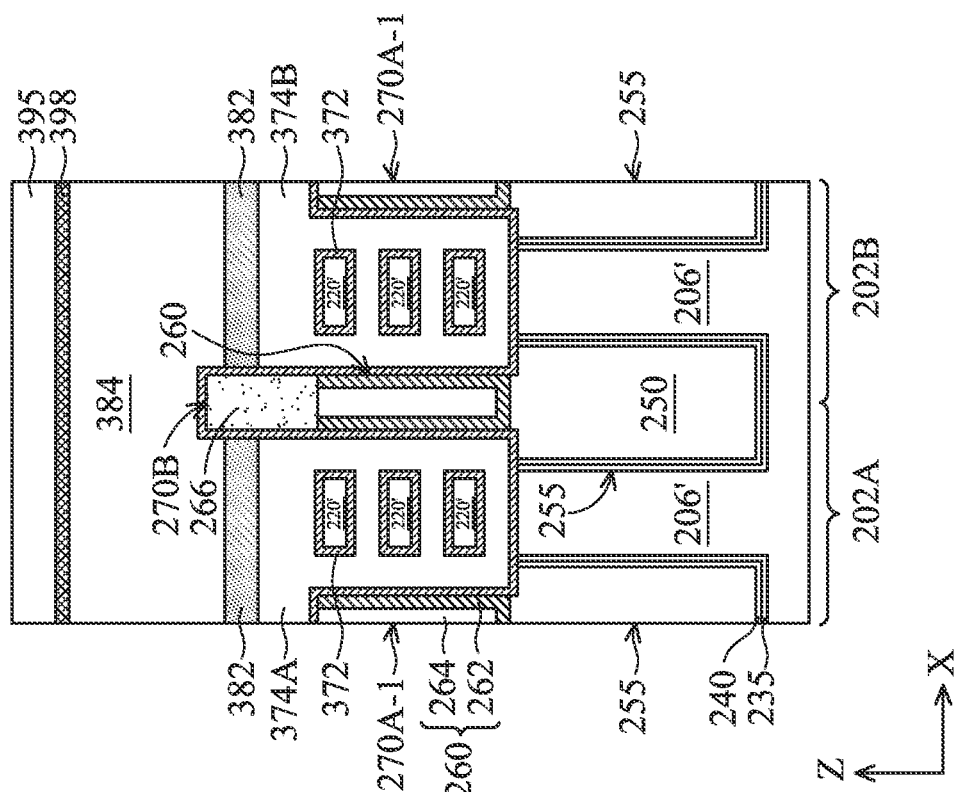

Turning to FIGS. 27A-27C, source/drain contacts 390 are formed to epitaxial source/drain features 310A, 310B. For ease of description and understanding, FIG. 27A is a perspective view of multigate device 200 after undergoing processing associated with FIGS. 2-26 and FIGS. 27A-27; FIG. 27B is a cross-sectional view along line G-G in FIG. 27A after undergoing processing associated with FIGS. 2-26 and FIGS. 27A-27 (and can be referred to as a metal gate cut cross-sectional view); and FIG. 27C is a cross-sectional view along line S—S in FIG. 27A after undergoing processing associated with FIGS. 2-26 and FIGS. 27A-27 (and can be referred to as a spacer cut cross-sectional view). In FIGS. 27A-27C, source/drain contacts 390 extend through an ILD layer 395, a CESL 398, ILD layer 320, and CESL 322 to epitaxial source/drain features 310A, 310B. In some embodiments, source/drain contacts 390 are formed by depositing CESL 398 over multigate device 200 (in particular, over gate contacts 380, CESL 322, ILD layer 320, and gate spacers 289), depositing ILD layer 395 over CESL 398, patterning ILD layers and/or CESLs (e.g., ILD layers 395, 320 and/or CESLs 398, 322) to form source/drain contact openings, and filling source/drain contact openings with a conductive material. Patterning ILD layers 395, 320 and/or CESLs 398, 322 can include lithography processes and/or etching processes. In some embodiments, the lithography processes include forming a resist layer over ILD layer 395, exposing the resist layer to patterned radiation, and developing the exposed resist layer, thereby forming a patterned resist layer that can be used as a masking element for etching source/drain contact opening(s) that extend through ILD layer 395, CESL 398, ILD layer 320, and CESL 322 to expose epitaxial source/drain features 310A, 310B. The etching processes include dry etching processes, wet etching processes, other etching processes, or combinations thereof. Thereafter, the source/drain contact opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, source/drain contacts 390 include a bulk layer (also referred to as a conductive plug). In some embodiments, source/drain contacts 390 include a barrier layer, an adhesion layer, and/or other suitable layer disposed between the bulk layer and ILD layers 395, 320 and/or CESLs 398, 322. In such embodiments, the barrier layer and/or the adhesion layer conform to the source/drain contact openings, such that the barrier layer and/or the adhesion layer are disposed on ILD layers 395, 320 and/or CESLs 398, 322 and the bulk layer is disposed on the barrier layer and/or the adhesion layer. In some embodiments, the barrier layer, the adhesion layer, and/or other suitable layer include titanium, titanium alloy (for example, TiN), tantalum, tantalum alloy (for example, TaN), other suitable constituent, or combinations thereof. Thereafter, any excess conductive material(s) can be removed by a planarization process, such as a CMP process, thereby planarizing a top surface of ILD layer 395 and top surfaces of source/drain contacts 390.

Accordingly, multigate device 200 includes first transistors in first transistor region 202A and second transistors in second transistor region 202B. The first transistors have metal gates 370A (each of which includes respective portions of a respective gate dielectric 372 and a respective gate electrode 374A), and the second transistors have metal gates 370B (each of which includes respective portions of a respective gate dielectric 372 and a respective gate electrode 374B). Each first transistor further includes respective epitaxial source/drain features 310A, and each second transistor further includes respective epitaxial source/drain features 310B. Each metal gate 370A wraps respective channel layers 220' and is disposed between respective epitaxial source/drain features 310A. Each metal gate 370B wraps respective channel layers 220' and is disposed between respective epitaxial source/drain features 310B. In the metal gate cut view (FIG. 27B), in the first transistors, each metal gate 370A is disposed between and physically contacts first sidewalls of respective channel layers 220' and respective first portions 270A-1 of dielectric fins 270A and is further disposed between and physically contacts second sidewalls of the respective channel layers 220' and dielectric fin 270B, while in the second transistors, each metal gate 370B is disposed between and physically contacts first sidewalls of respective channel layers 220' and dielectric fin 270B and is further disposed between and physically contacts second sidewalls of the respective channel layers 220' and respective first portions 270A-1 of dielectric fins 270A. Metal gates 370A, 370B are also disposed on and physically contact top surfaces and bottom surfaces of respective channel layers 220', which top surfaces and bottom surfaces extend between the first sidewalls and the second sidewalls. Metal gates 370A, 370B thus completely surround their respective channel layers 220', such that the first transistors and the second transistors of multigate device 200 can be referred to as GAA transistors. In the depicted embodiment, metal gates 370A, 370B cover four sides of their respective channel layers 220'. The present disclosure contemplates embodiments where metal gates 370A, 370B cover more or less than four sides of their respective channel layers 220' depending on a configuration of channel layers 220' and/or multigate device 200.

In the gate spacer cut view (FIG. 27C), in the first transistors, dielectric liners 235 are disposed between and physically contact first sidewalls of respective channel layers 220' and respective inner spacers 300B and are further disposed between and physically contact second sidewalls of the respective channel layers 220' and dielectric fin 270B, while in the second transistors, dielectric liners 235 are disposed between and physically contact first sidewalls of respective channel layers 220' and dielectric fin 270B and are further disposed between and physically contact second sidewalls of the respective channel layers 220' and respective first portions 270A-1 of dielectric fins 270A. Dielectric liners 235 thus separate channel layers 220' from inner spacers 300B and also separate inner spacers 300A from inner spacers 300B. Inner spacers 300B are disposed between and physically contact respective dielectric liners 235 and respective first portions 270A-1 of dielectric fins 270 and are further disposed between and physically contact respective dielectric liners 235 and dielectric fin 270B. Further, inner spacers 300A are disposed between and physically contact top surfaces and bottom surfaces of respective channel layers 220' and are further disposed between and physically contact top surfaces of fin portions 206'. In the depicted embodiment, gate spacers 289 are disposed on and physically contact top surfaces of topmost channel layers 220'.

Figure 28:
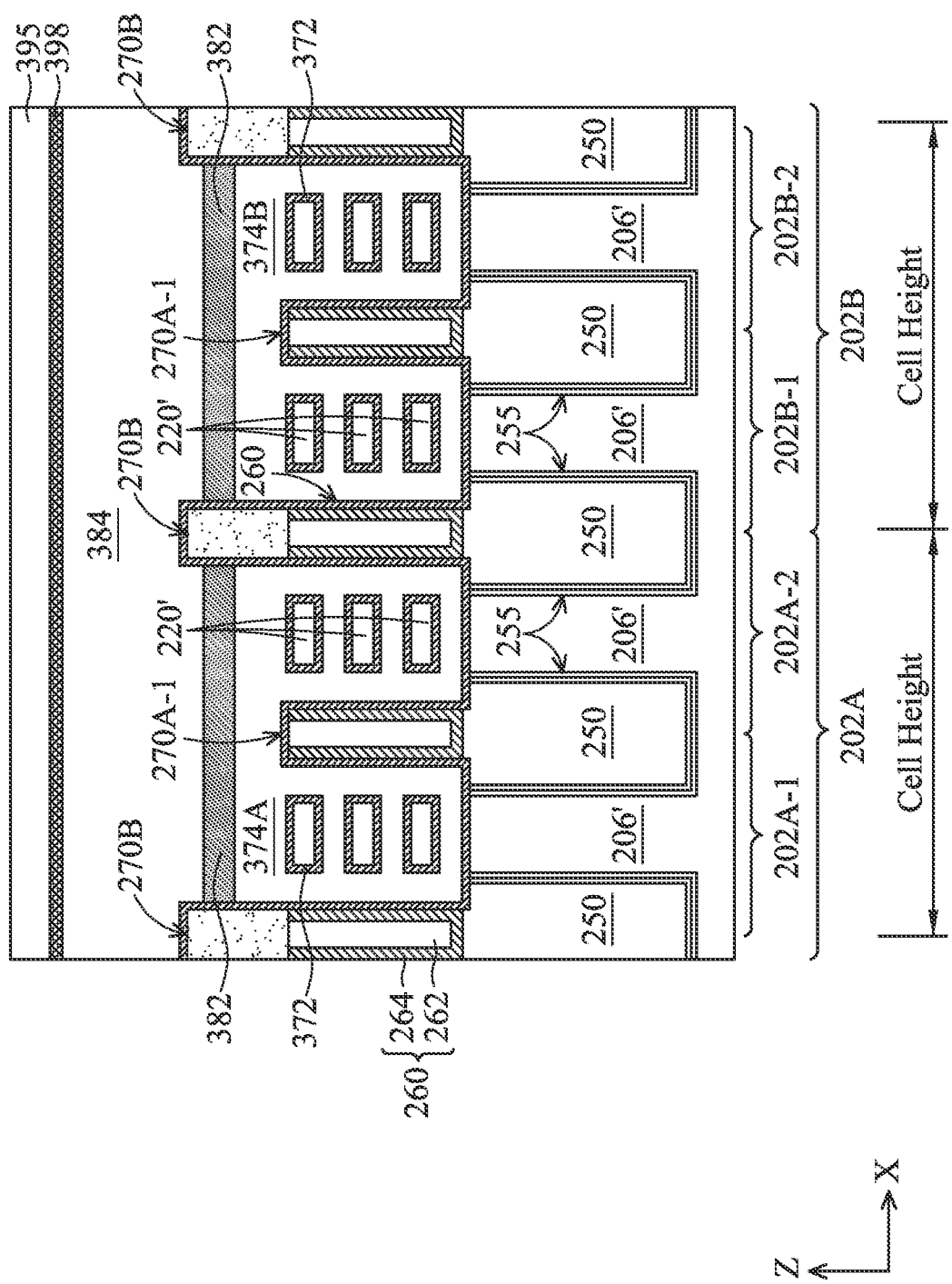
FIG. 28 is a fragmentary cross-sectional view of a multigate device, in portion or entirety, at various fabrication stages (such as those associated with the method in FIG. 1) according to various aspects of the present disclosure.

Dielectric fin 270B separates and isolates the first transistors from the second transistors. For example, metal gates 370A of the first transistors are separated and isolated from metal gates 370B of the second transistors by dielectric fin 270B. As discussed above, dielectric fin 270B, which can be referred to as a gate isolation structure and/or a dielectric gate isolation fin, is fabricated using a self-aligned metal gate cut technique, which allows for reduced spacing between active regions. Dielectric fin 270B includes dielectric layer 266 disposed over dielectric feature 260 (i.e., oxide layer 264 disposed over dielectric liner 262), where a dielectric constant of dielectric layer 266 is greater than a dielectric constant of dielectric liner 262, which can prevent (or minimize) AC penalty of multigate device 200. In some embodiments, where first transistor region 202A and second transistor region 202B are processed to form first CMOS transistors and second CMOS transistors, respectively, the self-aligned metal gate cut technique separates metal gates 370A of first CMOS transistors from metal gates 370B of second CMOS transistors. In some embodiments, dielectric fins 270A separate and/or isolate device features and/or transistor features within a transistor region from one another. For example, where first transistor region 202A includes a first CMOS transistor and second transistor region 202B includes a second CMOS transistor, leftmost dielectric fin 270A in first transistor region 202A may separate and/or isolate a gate and/or source/drain features of a p-type transistor of the first CMOS transistor from a gate and/or source/drain features of an n-type transistor of the first CMOS transistor, while rightmost dielectric fin 270A in second transistor region 202B may separate and/or isolate a gate and/or source/drain features of a p-type transistor of the second CMOS transistor from a gate and/or source/drain features of an n-type transistor of the second CMOS transistor. For example, FIG. 28 is a cross-sectional view along line G-G in FIG. 27A after undergoing processing associated with FIGS. 2-26 and FIGS. 27A-27, where multigate device 200 includes first CMOS transistors in first transistor region 202A and second CMOS transistors in second transistor region 202B. In such embodiments, first transistor region 202A includes an n-type transistor region 202A-1 configured for n-type transistors and a p-type transistor region 202A-2 configured for p-type transistors, and second transistor region 202B includes a p-type transistor region 202B-1 configured for p-type transistors and an n-type transistor region 202B-2 configured for N-type transistors. In such embodiments, dielectric fins 270B separate and isolate metal gates 370A of the first CMOS transistors from metal gates 370B of the second CMOS transistors, along with isolating metal gates 370A, 370B of the first, second CMOS transistors from other devices. In furtherance of such embodiments, dielectric fins 270A separate metal gates and/or source/drain features of the n-type transistors from metal gates and/or source/drain features of the p-type transistors within first transistor region 202A and second transistor region 202B. For example, first portions 270A-1 of dielectric fins 270A separate portions of metal gates 370A belonging to n-type transistors in n-type transistor region 202A-1 from portions of metal gates 370A belonging to p-type transistors in p-type transistor region 202A-2 and portions of metal gates 370B belonging to p-type transistors in p-type transistor region 202B-1 from portions of metal gates 370B belonging to n-type transistors in n-type transistor region 202B-2, while second portions 270A-2 of dielectric fins 270A separate epitaxial source/drain features belonging to n-type transistors in n-type transistor region 202A-1 from epitaxial source/drain features belonging to p-type transistors in p-type transistor region 202A-2 and epitaxial source/drain features belonging to p-type transistors in p-type transistor region 202B-1 epitaxial source/drain features belonging to n-type transistors in n-type transistor region 202B-2. As described above, the disclosed self-aligned metal gate cut techniques described herein do not have to account for lithography process variations, allowing for smaller spacings between active regions of transistors, and thus smaller cell heights in the depicted embodiment, further increasing packing density of transistors and IC pattern density.

From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. The present disclosure provides for many different embodiments. An exemplary device includes a first multigate device and a second multigate device. The first multigate device has a first channel layer disposed between first source/drain features and a first metal gate that surrounds the first channel layer. The second multigate device has a second channel layer disposed between second source/drain features and a second metal gate that surrounds the second channel layer. The device further includes a dielectric gate isolation fin that is disposed between and separating the first metal gate and the second metal gate. In some embodiments, the dielectric gate isolation fin includes a first dielectric layer having a first dielectric constant and a second dielectric layer having a second dielectric constant disposed over the first dielectric layer. The second dielectric constant is greater than the first dielectric constant. The first metal gate is disposed between and physically contacts the first channel layer and the dielectric gate isolation fin. The second metal gate is disposed between and physically contacts the second channel layer and the dielectric gate isolation fin. In some embodiments, the device further includes a gate contact to the first metal gate and the second metal gate. The gate contact is disposed over the top surface of the dielectric gate isolation fin. In some embodiments, the first dielectric constant is less than about 7 and the second dielectric constant is greater than about 7.

In some embodiments, the device further includes gate spacers disposed along first sidewalls of the first metal gate and second sidewalls of the second metal gate. In such embodiments, the first multigate device includes first inner spacers disposed under the gate spacers between the first channel layer and the dielectric gate isolation fin and first dielectric liners disposed under the gate spacers, where each of the first dielectric liners is disposed between and physically contacts the first channel layer and a respective one of the first inner spacers. In such embodiments, the second multigate device includes second inner spacers disposed under the gate spacers between the second channel layer and the dielectric gate isolation fin and second dielectric liners disposed under the gate spacers, where each of the second dielectric liners is disposed between and physically contacts the second channel layer and a respective one of the second inner spacers. In some embodiments, the dielectric gate isolation fin is further disposed between the first inner spacers and the second inner spacers, where the first inner spacers and the second inner spacers physically contact the dielectric gate isolation fin. In some embodiments, the first multigate device includes third inner spacers disposed under the gate spacers between the first metal gate and the first source/drain features. The third inner spacers are further disposed under a portion of the first channel layer that is disposed under the gate spacers. Each of the first dielectric liners is further disposed between and physically contacts a respective one of the third inner spacers and the respective one of the first inner spacers. In some embodiments, the second multigate device includes fourth inner spacers disposed under the gate spacers between the second metal gate and the second source/drain features. The fourth inner spacers are further disposed under a portion of the second channel layer that is disposed under the gate spacers. Each of the second dielectric liners is further disposed between and physically contacts a respective one of the fourth inner spacers and the respective one of the second inner spacers.

In some embodiments, the first inner spacers and the second inner spacers have a first thickness, the third inner spacers and the fourth inner spacers have a second thickness, and the second thickness is substantially the same as the first thickness. In some embodiments, the first inner spacers and the second inner spacers have a first thickness, the third inner spacers and the fourth inner spacers have a second thickness, and the second thickness is greater than the first thickness. In some embodiments, the dielectric gate isolation fin further includes a third dielectric layer disposed over the first dielectric layer. The first dielectric layer is disposed between the third dielectric layer and the first metal gate, the first dielectric layer is disposed between the third dielectric layer and the second metal gate, and the second dielectric layer physically contacts the first dielectric layer and the third dielectric layer. In such embodiments, the first metal gate physically contacts the second dielectric layer and the first dielectric layer of the dielectric gate isolation fin and the second metal gate physically contacts the second dielectric layer and the first dielectric layer of the dielectric gate isolation fin.

Another exemplary device includes an isolation feature disposed over a substrate and a dielectric gate isolation fin disposed over the isolation feature. The isolation feature is disposed between a first fin portion and a second fin portion extending from the substrate. The dielectric gate isolation fin includes a dielectric feature having an oxide layer disposed over a low-k dielectric layer and a high-k dielectric layer disposed over the dielectric feature. The device further includes a first multigate device having a first channel layer disposed over the first fin portion, a first metal gate that wraps the first channel layer, and first source/drain features. The first metal gate is disposed between the first channel layer and the first fin portion. The device further includes a second multigate device having a second channel layer disposed over the second fin portion, a second metal gate that wraps the second channel layer, and second source/drain features. The second metal gate is disposed between the second channel layer and the second fin portion. The dielectric gate isolation fin separates the first metal gate of the first multigate device from the second metal gate of the second multigate device. In some embodiments, the low-k dielectric layer includes a silicon-comprising dielectric material and the high-k dielectric layer includes a metal-and-oxygen comprising dielectric material. In some embodiments, a top surface of the dielectric gate isolation fin is higher than a top surface of the first metal gate and a top surface of the second metal gate relative to the top surface of the substrate. In some embodiments, a first width of the dielectric gate isolation fin is less than a second width of the isolation feature.

In some embodiments, the first metal gate includes a first gate dielectric and a first gate electrode that wraps the first channel layer, where the first gate dielectric is disposed between the first gate electrode and the first channel layer, and the second metal gate includes a second gate dielectric and a second gate electrode that wraps the second channel layer, where the second gate dielectric is disposed between the second gate electrode and the second channel layer. In such embodiments, the first metal gate and the second metal gate can share a third gate dielectric that extends from the first metal gate to the second metal gate without interruption. The third gate dielectric is disposed between the first gate electrode and the first fin portion, the first gate electrode and the dielectric gate isolation fin, the second gate electrode and the second fin portion, and the second gate electrode and the dielectric gate isolation fin. In some embodiments, the third gate dielectric wraps a portion of the high-k dielectric layer of the dielectric gate isolation fin. In some embodiments, the dielectric gate isolation fin has a first portion disposed between and separating the first metal gate from the second metal gate and a second portion disposed between and separating the first source/drain features from the second source/drain features. A top surface of the first portion of the dielectric gate isolation fin relative to a top surface of the substrate is higher than a top surface of the second portion of the dielectric gate isolation fin relative to the top surface of the substrate.

An exemplary method includes forming a first multigate device having a first channel layer, a first metal gate, and first source/drain features, wherein the first channel layer is disposed between the first source/drain features and the first metal gate surrounds the first channel layer. The method further includes forming a second multigate device having a second channel layer, a second metal gate, and second source/drain features, wherein the second channel layer is disposed between the second source/drain features and the second metal gate surrounds the second channel layer. The method further includes forming a dielectric gate isolation fin between and separating the first metal gate and the second metal gate. The dielectric gate isolation fin includes a first dielectric layer having a first dielectric constant and a second dielectric layer having a second dielectric constant disposed over the first dielectric layer. The second dielectric constant is greater than the first dielectric constant. The first metal gate is disposed between and physically contacts the first channel layer and the dielectric gate isolation fin, and the second metal gate is disposed between and physically contacts the second channel layer and the dielectric gate isolation fin. In some embodiments, the method further includes forming an isolation feature before forming the dielectric gate isolation fin. The dielectric gate isolation fin is disposed over the isolation feature. In some embodiments, the method further includes forming an interlevel dielectric layer over the first multigate device, the second multigate device, and the dielectric gate isolation fin. In some embodiments, the method further includes performing a gate cut process to provide the dielectric gate isolation fin separating the first metal gate from the second metal gate without performing a lithography process.

Another exemplary device includes a first multigate device and a second multigate device. The first multigate device has a first channel layer disposed between first source/drain features and a first metal gate that surrounds the first channel layer. The second multigate device has a second channel layer disposed between second source/drain features and a second metal gate that surrounds the second channel layer. The device further includes a dielectric gate isolation fin disposed between and separating the first metal gate and the second metal gate. The dielectric gate isolation fin includes a low-k dielectric layer disposed along a first lower portion of first sidewalls of the first metal gate and a second lower portion of second sidewalls of the second metal gate. The dielectric gate isolation fin further includes a high-k dielectric layer disposed over the low-k dielectric layer. The high-k dielectric layer is disposed along a first upper portion of the first sidewalls of the first metal gate and a second upper portion of the second sidewalls of the second metal gate. In some embodiments, the device further includes an isolation feature disposed between and separating the first multigate device and the second multigate device. The dielectric gate isolation fin is disposed over the isolation feature. In some embodiments, the isolation feature includes an oxide liner, a silicon liner disposed over the oxide liner, and an oxide layer disposed over the silicon liner. In some embodiments, a first portion of the dielectric gate isolation fin is disposed between and separates the first metal gate and the second metal gate and a second portion of the dielectric gate isolation fin is disposed between and separates the first source/drain features and the second source/drain features. In some embodiments, a top surface of the first portion of the dielectric gate isolation fin relative to a top surface of a substrate is higher than a top surface of the second portion of the dielectric gate isolation fin relative to the top surface of the substrate. In some embodiments, the low-k dielectric layer has a first dielectric constant, the high-k dielectric layer has a second dielectric constant, the first dielectric constant is greater than 7, and the second dielectric constant is less than 7. In some embodiments, the low-k dielectric layer includes a first dielectric layer disposed over a second dielectric layer. The first dielectric layer is disposed between the first lower portion of the first sidewalls of the first metal gate and the second dielectric layer. The first dielectric layer is disposed between the second lower portion of the second sidewalls of the second metal gate and the second dielectric layer. In some embodiments, a top surface of the dielectric gate isolation fin relative to a top surface of a substrate is higher than top surfaces of the first metal gate and the second metal gate relative to the top surface of the substrate.

In some embodiments, the first metal gate surrounds a first portion of the first channel layer and the second metal gate surrounds a first portion of the second channel layer. In such embodiments, the first multigate device can further include a second portion of the first channel layer, first inner spacers disposed between the first source/drain features and the first metal gate, and second inner spacers disposed along third sidewalls of the second portion of the first channel layer and fourth sidewalls of the first inner spacers. In such embodiments, the second multigate device can further include a second portion of the second channel layer, third inner spacers disposed between the second source/drain features and the second metal gate, and fourth inner spacers disposed along fifth sidewalls of the second portion of the second channel layer and sixth sidewalls of the third inner spacers. In such embodiments, the device can further include gate spacers are disposed over the second portion of the first channel layer, the second portion of the second channel layer, the second inner spacers, and the fourth inner spacers. In such embodiments, the device can further include a first oxide layer is disposed between the second inner spacers and the third sidewalls of the second portion of the first channel layer and between the second inner spacers and the fourth sidewalls of the first inner spacers. In such embodiments, the device can further include a second oxide layer is disposed between the fourth inner spacers and the fifth sidewalls of the second portion of the second channel layer and between the fourth inner spacers and the sixth sidewalls of the third inner spacers. In some embodiments, a first thickness of the first inner spacers is less than or equal to a second thickness of the second inner spacers, and a third thickness of the third inner spacers is less than or equal to a fourth thickness of the fourth inner spacers. In some embodiments, the low-k dielectric layer of the dielectric gate isolation fin is further disposed between the second inner spacers and the fourth inner spacers and the gate spacers wrap a portion of the high-k dielectric layer of the dielectric gate isolation fin. In some embodiments, the device further includes a substrate having a first fin portion and a second fin portion. In such embodiments, the first inner spacers are disposed between the first fin portion and the second portion of the first channel layer, the third inner spacers are disposed between the second fin portion and the second portion of the second channel layer, the first metal gate is disposed between the first fin portion and the first portion of the first channel layer, and the second metal gate is disposed between the second fin portion and the second fin portion of the second channel layer. In some embodiments, the device further includes a gate contact to the first metal gate and the second metal gate, wherein the gate contact is disposed between the gate spacers. In some embodiments, the gate contact wraps a portion of the high-k dielectric layer of the dielectric gate isolation fin.

Another exemplary method includes forming a first multigate device having a first channel layer, a first metal gate, and first source/drain features and forming a second multigate device having a second channel layer, a second metal gate, and second source/drain features. The first channel layer is disposed between the first source/drain features and the first metal gate surrounds the first channel layer. The second channel layer is disposed between the second source/drain features and the second metal gate surrounds the second channel layer. The method further includes forming a dielectric gate isolation fin in between and separating the first metal gate and the second metal gate. The dielectric gate isolation fin includes a low-k dielectric layer disposed along a first lower portion of first sidewalls of the first metal gate and a second lower portion of second sidewalls of the second metal gate. The dielectric gate isolation fin further includes a high-k dielectric layer disposed over the low-k dielectric layer. The high-k dielectric layer is disposed along a first upper portion of the first sidewalls of the first metal gate and a second upper portion of the second sidewalls of the second metal gate.

Yet another exemplary method includes forming a first fin structure and a second fin structure over a substrate. The first fin structure is disposed between a first trench and a second trench, and the second fin structure is disposed between the second trench and a third trench. The first fin structure and the second fin structure each include a first semiconductor layer disposed over a second semiconductor layer, where the second semiconductor layer is different than the first semiconductor layer. The method further includes forming a first oxide layer over the first fin structure and the second fin structure. The first oxide layer lines the first trench, the second trench, and the third trench. The first oxide layer partially fills the first trench, the second trench, and the third trench. The method further includes forming a silicon layer over the first fin structure and the second fin structure. The silicon layer is disposed over the first oxide layer. The silicon layer lines the first trench, the second trench, and the third trench. The silicon layer partially fills the first trench, the second trench, and the third trench.

The method further includes forming a first isolation feature that fills a lower portion of the first trench, a second isolation feature that fills a lower portion of the second trench, and a third isolation feature that fills a lower portion of the third trench. The second isolation feature is disposed between a lower portion of the first fin structure and a lower portion of the second fin structure. Each of the first isolation feature, the second isolation feature, and the third isolation feature include a second oxide layer, a first portion of the silicon layer that lines the lower portions respectively of the first trench, the second trench, and the third trench, and a first portion of the first oxide layer that lines the lower portions respectively of the first trench, the second trench, and the third trench. The method further includes forming a silicon germanium layer over an upper portion of the first fin structure and an upper portion of the second fin structure. The silicon germanium layer is formed from a second portion of the silicon layer that lines an upper portion of the first trench, an upper portion of the second trench, and an upper portion of the third trench. The silicon germanium layer lines first sidewalls of and partially fills the upper portions of the first trench, the second trench, and the third trench.

The method further includes forming a first dielectric fin over the first isolation feature, a dielectric gate isolation fin over the second isolation feature, and a second dielectric fin over the third isolation feature. The first dielectric fin fills a remainder of the upper portion of the first trench, the dielectric gate isolation fin fills a remainder of the upper portion of the second trench, and the second dielectric fin fills a remainder of the upper portion of the third trench. Each of the first dielectric fin, the dielectric gate isolation fin, and the second dielectric fin include a third oxide layer disposed over a low-k dielectric layer and a high-k dielectric layer disposed over the third oxide layer. The method further includes, after removing the silicon germanium layer from tops surfaces of the first fin structure and the second fin structure and removing a mask layer of the first fin structure and the second fin structure, forming a dummy gate structure over a first channel region of the first fin structure and a second channel region of the second fin structure. The dummy gate structure includes a dummy gate and gate spacers. The dummy gate wraps a first portion of the high-k dielectric layer of the first dielectric fin, a first portion of the high-k dielectric layer of the dielectric gate isolation fin, and a first portion of the high-k dielectric layer of the second dielectric fin. The first channel region of the first fin structure is disposed between first source/drain regions of the first fin structure and the second channel region of the second fin structure is disposed between second source/drain regions of the second fin structure. The method further includes etching the first source/drain regions of the first fin structure to form first source/drain recesses and the second source/drain regions of the second fin structure to form second source/drain recesses. The etching exposes an upper, first portion of the first channel region of the first fin structure under the gate spacers, an upper, first portion of the second channel region of the second fin structure under the gate spacers, the silicon germanium layer and the first oxide layer disposed along sidewalls of the upper, first portion of the first channel region of the first fin structure, and the silicon germanium layer and the first oxide layer disposed along sidewalls of the upper, first portion of the second channel region of the second fin structure. The etching process further recesses the high-k dielectric layer of a second portion of the first dielectric fin that is not covered by the dummy gate structure, the high-k dielectric layer of a second portion of the dielectric gate isolation fin that is not covered by the dummy gate structure, and the high-k dielectric layer of a second portion of the second dielectric fin that is not covered by the dummy gate structure.

The method further includes forming first inner spacer openings under the gate spacers by selectively removing the silicon germanium layer from the sidewalls of the upper, first portion of the first channel region of the first fin structure and the sidewalls of the upper, and first portion of the second channel region of the second fin structure. The method further includes forming second inner spacer openings under the gate spacers by selectively removing the second semiconductor layer from the upper, first portion of the first channel region of the first fin structure and the upper, first portion of the second channel region of the second fin structure. The method further includes forming first inner spacers in the first inner spacer openings under the gate spacers and second inner spacers in the second inner spacer openings under the gate spacers. The second inner spacers are disposed between substrate and the first semiconductor layer of the upper, first portion of the first channel region of the first fin structure and between the substrate and the upper, first portion of the second channel region of the second fin structure. The first inner spacers are disposed between the sidewalls of the second inner spacers and the first dielectric fin, sidewalls of the second inner spacers and the dielectric gate isolation fin, and sidewalls of the second inner spacers and the second dielectric fin. The first inner spacers are disposed between the sidewalls of the first semiconductor layer of the upper, first portion of the first channel region of the first fin structure and the first dielectric fin, the dielectric gate isolation fin, and second dielectric fin. The first inner spacers are disposed between the sidewalls of the first semiconductor layer of the upper, first portion of the second channel region of the second fin and the first dielectric fin, the dielectric gate isolation fin, and second dielectric fin. The method further includes, after forming the first inner spacers and the second inner spacers, forming first source/drain features in the first source/drain recesses of the first fin structure and second source/drain features in the second source/drain recesses of the second fin structure. The method further includes forming an interlevel dielectric (ILD) layer over the first source/drain features, the second source/drain features and the second portions of the first dielectric fin, the dielectric gate isolation fin, and the second dielectric fin that are not covered by the dummy gate structure.

The method further includes partially removing the dummy gate to form a gate opening that exposes the high-k dielectric layer of the first portion of the first dielectric fin, the high-k dielectric layer of the first portion of the dielectric gate isolation fin and the high-k dielectric layer of the first portion of the second dielectric fin. The method further includes masking the high-k dielectric layer of the first portion of the dielectric gate isolation fin and removing the high-k dielectric layer from the first portion of the first dielectric fin and the high-k dielectric layer from the first portion of the second dielectric fin. The method further includes, after removing a remainder of the dummy gate for the gate opening to expose an upper, second portion of the first channel region of the first fin structure and an upper, second portion of the second channel region of the second fin structure, selectively removing the silicon layer from sidewalls of the upper, second portion of the first channel region of the first fin structure and sidewalls of the upper, second portion of the second channel region of the second fin structure. The method further includes selectively removing the first oxide layer from the sidewalls of the upper, second portion of the first channel region of the first fin structure and the sidewalls of the upper, second portion of the second channel region of the second fin structure. The method further includes selectively removing the second semiconductor layer from the upper, second portion of the first channel region of the first fin structure and the upper, second portion of the second channel region of the second fin structure, such that the first semiconductor layer of the upper, second portion of the first channel region of the first fin structure is suspended to provide a first channel layer and the first semiconductor layer of the upper, second portion of the second channel region of the second fin structure is suspended to provide a second channel layer. The method further includes forming a first metal gate and a second metal gate that partially fill the gate opening. The first metal gate wraps the first channel layer and the second metal gate wraps the second channel layer. The first metal gate is disposed between the first channel layer and the dielectric gate isolation fin and the second metal gate is disposed between the second channel layer and the dielectric gate isolation fin.

The method further includes forming a gate contact in a remainder of the gate opening. The gate contact is disposed over the first metal gate and the second metal gate. The method further includes forming first source/drain contacts that extend through the ILD layer to the first source/drain features and second source/drain contacts that extend through the ILD layer to the second source/drain features. In some embodiments, forming the first metal gate and the second metal gate that partially fill the gate opening includes depositing a gate dielectric layer over the first channel layer and the second channel layer that partially fills the gate opening includes depositing a gate electrode layer over the gate dielectric layer. The gate electrode layer fills a remainder of the gate opening and the gate electrode layer extends over a top surface of the high-k dielectric layer of the first portion of the dielectric gate isolation fin. In such embodiments, forming the first metal gate and the second metal gate that partially fill the gate opening further includes recessing the gate electrode layer to expose the top surface of the high-k dielectric layer of the first portion of the dielectric gate isolation fin, thereby forming a first gate electrode that wraps the first channel layer and a second gate electrode that wraps the second channel layer. The first gate electrode is separated from the second gate electrode by the first portion of the dielectric gate isolation fin.

In some embodiments, forming the first dielectric fin over the first isolation feature, the dielectric gate isolation fin over the second isolation feature, and the second dielectric fin over the third isolation feature includes depositing a low-k dielectric material over the silicon germanium layer, the first isolation feature, the second isolation feature, and the third isolation feature. The low-k dielectric material lines and partially fills the upper portion of the first trench, the upper portion of the second trench, and the upper portion of the third trench. In such embodiments, forming the first dielectric fin over the first isolation feature, the dielectric gate isolation fin over the second isolation feature, and the second dielectric fin over the third isolation feature can further include depositing an oxide material over the low-k dielectric material. The oxide material fills a remainder of the upper portion of the first trench, the upper portion of the second trench, and the upper portion of the third trench. In such embodiments, forming the first dielectric fin over the first isolation feature, the dielectric gate isolation fin over the second isolation feature, and the second dielectric fin over the third isolation feature can further include performing a first planarization process that removes the oxide material and the low-k dielectric material from over top surfaces of the first fin structure and the second fin structure, thereby exposing the silicon germanium layer disposed over the top surfaces of the first fin structure and the second fin structure and forming the low-k dielectric layer and the third oxide layer of the first dielectric fin, the dielectric gate isolation fin, and the third dielectric fin. In such embodiments, forming the first dielectric fin over the first isolation feature, the dielectric gate isolation fin over the second isolation feature, and the second dielectric fin over the third isolation feature can further include etching back the low-k dielectric layer and the third oxide layer of the first dielectric fin, the dielectric gate isolation fin, and the third dielectric fin, thereby forming a fourth trench, a fifth trench, and a sixth trench. The fourth trench has sidewalls defined by the silicon germanium layer and a bottom defined by the low-k dielectric layer and the third oxide layer of the first dielectric fin, the fifth trench has sidewalls defined by the silicon germanium layer and a bottom defined by the low-k dielectric layer and the third oxide layer of the dielectric gate isolation fin, and the sixth trench has sidewalls defined by the silicon germanium layer and a bottom defined by the low-k dielectric layer and the third oxide layer of the second dielectric fin. The first fin structure is disposed between the fourth trench and the fifth trench and the second fin structure is disposed between the fifth trench and the sixth trench. In such embodiments, forming the first dielectric fin over the first isolation feature, the dielectric gate isolation fin over the second isolation feature, and the second dielectric fin over the third isolation feature can further include depositing a high-k dielectric material over the first fin structure, the second fin structure, the low-k dielectric layer, and the third oxide layer. The high-k dielectric material fills the fourth trench, the fifth trench, and the sixth trench. In such embodiments, forming the first dielectric fin over the first isolation feature, the dielectric gate isolation fin over the second isolation feature, and the second dielectric fin over the third isolation feature can further include performing a second planarization process that removes the high-k dielectric material and the silicon germanium layer from over top surfaces of the first fin structure and the second fin structure, thereby exposing the mask layer of the first fin structure and the second fin structure and forming the high-k dielectric layer of the first dielectric fin, the dielectric gate isolation fin, and the third dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first multigate device having:
        a first channel layer disposed between first source/drain features, and
        a first metal gate that surrounds the first channel layer;
    a second multigate device having:
        a second channel layer disposed between second source/drain features, and
        a second metal gate that surrounds the second channel layer;
    a dielectric gate isolation fin disposed between and separating the first metal gate and the second metal gate, wherein the dielectric gate isolation fin includes:
        a first dielectric layer having a first dielectric constant, and
        a second dielectric layer having a second dielectric constant disposed over the first dielectric layer, wherein the second dielectric constant is greater than the first dielectric constant;
    gate spacers disposed along first sidewalls of the first metal gate and second sidewalls of the second metal gate; and wherein:
    the first multigate device further includes first inner spacers disposed under the gate spacers between the first channel layer and the dielectric gate isolation fin and first dielectric liners disposed under the gate spacers, wherein each of the first dielectric liners is disposed between and physically contacts the first channel layer and a respective one of the first inner spacers,
    the second multigate device further includes second inner spacers disposed under the gate spacers between the second channel layer and the dielectric gate isolation fin and second dielectric liners disposed under the gate spacers, wherein each of the second dielectric liners is disposed between and physically contacts the second channel layer and a respective one of the second inner spacers, and
    the first metal gate is disposed between and physically contacts the first channel layer and the dielectric gate isolation fin, and the second metal gate is disposed between and physically contacts the second channel layer and the dielectric gate isolation fin.

2. The device of claim 1, wherein a composition of the first dielectric liners and the second dielectric liners is different than a composition of the first dielectric layer and a composition of the second dielectric layer.

3. The device of claim 1, wherein the dielectric gate isolation fin is further disposed between the first inner spacers and the second inner spacers, wherein the first inner spacers and the second inner spacers physically contact the dielectric gate isolation fin.

4. The device of claim 1, wherein:
    the first multigate device includes third inner spacers disposed under the gate spacers between the first metal gate and the first source/drain features, wherein the third inner spacers are further disposed under a portion of the first channel layer that is disposed under the gate spacers and each of the first dielectric liners is further disposed between and physically contacts a respective one of the third inner spacers and the respective one of the first inner spacers; and
    the second multigate device includes fourth inner spacers disposed under the gate spacers between the second metal gate and the second source/drain features, wherein the fourth inner spacers are further disposed under a portion of the second channel layer that is disposed under the gate spacers and each of the second dielectric liners is further disposed between and physically contacts a respective one of the fourth inner spacers and the respective one of the second inner spacers.

5. The device of claim 4, wherein the first inner spacers and the second inner spacers have a first thickness, the third inner spacers and the fourth inner spacers have a second thickness, and the second thickness is substantially the same as the first thickness.

6. The device of claim 4, wherein the first inner spacers and the second inner spacers have a first thickness, the third inner spacers and the fourth inner spacers have a second thickness, and the second thickness is greater than the first thickness.

7. The device of claim 1, further comprising a gate contact to the first metal gate and the second metal gate, wherein the gate contact is disposed over a top surface of the dielectric gate isolation fin.

8. The device of claim 1, wherein the first dielectric constant is less than about 7 and the second dielectric constant is greater than about 7.

9. The device of claim 1, wherein:
the dielectric gate isolation fin further includes a third dielectric layer disposed over the first dielectric layer, wherein the first dielectric layer is disposed between the third dielectric layer and the first metal gate, the first dielectric layer is disposed between the third dielectric layer and the second metal gate, and the second dielectric layer physically contacts the first dielectric layer and the third dielectric layer; and
the first metal gate physically contacts the second dielectric layer and the first dielectric layer of the dielectric gate isolation fin and the second metal gate physically contacts the second dielectric layer and the first dielectric layer of the dielectric gate isolation fin.

10. A device comprising:
an isolation feature disposed over a substrate, wherein the isolation feature is disposed between a first fin portion and a second fin portion extending from the substrate;
a dielectric gate isolation fin disposed over the isolation feature, wherein the dielectric gate isolation fin includes a dielectric feature having an oxide layer disposed over a low-k dielectric layer and a high-k dielectric layer disposed over the dielectric feature;
a first multigate device having a first channel layer disposed over the first fin portion, a first metal gate that wraps the first channel layer, and first source/drain features, wherein the first metal gate is disposed between the first channel layer and the first fin portion; and
a second multigate device having a second channel layer disposed over the second fin portion, a second metal gate that wraps the second channel layer, and second source/drain features, wherein the second metal gate is disposed between the second channel layer and the second fin portion and the dielectric gate isolation fin separates the first metal gate of the first multigate device from the second metal gate of the second multigate device.

11. The device of claim 10, wherein the low-k dielectric layer includes a silicon-comprising dielectric material and the high-k dielectric layer includes a metal-and-oxygen comprising dielectric material.

12. The device of claim 10, wherein a top surface of the dielectric gate isolation fin is higher than a top surface of the first metal gate and a top surface of the second metal gate relative to the top surface of the substrate.

13. The device of claim 10, wherein:
the first metal gate includes a first gate dielectric and a first gate electrode that wraps the first channel layer, wherein the first gate dielectric is disposed between the first gate electrode and the first channel layer;
the second metal gate includes a second gate dielectric and a second gate electrode that wraps the second channel layer, wherein the second gate dielectric is disposed between the second gate electrode and the second channel layer; and
the first metal gate and the second metal gate share a third gate dielectric that extends from the first metal gate to the second metal gate without interruption, wherein the third gate dielectric is disposed between the first gate electrode and the first fin portion, the first gate electrode and the dielectric gate isolation fin, the second gate electrode and the second fin portion, and the second gate electrode and the dielectric gate isolation fin.

14. The device of claim 13, wherein the third gate dielectric wraps a portion of the high-k dielectric layer of the dielectric gate isolation fin.

15. The device of claim 10, wherein a first width of the dielectric gate isolation fin is less than a second width of the isolation feature.

16. The device of claim 10, wherein:
the dielectric gate isolation fin has a first portion disposed between and separating the first metal gate from the second metal gate and a second portion disposed between and separating the first source/drain features from the second source/drain features; and
wherein a top surface of the first portion of the dielectric gate isolation fin relative to a top surface of the substrate is higher than a top surface of the second portion of the dielectric gate isolation fin relative to the top surface of the substrate.

17. A method comprising:
forming a first multigate device having a first channel layer, a first metal gate, and first source/drain features, wherein the first channel layer is disposed between the first source/drain features and the first metal gate surrounds the first channel layer;
forming a second multigate device having a second channel layer, a second metal gate, and second source/drain features, wherein the second channel layer is disposed between the second source/drain features and the second metal gate surrounds the second channel layer; and
forming a dielectric gate isolation fin between and separating the first metal gate and the second metal gate, wherein the dielectric gate isolation fin includes:
a first dielectric layer having a first dielectric constant,
a second dielectric layer having a second dielectric constant disposed over the first dielectric layer, wherein the second dielectric constant is greater than the first dielectric constant, and
a third dielectric layer disposed over the first dielectric layer;
wherein the first metal gate is disposed between and physically contacts the first channel layer and the dielectric gate isolation fin, wherein the first metal gate physically contacts the second dielectric layer and the first dielectric layer;
wherein the second metal gate is disposed between and physically contacts the second channel layer and the dielectric gate isolation fin, wherein the second metal gate physically contacts the second dielectric layer and the first dielectric layer; and
wherein the first dielectric layer is disposed between the third dielectric layer and the first metal gate, the first dielectric layer is disposed between the third dielectric layer and the second metal gate, and the second dielectric layer physically contacts the first dielectric layer and the third dielectric layer.

18. The method of claim 17, further comprising forming an isolation feature before forming the dielectric gate isolation fin, wherein the dielectric gate isolation fin is disposed over the isolation feature.

19. The method of claim 17, further comprising forming an interlevel dielectric layer over the first multigate device, the second multigate device, and the dielectric gate isolation fin.

20. The method of claim 17, further comprising performing a gate cut process to provide the dielectric gate isolation fin separating the first metal gate from the second metal gate without performing a lithography process.

* * * * *